(12) United States Patent
Elsayad et al.

(10) Patent No.: US 10,879,869 B2
(45) Date of Patent: Dec. 29, 2020

(54) MICROELECTROMECHANICAL SYSTEM RESONATOR DEVICES AND OSCILLATOR CONTROL CIRCUITS

(71) Applicants: Mohannad Elsayad, Verdun (CA); Frederic Nabki, Montreal (CA); Anoir Bouchami, Saint-Leonard (CA)

(72) Inventors: Mohannad Elsayad, Verdun (CA); Frederic Nabki, Montreal (CA); Anoir Bouchami, Saint-Leonard (CA)

(73) Assignees: Socovar, Societe en Commandite, Montreal (CA); TRansfer Plus, Sciete en Commandite, Montreal (CA)

( * ) Notice: Subject to any disclaimer, the term of this patent is extended or adjusted under 35 U.S.C. 154(b) by 0 days.

(21) Appl. No.: 16/182,902

(22) Filed: Nov. 7, 2018

(65) Prior Publication Data
US 2019/0140612 A1 May 9, 2019

Related U.S. Application Data

(60) Provisional application No. 62/583,589, filed on Nov. 9, 2017.

(51) Int. Cl.
*H03H 9/02* (2006.01)
*H03H 9/24* (2006.01)
(Continued)

(52) U.S. Cl.
CPC .......... *H03H 9/02433* (2013.01); *B81C 1/00* (2013.01); *G01C 19/5684* (2013.01); *H03B 5/364* (2013.01); *H03F 3/45475* (2013.01); *H03G 1/0029* (2013.01); *H03G 3/30* (2013.01); *H03H 3/0072* (2013.01); *H03H 9/02338* (2013.01); *H03H 9/02409* (2013.01); *H03H 9/2436* (2013.01); *G01C 19/5656* (2013.01); *G01C 19/5663* (2013.01); *H03B 5/36* (2013.01);
(Continued)

(58) Field of Classification Search
CPC ........... H03H 9/02433; H03H 9/02338; H03H 9/02409; H03H 9/2436; H03H 3/0072; H03H 2009/02503; H03H 2009/241; H03H 2009/2442; H03H 2009/02354; H03H 2009/02385; H03H 2009/0244; H03H 2009/02456
See application file for complete search history.

(56) References Cited

U.S. PATENT DOCUMENTS

| 7,681,433 | B2* | 3/2010 | Konno | G01N 29/036 73/24.06 |
| 2011/0067984 | A1* | 3/2011 | Nguyen | H01P 1/127 200/181 |

* cited by examiner

*Primary Examiner* — Syed I Gheyas
(74) *Attorney, Agent, or Firm* — Rosenberg, Klein & Lee

(57) ABSTRACT

Reference oscillators are ubiquitous in timing applications generally, and in modern wireless communication devices particularly. Microelectromechanical system (MEMS) resonators are of particular interest due to their small size and potential for integration with other MEMS devices and electrical circuits on the same chip. In order to support their use in high volume low cost applications it would be beneficial for MEMS designers to have MEMS resonator designs and manufacturing processes that whilst employing low cost low resolution semiconductor processing yield improved resonator performance thereby reducing the requirements of the oscillator circuitry. It would be further beneficial for the oscillator circuitry to be able to leverage the improved noise performance of differential TIAs without sacrificing power consumption.

15 Claims, 41 Drawing Sheets

(51) Int. Cl.
  *H03F 3/45*    (2006.01)
  *H03G 3/30*    (2006.01)
  *H03H 3/007*   (2006.01)
  *H03B 5/36*    (2006.01)
  *B81C 1/00*    (2006.01)
  *G01C 19/5684* (2012.01)
  *H03G 1/00*    (2006.01)
  *G01C 19/5656*     (2012.01)
  *H03K 5/24*        (2006.01)
  *G01C 19/5663*     (2012.01)

(52) U.S. Cl.
  CPC . *H03F 2200/435* (2013.01); *H03G 2201/103* (2013.01); *H03H 2009/0244* (2013.01); *H03H 2009/02354* (2013.01); *H03H 2009/02385* (2013.01); *H03H 2009/02456* (2013.01); *H03H 2009/02503* (2013.01); *H03H 2009/241* (2013.01); *H03H 2009/2442* (2013.01); *H03K 5/24* (2013.01)

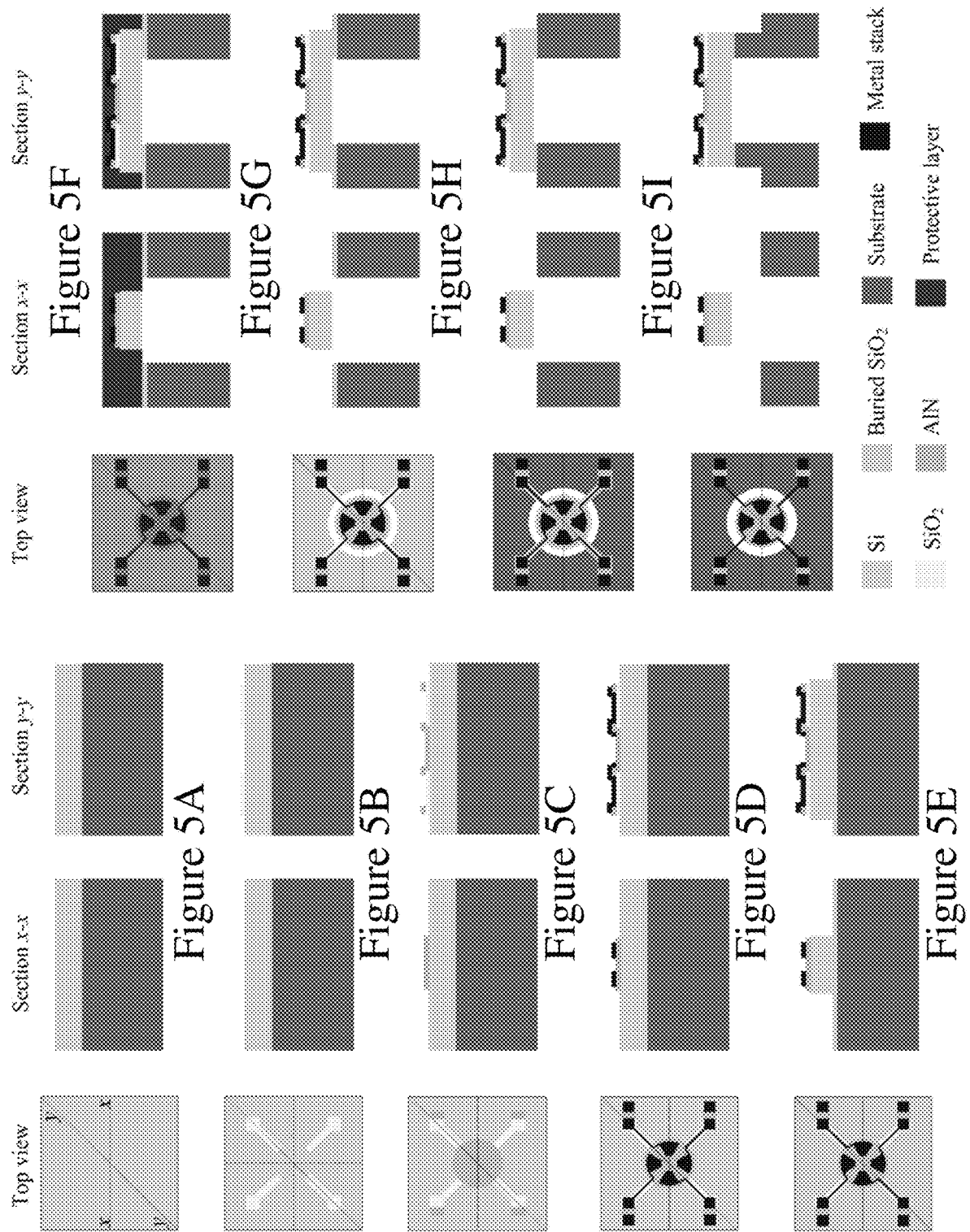

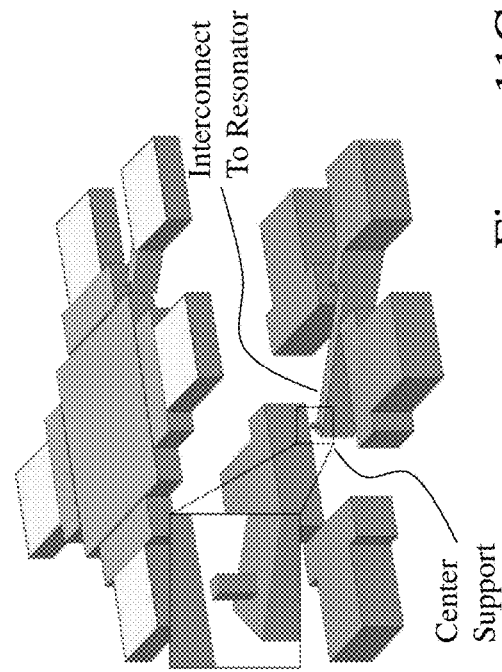
Figure 11A
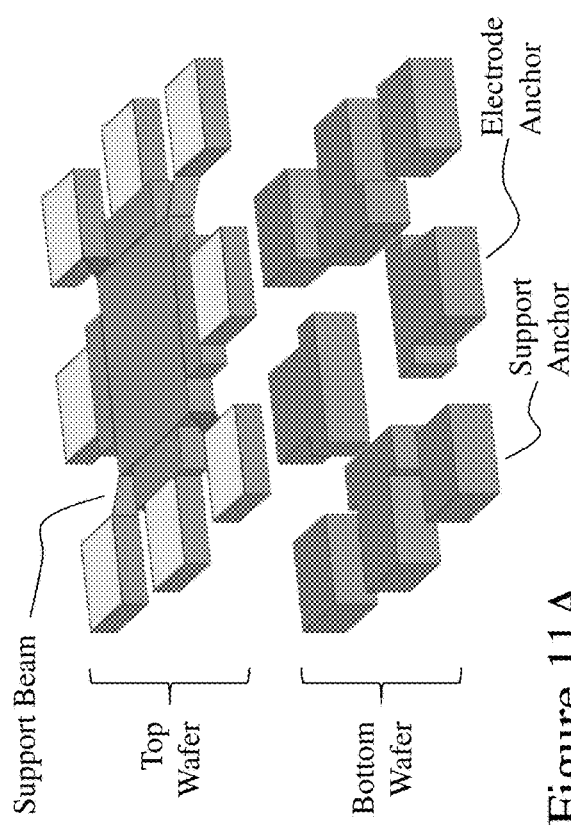
Figure 11B
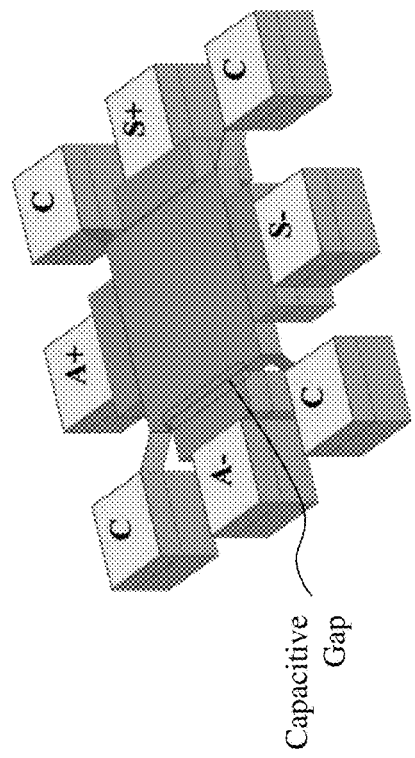
Figure 11C
Figure 11D
A: Actuating Pads
S: Sensing Pads
C: Central Structure Pads
Si
Metal

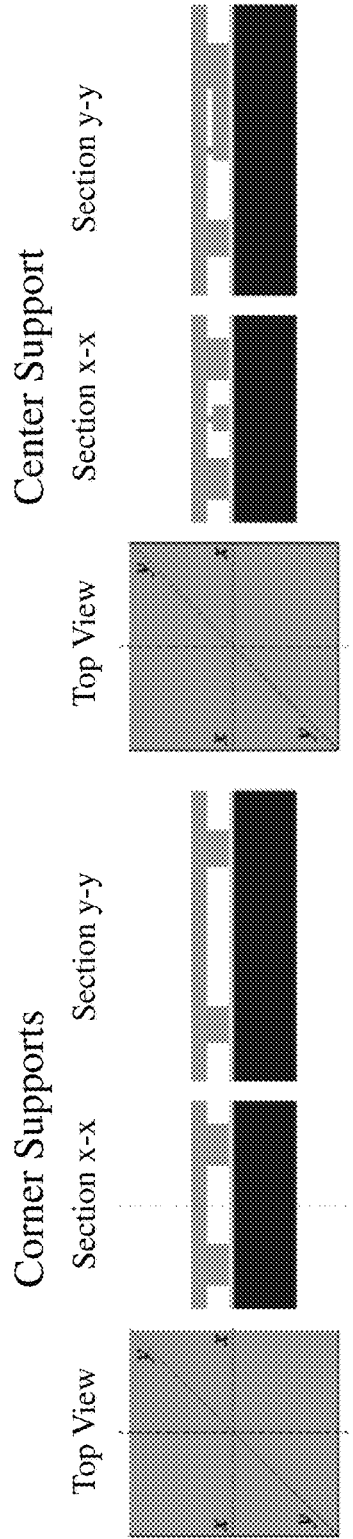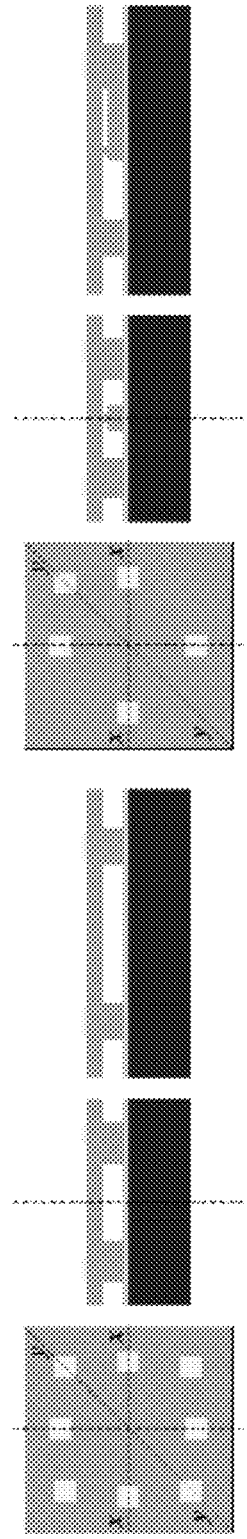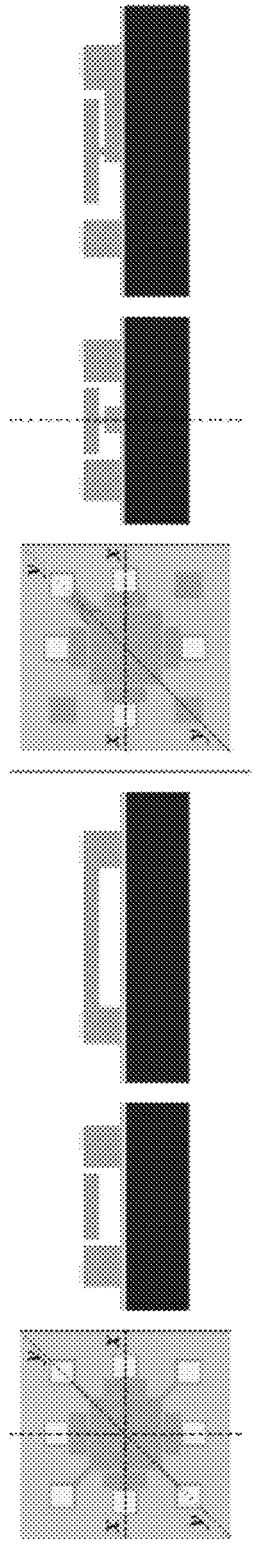
Figure 13D
Figure 13E
Figure 13F

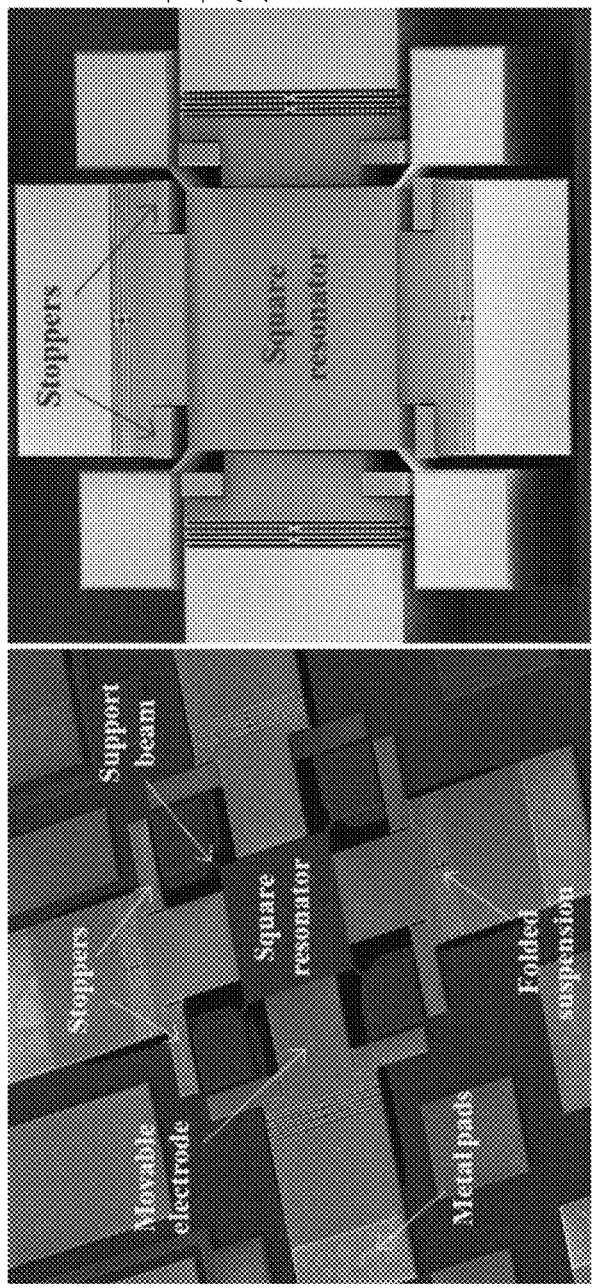
Figure 22A
Figure 22B
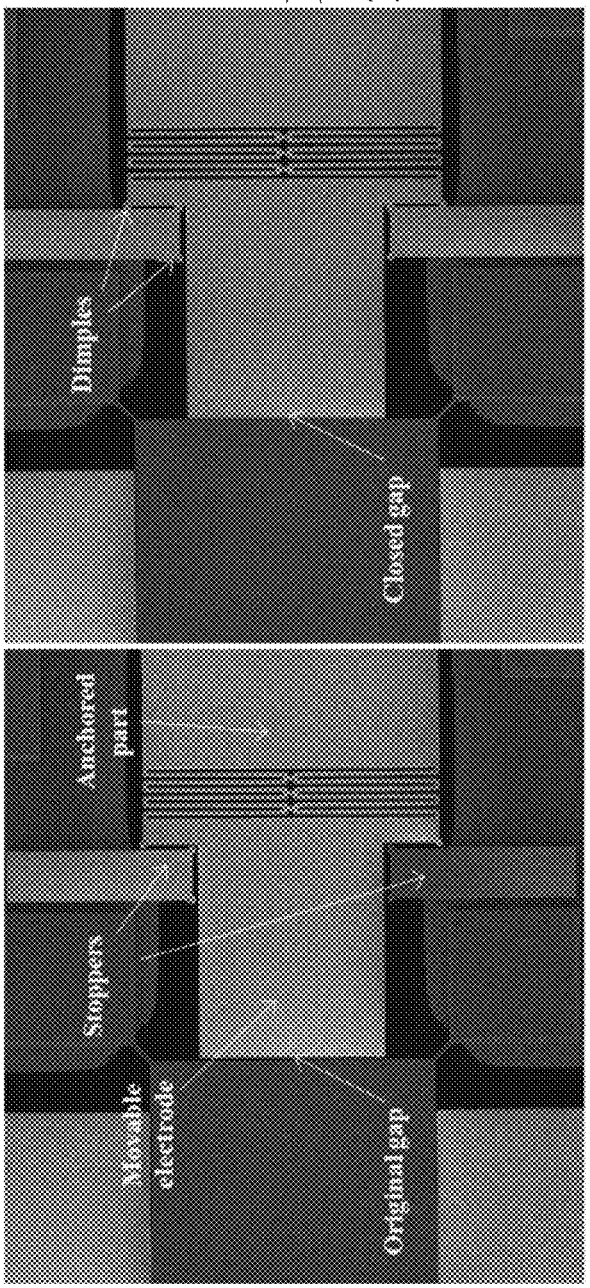
Figure 22C
Figure 22D

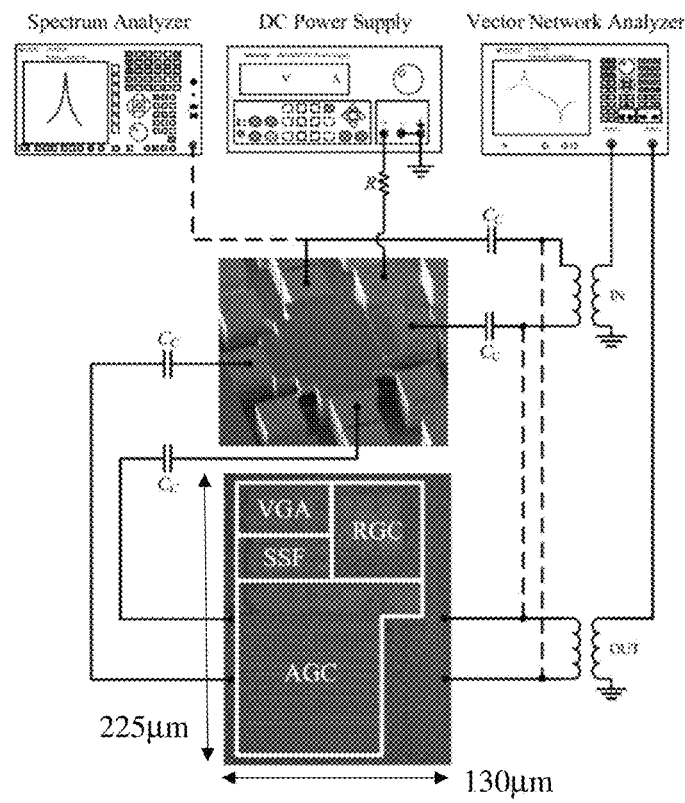
Figure 31
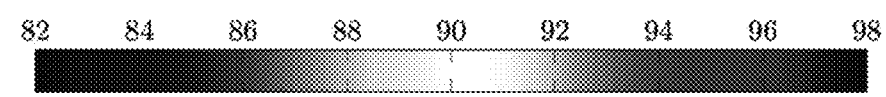
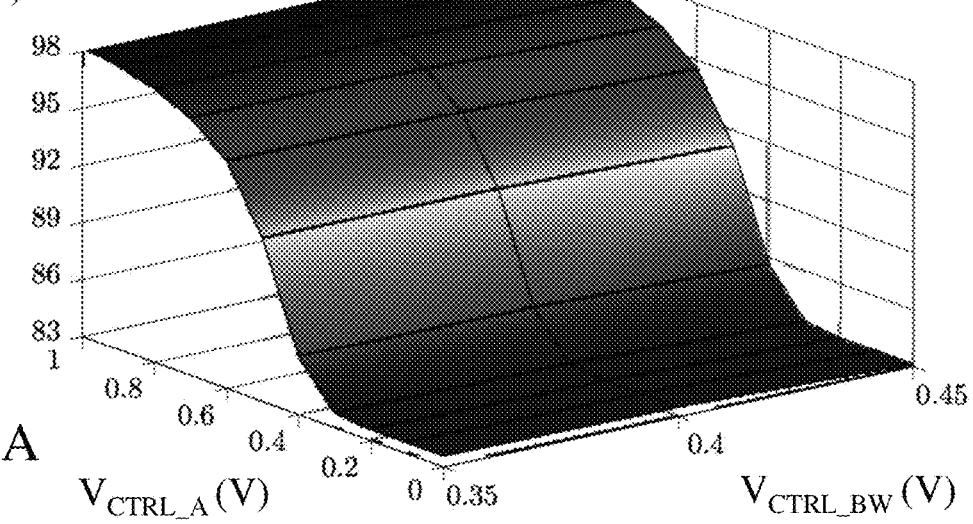
Figure 32A

MICROELECTROMECHANICAL SYSTEM RESONATOR DEVICES AND OSCILLATOR CONTROL CIRCUITS

CROSS-REFERENCE TO RELATED APPLICATIONS

This patent application claims the benefit of priority from U.S. Provisional Patent Application 62/583,589 filed on Nov. 9, 2017 entitled "Microelectromechanical System Resonator Devices and Oscillator Control Circuits", the entire contents of this being incorporated herein by reference.

FIELD OF THE INVENTION

This invention relates to microelectromechanical resonator devices and their associated oscillator control circuits, and more particularly to methods and designs allowing for improved manufacturability and performance including:
  low motional resistance without DC biasing;
  manufacturing via dual silicon-on-insulator substrates;
  resonator anchoring without release holes or wide supports;
  electrostatic pull-in gap closing with stoppers for low cost fabrication, low voltage, motional resistance reduction, and tuning range enhancement based on electrostatic spring softening;
  fixed or adjustable bandwidth fully differential high gain TIAs with low power high frequency oscillators;
  hybrid piezoelectric and electrostatic actuation for either single resonator loop or dual coupled resonator loops; and
  multiplexed multiple resonators for multiple concurrent frequencies in single output or wider bandwidth than supported by single oscillator.

BACKGROUND OF THE INVENTION

Reference oscillators are of great interest because of their ubiquitous use in timing applications generally, and in modern wireless communication devices particularly. They are indispensable to ensure proper synchronization in almost any system. Microelectromechanical system (MEMS) resonators are receiving continuously increasing interest due to their small size as well as their potential for integration with other MEMS devices and electrical circuits on the same chip which makes them excellent candidates for replacing crystal-based resonators in many timing applications. This is especially important for handheld and wearable electronic devices addressing high volume consumer orientated applications where weight, size, and cost are critical parameters.

Accordingly, it is important that the MEMS resonators be manufacturable using semiconductor processing techniques that are either common to those used in low cost electronics such as complementary metal-oxide-semiconductor (CMOS) based electronics for direct monolithic integration or compatible with MEMS formation post-electronics formation with high yield. Accordingly, within the prior art, MEMS resonator performance parameters such as quality factor (Q) and motional resistance are commonly optimized for different resonator designs through aspects such as DC bias, narrow suspension beams and narrow transduction gaps. However, such aspects are typically contrary to the desire for high manufacturing yields and exploitation of lower cost micron resolution semiconductor process lines rather than state-of-the-art sub-micron resolution semiconductor processing lines.

Equally, reduced resonator performance can set severe requirements for the oscillation sustaining circuitry, for example gain and power consumption, in order to reach good overall performance for the MEMS resonator based oscillator. Such control sustaining circuitry typically employ single-ended transimpedance amplifiers (TIAs), due to their lower power consumption than fully differential TIAs, with gain-bandwidth enhancement techniques to improve input-referred noise, as single sided TIA noise performance is worse than differential TIAs, and power consumption.

Accordingly, it would be beneficial to provide MEMS designers with MEMS resonator designs and manufacturing processes that whilst supporting the use of low cost low resolution semiconductor processing yield improved resonator performance thereby reducing the requirements of the oscillator circuitry. It would be further beneficial for the oscillator circuitry to be able to leverage the improved noise performance of differential TIAs without sacrificing power consumption.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to microelectromechanical resonator devices and their associated oscillator control circuits, and more particularly to methods and designs allowing for improved manufacturability and performance including:
  low motional resistance without DC biasing;
  manufacturing via dual silicon-on-insulator substrates;
  resonator anchoring without release holes or wide supports;
  electrostatic pull-in gap closing with stoppers for low cost fabrication, low voltage, motional resistance reduction, and tuning range enhancement based on electrostatic spring softening;
  fixed or adjustable bandwidth fully differential high gain TIAs with low power high frequency oscillators;
  hybrid piezoelectric and electrostatic actuation for either single resonator loop or dual coupled resonator loops; and
  multiplexed multiple resonators for multiple concurrent frequencies in single output or wider bandwidth than supported by single oscillator.

In accordance with an embodiment of the invention there is provided a method for providing a MEMS device comprising:
executing a first process sequence for manufacturing upon a silicon substrate a plurality of die each comprising a MEMS resonator having features compliant with the processing and design guidelines of the first processing sequence, the MEMS resonator comprising a central region anchored to the silicon substrate by a plurality of anchor beam supports;
executing a second processing sequence upon a predetermined portion of the plurality of die to reduce feature dimensions of a first predetermined portion of each die, the first predetermined portion of the die comprising at least the width of the plurality of anchor beam supports.

In accordance with an embodiment of the invention there is provided a method of forming a MEMS resonator comprising:

forming within a first wafer a first predetermined portion of the MEMS resonator comprising a plurality of anchors;

forming within a second wafer a second predetermined portion of the MEMS resonator comprising at least a resonator element and a plurality of electrical pads;

bonding the first wafer and second wafer together such that the resonator is free to resonate and the plurality of electrical pads are supported by a first subset of the plurality of anchors forming electrode anchors.

In accordance with an embodiment of the invention there is provided a MEMS resonator device comprising:

a central resonator element suspended by a plurality of anchor beams disposed at predetermined points on the periphery of the central resonator element in dependence upon the resonance mode the central resonator element is designed to resonate in;

a plurality of electrostatic actuators disposed around the periphery of the central resonator element, each electrostatic actuator comprising a movable portion disposed towards the central resonator element, a fixed portion disposed distal to the central resonator element, and a spring disposed between the movable portion and the fixed portion; and a plurality of stoppers, each stopper disposed relative to the central resonator element and an electrostatic actuator of the plurality of electrostatic actuators to limit motion of the moveable portion of the electrostatic actuator of the plurality of electrostatic actuators towards the central resonator element; wherein when fabricated the movable portions of the plurality of electrostatic actuators form gaps relative to the central resonator element defined by the minimum gap feature of manufacturing process employed to form the MEMS resonator which is larger than the gaps when the moveable portions of the plurality of electrostatic actuators are driven under electrostatic actuation into contact with the stoppers, which is limited by the grid spacing of the masks used.

A method of providing a MEMS resonator device comprising: providing a MEMS resonator comprising:

a central resonator element suspended by a plurality of anchor beams disposed at predetermined points on the periphery of the central resonator element in dependence upon the resonance mode the central resonator element is designed to resonate in;

a plurality of electrostatic actuators disposed around the periphery of the central resonator element, each electrostatic actuator comprising a movable portion disposed towards the central resonator element, a fixed portion disposed distal to the central resonator element, and a spring disposed between the movable portion and the fixed portion; and a plurality of stoppers, each stopper disposed relative to the central resonator element and an electrostatic actuator of the plurality of electrostatic actuators to limit motion of the moveable portion of the electrostatic actuator of the plurality of electrostatic actuators towards the central resonator element; and applying one or more DC voltages to electrostatically move the movable portions of the plurality of electrostatic actuators from an as fabricated position where they form gaps relative to the central resonator element defined by a minimum gap feature of manufacturing process employed to form the MEMS resonator to a position where the gaps are reduced.

In accordance with an embodiment of the invention there is provided a MEMS oscillator comprising a MEMS resonator having a pair of sensing electrodes and a pair of driving electrodes; and a fully differential transimpedance amplifier (TIA) providing a feedback loop between the sensing electrodes and the driving electrodes, the TIA comprising an input stage having differential inputs and differential outputs, wherein the differential inputs are coupled to the sensing electrodes of the MEMS resonator and the input stage employs a regulated cascade topology;

a variable gain amplifier (VGA) having differential inputs and differential outputs, wherein the differential inputs of the VGA are coupled to the differential outputs of the input stage and the gain of the VGA is controlled by an automatic gain control (AGC) circuit; and an output stage having differential inputs and differential outputs, wherein the differential inputs of the output stage are coupled to the differential outputs of the VGA, the differential outputs of the output stage are coupled to the driving electrodes of the MEMS resonator and the output stage employs a super source follower.

In accordance with an embodiment of the invention there is provided MEMS oscillator comprising a piezoelectric MEMS resonator having a pair of sensing electrodes disposed on a first side of the piezoelectric MEMS resonator and a pair of driving electrodes disposed on a second side of the piezoelectric MEMS resonator; and a fully differential transimpedance amplifier (TIA) providing a feedback loop between the sensing electrodes and the driving electrodes, the TIA comprising an input stage having differential inputs and differential outputs, wherein the differential inputs are coupled to the sensing electrodes of the MEMS resonator and the input stage employs a regulated cascade topology;

a variable gain amplifier (VGA) having differential inputs and differential outputs, wherein the differential inputs of the VGA are coupled to the differential outputs of the input stage and the gain of the VGA is controlled by an automatic gain control (AGC) circuit; and an output stage having differential inputs and differential outputs, wherein the differential inputs of the output stage are coupled to the differential outputs of the VGA, the differential outputs of the output stage are coupled to the driving electrodes of the MEMS resonator and the output stage employs a super source follower; wherein the piezoelectric MEMS resonator is coupled to the fully differential TIA on its inputs and outputs via capacitors; and the piezoelectric MEMS resonator is driven without any DC signal applied to it.

In accordance with an embodiment of the invention there is provided a method of providing a MEMS resonator device comprising: providing a MEMS resonator comprising:

a central resonator element at least one of supported and suspended by a plurality of mounts above a substrate wherein the at least one of supported and suspended together with how many mounts and their locations are determined in dependence upon a resonance mode the central resonator element is designed to resonate in;

a plurality of electrostatic actuators disposed around the periphery of the central resonator element, each electrostatic actuator comprising a movable portion disposed towards the central resonator element, a fixed portion disposed distal to the central resonator element, and a spring disposed between the movable portion and the fixed portion; and a plurality of stoppers, each stopper disposed relative to the central resonator element and an electrostatic actuator of the plurality of electrostatic actuators to limit motion of the moveable portion of the electrostatic actuator of the plurality of electrostatic actuators towards the central resonator element;

applying one or more DC voltages to electrostatically move the movable portions of the plurality of electrostatic actuators from an as fabricated position where they form gaps relative to the central resonator element defined by a minimum gap feature of manufacturing process employed to form the MEMS resonator to a position where the gaps are reduced.

In accordance with an embodiment of the invention there is provided a method comprising:

providing a MEMS resonator formed from a piezoelectric material; and providing an electrical circuit coupled to the MEMS resonator comprising:
   providing a first portion of the electrical circuit to excite the MEMS resonator through piezoelectric actuation; and
   providing a second portion of the electrical circuit to excite the MEMS resonator through electrostatic actuation; wherein the piezoelectric actuation and electrostatic actuation excite the same mode of oscillation.

In accordance with an embodiment of the invention there is provided a MEMS device comprising:

a MEMS resonator operates over a predetermined first frequency range;

a plurality of other MEMS resonators each operating over a predetermined second frequency range of a plurality of second frequency ranges; and a multiplexer coupled to the MEMS resonator and the plurality of other MEMS resonators; wherein the MEMS device provides at least one of:
   an oscillator providing multiple output frequencies, each output frequency being within at least one of first frequency range and the plurality of second frequency ranges; and
   a single output frequency over a frequency range established by the first frequency range and the plurality of second frequency ranges.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 5A to 5I depict a simplified fabrication process flow for manufacturing a resonator according to an embodiment of the invention with post-processing;

FIGS. 11A and 11B depict exploded and assembled views for a MEMS resonator according to an embodiment of the invention with corner supports;

FIGS. 11C and 11D depict exploded and assembled views for a MEMS resonator according to an embodiment of the invention with center support;

FIGS. 13A to 13F depicts a simplified fabrication process flow for the Lamé MEMS resonators according to embodiments of the invention;

FIGS. 22A and 22B depict SEM micrographs of Lamé mode resonators according to an embodiment of the invention via the PiezoMUMPs™ and MicraGem-Si™ process technologies respectively providing 500 nm and 200 nm final gaps respectively;

FIGS. 22C and 22D depict SEM micrographs of one electrode of a Lamé mode resonator according to an embodiment of the invention in the original unclosed (as manufactured) and closed positions respectively;

FIG. 31 depicts an exemplary test setup for a MEMS-based oscillator in open and closed loop configurations with a micrograph of the TIA and resonator dies;

FIGS. 32A and 32B depict measured gain and bandwidth respectively for different control voltages applied to the oscillator circuit according to an embodiment of the invention;

DETAILED DESCRIPTION

Figure 1A:
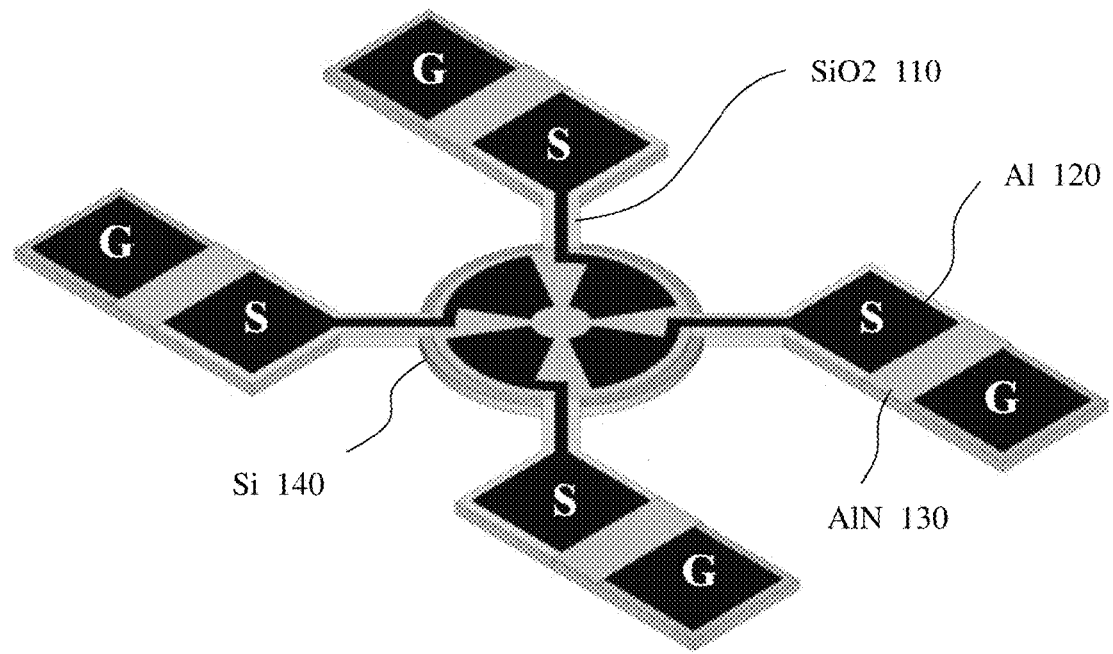
FIG. 1A depicts a simplified diagram of a disk resonator according to an embodiment of the invention before post-processing outlining the pads used for piezoelectric actuation.

The present invention is directed to microelectromechanical resonator devices and their associated oscillator control circuits, and more particularly to methods and designs allowing for improved manufacturability and performance including:

low motional resistance without DC biasing;
manufacturing via dual silicon-on-insulator substrates;
resonator anchoring without release holes or wide supports;
electrostatic pull-in gap closing with stoppers for low cost fabrication, low voltage, motional resistance reduction, and tuning range enhancement based on electrostatic spring softening;
fixed or adjustable bandwidth fully differential high gain TIAs with low power high frequency oscillators
hybrid piezoelectric and electrostatic actuation for either single resonator loop or dual coupled resonator loops; and
multiplexed multiple resonators for multiple concurrent frequencies in single output or wider bandwidth than supported by single oscillator.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

A: Piezoelectric Bulk Mode Disk Resonator with Post-Processing

A1. Introduction

MEMS resonators are operated typically through two actuation mechanisms: piezoelectric or capacitive. Piezoelectric actuation generally provides high electromechanical transduction efficiencies and low signal transmission losses, resulting in low motional resistances, which is very advantageous as it simplifies the design constraints of the associated electronic circuitry and results in lower power consumption. Also, piezoelectric devices do not require any DC voltage for operation. However, piezoelectric devices generally suffer from lower quality factors.

MEMS resonators can also be classified based on their vibration modes as either flexural or bulk mode devices. Bulk mode devices typically exhibit high stiffness, and are consequently less prone to thermoelastic damping and consequently achieve large quality factors, even at atmospheric pressure.

Combining piezoelectric actuation and bulk-mode operation has been receiving increasing interest for MEMS resonators in order to combine the advantages of both regimes. Amongst piezoelectric materials is aluminum nitride which is a piezoelectric semiconductor material compatible with semiconductor processing techniques which is typically deposited by sputtering. Within the prior art the actuation and sensing of a bulk-mode disk resonator made of aluminum nitride (AlN) is performed by a combination of piezoelectric and capacitive methods. The device resonated at 51 MHz with quality factor of ~13,000 and an insertion loss of ~−34 dB. Alternatively, a radial mode AlN resonator has been reported employing a capacitive-piezoelectric actuation scheme using metal electrodes above and beneath the disk structure. The electrostatic electrodes beneath the disk structure were also used to pull it down to the substrate and consequently power the resonator off upon the application of a switching DC voltage. Notably, these prior art designs require complex fabrication process steps to realize submicron gaps in order to avoid excessive motional resistances. Also, within the prior art, Lamé mode resonators utilizing piezoelectric actuation are presented with a resonance frequency of 36.23 MHz, a quality factor of 30,700, and an insertion loss of −66 dB whilst within another design transverse piezoelectric actuation was utilized to achieve bulk mode in-plane resonance in the wine-glass mode. However, the quality factor of the devices presented was degraded by anchor losses in the wide supports whose width was limited by the constraints of the fabrication technology.

Accordingly, the embodiments of the invention described and depicted below in Section A and with respect to FIGS. 1 to 10B exploit transverse piezoelectric actuation with a bulk mode resonator in order to achieve resonators with low motional resistance without any DC voltage, high quality factor (even in air), and a relatively high resonance frequency. Beneficially, embodiments of the invention were prototyped using a relatively simple and low resolution processing technology, namely MEMSCAP™ PiezoMUMPs™. A post-processing procedure is utilized by the inventors to reduce the width of the suspension beams of the resonator structure beyond the constraints of the commercial fabrication technology used. This leads to significant anchor loss reduction and quality factor enhancement.

A2. Design

Figure 1B:
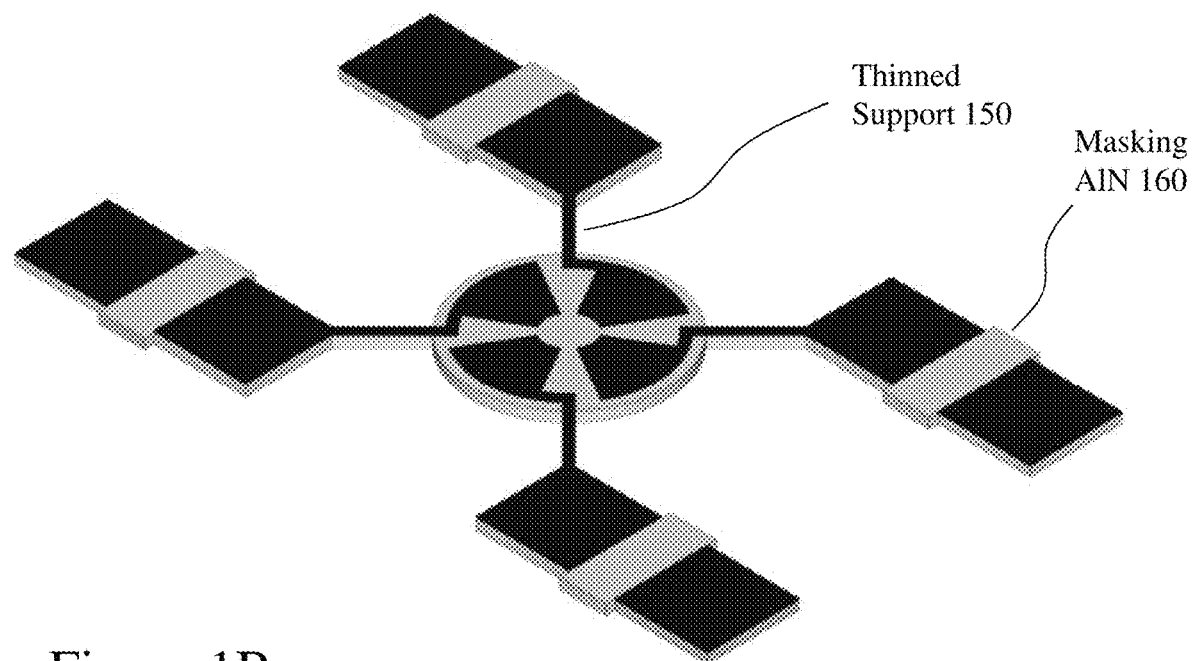
FIG. 1B depicts a simplified diagram of a disk resonator according to an embodiment of the invention after post-processing highlighting the thinned supports.

Referring to FIGS. 1A and 1B there are depicted diagrams of a disk resonator according to an embodiment of the invention before post-processing outlining the pads used for piezoelectric actuation (FIG. 1A) and after post-processing highlighting the thinned supports (FIG. 1B). The resonator comprises a 10 µm-thick single-crystalline silicon (Si 140) central disk structure acting as the wine-glass resonator. The disk is covered by a 0.5 µm layer of aluminum nitride (AlN 130) providing the piezoelectric material used for transduction and to bring the resonator into its wine-glass mode of resonance through transverse piezoelectric actuation. The AlN 130 covers the Si 140 disk completely, except for a 5 µm wide area on the periphery of the disk which is established in dependence upon a design rule for the commercial foundry fabrication process. The disk structure is supported by four suspension beams of width 10 µm, the minimum allowed by the design rules of the commercial foundry fabrication process in order to accommodate the aluminum (Al 120) interconnects formed upon their upper surfaces. The wine-glass mode is favored over other bulk modes (e.g., radial mode) for the bulk resonance operation as it has four nodal points that can be used for connecting the supports with minimal impact on the device performance. The supports are necessary for routing the electrical signals to the piezoelectric electrodes. Each support isolating the electrical contacts via silicon dioxide (SiO2 110).

The support length is designed, as detailed in Section A3, in order to reduce anchor losses. The supports have a 90° angular spacing, so as to correspond with the nodal points of the wine-glass resonance mode. The support beams are anchored to the substrate at their ends and mechanically connected to the electrical pads. Each of these supports is associated with a pair of pads, one for the signal (S) routed above the piezoelectric layer, and the other for the ground (G), routed through the underlying silicon structural layer. For this purpose, an aluminum layer, Al 120, above the disk structure is patterned into four distinct quadrants, in order to match the strain distribution. Each electrode is electrically connected to a distinct signal pad by an aluminum track routed above its respective suspension beam. The conductive structural silicon layer itself acts as the ground plane of the device, and connects with each ground pad while remaining electrically insulated from the top signal interconnect by a layer of silicon dioxide (SiO2 110). Aluminum nitride is not present on the supports to avoid any unintended transduction which would alter the resonance mode and possibly lead to undesirable spurious modes of vibration.

The dies received from the MEMS foundry were post-processed by successive dry etching of the silicon dioxide on the supports and the device silicon layer using the aluminum nitride and aluminum as hard masks, in order to narrow down the supports from 10 µm to 4 µm (the aluminum interconnect width), as shown in FIG. 1B. This leads to the reduction of the anchor losses and consequently a significant improvement in the device quality factor. Generally, the quality factor of a resonator is limited by losses due to several damping mechanisms, e.g., anchor loss, air damping, and thermoelastic damping. One of the main limitations of the quality factor of disk resonators is anchor loss where within the prior art design comparisons with 1 µm narrower supports exhibited ~80% improvement in quality factor. Post-processing also reduces the disk radius by 5 µm, as the silicon device layer includes a 5 µm inclusion for the aluminum nitride layer because of the technology design rules. Aluminum nitride patterns are added in the regions between the signal and ground pads in order to protect the underlying silicon during the dry etch post-processing steps, and maintain the electrical connection between the ground pads and the silicon ground plane formed by the resonator underlying structure. Table A1 summarizes the design parameters of the resonator device fabricated here.

TABLE A1

Summary of Resonator Device Design Parameters

| Parameter | Value |
| --- | --- |
| Structure Thickness (µm) | 10 |
| Post-Process Disk Diameter (µm) | 190 |
| Post-Processed Support Width (µm) | 4 |
| Post-Processed Support Length (µm) | 48 |
| AlN Layer Thickness (µm) | 0.5 |
| Simulated Resonance Frequency (MHz) | ~22.9 |

Finite-element simulations projects a resonance frequency of the post-processed disk in the wine-glass mode to be of approximately 22.9 MHz.

A3. Support Optimization

As mentioned supra, the dies received from the MEMS foundry were post-processed in order to narrow down the supports, reduce the anchor losses and consequently improve the device quality factor. The length of the beams (L3) was estimated theoretically according to Equation (A1) below wherein $w_S$ is the support width, $f_0$ is the resonance frequency, E and ρ are the Young's modulus and density of the single-crystalline structural material used, respectively, and $\lambda_i$ can be approximated by Equation (A2).

$$L_S = \sqrt{\frac{\lambda_i^2 w_S}{4\pi\sqrt{3} f_o}} \sqrt{\frac{E}{\rho}} \quad (A1)$$

$$\lambda_i = (4i+1)\frac{\pi}{4}, i = 1, 2, \ldots \quad (A2)$$

This being 30 µm (i=1) or 54 µm (i=2), so that the support beams resonate at the same frequency as the main suspended structure for a disk diameter of 190 µm and support width of 4 µm, i.e., the dimensions after post-processing. This allows for the resonator to vibrate unimpeded and consequently minimizes the associated anchor losses and maximizes the quality factor. In order to validate the calculated anchor beam length, the structure is simulated using a method wherein a perfectly matched layer (PML) is added at the substrate interface to avoid the reflection of acoustic waves.

Figure 2:
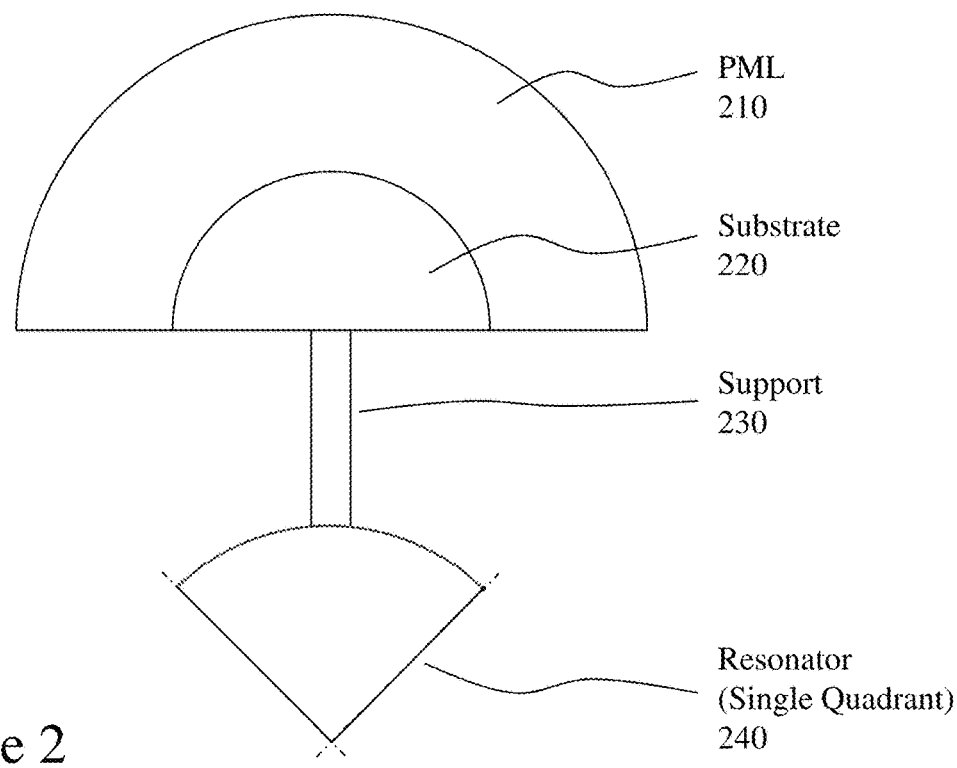
FIG. 2 depicts a schematic for the resonator model used for FEM support optimization.
Figure 3:
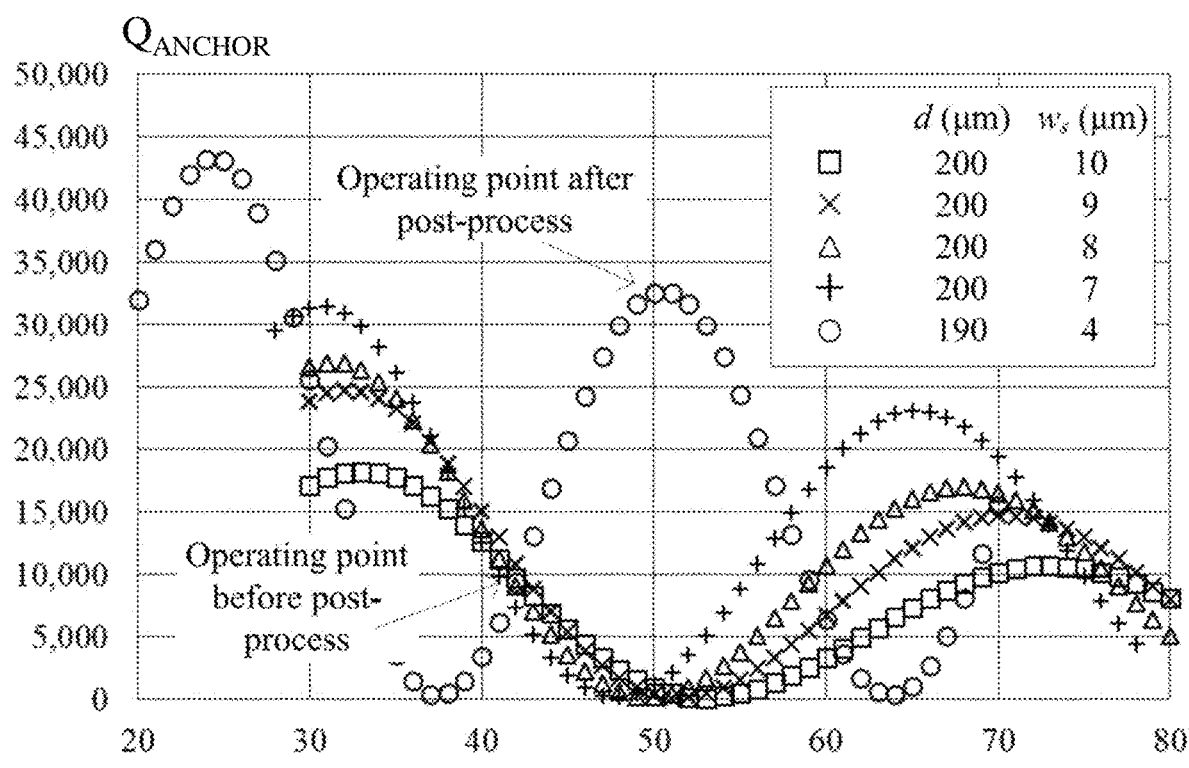
FIG. 3 depicts FEM simulation results showing the effect of the support length on the resonator quality factor resulting from anchor losses for different support widths and disk diameter wherein resonator operating points before and after post-processing are depicted to highlight the projected improvements.
Figure 4A:
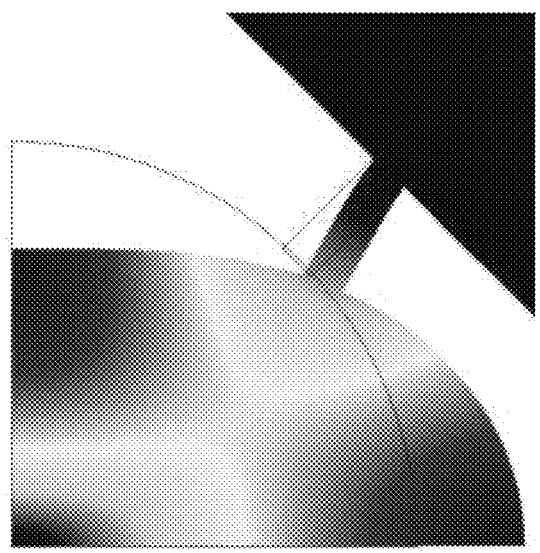
FIGS. 4A to 4B depict the resonance mode shape of the modelled structure where the support length is tuned so that the disk to support connection point corresponds to an antinode for support beam resonance.
Figure 4B:
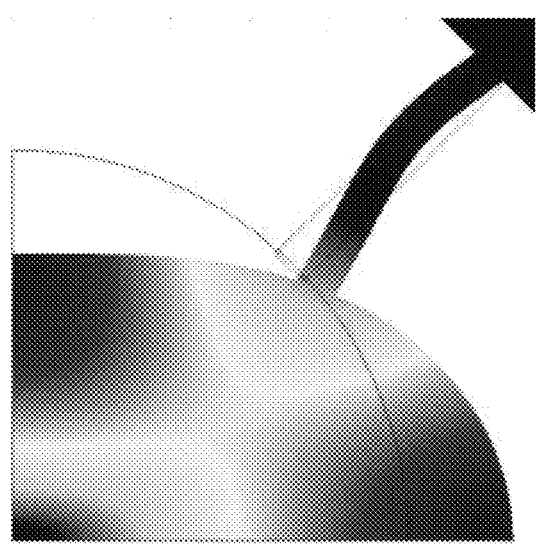
Figure 4C:
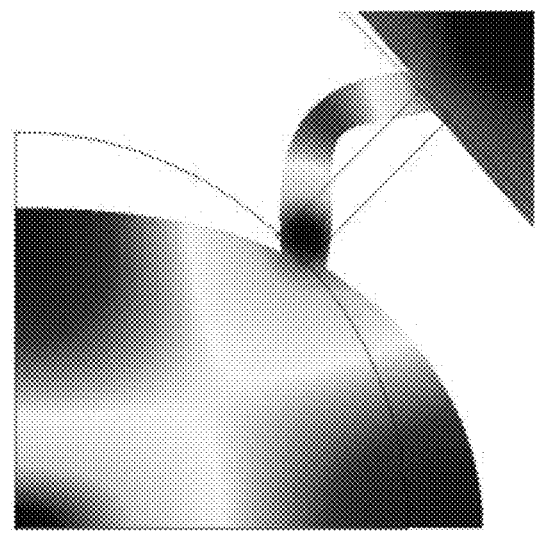
FIG. 4C depicts the resonance mode shape of the modelled structure where the support length is tuned so that the disk to support connection point corresponds to a node for support beam resonance.

FIG. 2 illustrates the model used in COMSOL Multiphysics for the FEM simulation where one quadrant of the structure is only simulated to make use of the symmetry of the structure and reduce the complexity of the computation. Table A2 details the model parameters used. This 2D model is used to predict the losses due to the in-plane flexural motion of the supports. Out-of-plane motion due to the heterogeneous structure, i.e., AlN-on-Si, may introduce additional losses. FIG. 3 shows the simulation results for the resonator quality factor resulting from anchor losses ($Q_{ANCHOR}$) versus the support beam length ($L_S$) for the disk resonator with the original disk diameter (d) before post-processing (200 pm), and with different support beam widths ($w_S$). For any support width, the quality factor curve exhibits maxima and minima. The support lengths corresponding to quality factor maxima shown in FIG. 3 are in very good agreement with the lengths calculated theoretically according to Equations (A1) and (A2) respectively. The maxima correspond to support lengths where the support beam resonates with an antinode (i.e., point with peak motion amplitude) at the support connection point, as shown in FIGS. 4A and 4B. This allows for the free motion of the support connection points during resonance in the wine-glass mode and consequently lower damping and improved quality factor. On the other hand, the minima correspond to support lengths where the support beam resonates with a node (i.e., point with least or no displacement) at the support connection point, as shown in FIG. 4C. Connecting a support with the disk support's nodal point precludes the disk's motion at the anchoring points and consequently results in increased damping and lower quality factor. These support lengths corresponding to quality factor minima predicted by the simulation results shown in FIG. 3 are also in very good agreement with the lengths calculated theoretically according to Equation (A1) and with A, approximated alternatively with Equation (A3) for a beam with clamped-clamped boundary conditions.

TABLE A2

FEM Model and Mesh Parameters Used

| Model Parameter | Value | Mesh Parameter | Value |
|---|---|---|---|
| Substrate Radius (μm) | 150 | Min. Element Size (μm) | 10 |
| PML Layer Width (μm) | 150 | Max. Element Size (μm) | 0.04 |
| Mesh Type | Triangular | Max. Element Growth Rate | 1.2 |

This yields $\lambda_i$=36 μm (i=1) or 60 μm (i=2) for a disk diameter of 190 μm and support width of 4 μm (i.e., dimensions after post-processing). Table A3 summarizes the support length values calculated theoretically and predicted by simulation for maximum and minimum quality factors showing very good agreement. FIG. 3 also shows that as the support width decreases, the maximum quality factor that can be obtained by tuning the support length increases. This is because of the smaller interface area of the support with the disk that reduces the constraint on disk displacement. Moreover, FIG. 3 shows the curve for the quality factor of the disk with a diameter of 190 μm and support width of 4 μm, which are the post-processed structure dimensions. The curve is shifted to the left in comparison to the 200 μm-diameter disk curves due to the increased resonance frequency for the smaller disk, which in turn affects the support length required to achieve coupling at the antinodes of the supports. The resonator is designed with an after post-processing support length of 48 μm in order to match the second maximum of the quality factor curve, which is in good agreement with the value calculated using Equations (A1) and (A2).

This requires a layout of 42 μm-long supports, as the supports lengthen after post-processing. FEM simulation projects an increase in the quality factor due to anchor losses from ~9,800 at disk diameter of 200 μm, support width of 10 μm, and support length of 42 μm (i.e., dimensions before post-processing) to ~30,000 at disk diameter of 190 μm, support width of 4 μm, and support length of 48 μm (i.e., dimensions after post-processing). This corresponds to a factor of ~3× improvement. Also, simulation projects an additional quality factor improvement if the support length is modified to match the first maximum in the quality factor curve, which corresponds to a quality factor of ~43,000.

TABLE A3

$L_S$ Calculated Theoretically versus Simulation for Max. and Min. $Q_{ANCHOR}$ for d = 150 μm and $\omega_S$ = 4 μm

|  | i | $L_1$ (Theoretical) (μm) | $L_2$ (Simulated) (μm) |
|---|---|---|---|
| Max. $Q_{ANCHOR}$ | 1 | 30 | 25 |
|  | 2 | 54 | 50 |
| Min. $Q_{ANCHOR}$ | 1 | 36 | 37 |
|  | 2 | 60 | 64 |

The simulation results of the 2D model presented here are in very good agreement with the measurements detailed in Section A5 suggesting that the losses due to out-of-plane motion are not significant for this type of resonator. Other methods of anchor loss reduction have been reported in the literature which could possibly be combined with the method according to the embodiment of the invention presented here to further reduce the losses.

A4. Fabrication Process

The resonators presented herein within Section A were fabricated using the PiezoMUMPs technology from MEMSCAP™, followed by an in-house post-processing sequence aimed at reducing the width of the supports, and at overcoming the design rule limitations of the technology. This allows the reduction of the anchor losses and subsequently an increase in the resonator's quality factor. Post-processing of released MEMS devices fabricated in commercial fabrication runs has been reported within the prior art wherein spray coated photoresist mask was used for silicon dry etching the released MEMS dies. In contrast, the resonators according to the embodiment of the invention presented here are self-masked using patterns of materials already present on the dies from the MEMS processing at the commercial foundry. These self-masks being used as etch masks, as explained later in detail.

The fabrication process sequence (see MEMSCAP™ PiezoPUMPs Design Handbook Rev 1.3, MEMSCAP, 2014) followed by the post-processing steps, is illustrated in FIGS. 5A to 5I for the devices fabricated here. It would be evident to one of skill in the art that other process sequences and process flows/materials may be employed according to the commercial foundry MEMS processes etc. Further, the post-processing may be performed at wafer level after MEMS release rather than at die level as employed here due to the wafer run nature of MEMSCAP™ allowing prototyping on partial wafer blocks at a relatively modest fee.

The process begins, for example, with 150 mm n-type double-side polished silicon on insulator (SOI) wafers, as shown in FIG. 5A. The top silicon surface is doped using phosphosilicate glass (PSG) in order to increase its conductivity. This layer constitutes the main structural layer that will be used to form the device, and is connected to the electrical ground. A 200 nm-thick thermal silicon dioxide SiO2 layer is then grown, patterned and etched using reactive ion etching (RIE), as illustrated in FIG. 5B. This thermally grown oxide serves to isolate the signal pads and interconnects from the ground plane in the areas without aluminum nitride (AlN) (e.g., the signal pads or the top of the supports). A 0.5 μm thick layer of AlN is then deposited, patterned, and wet etched, as shown in FIG. 5C. This AlN layer provides the piezoelectric layer which is used for transduction.

A metal stack composed of 20 nm of chromium (Cr) and 1 μm of aluminum is subsequently deposited and patterned through a lift-off process to form the electrical interconnects and pads, as illustrated in FIG. 5D. At this stage, the silicon is lithographically patterned, and etched using deep reactive ion etching (DRIE) to form the main disk structure, as shown in FIG. 5E. Subsequently, a protective material is applied to the front side of the substrate, to serve as a cover during subsequent backside etch steps. The substrate layer is then lithographically patterned and etched from the backside using DRIE to form release trenches that stop at the silicon oxide layer. A wet oxide etch then removes the now-exposed buried oxide layer in the trench regions, as shown in FIG. 5F. The front side protection material is then stripped by dry etching, which completes the release of the structure, as shown in FIG. 5G.

The MEMS resonator die were then post-processed in-house in order to reduce the width of the support beams and decrease the associated anchor loss. The exposed silicon dioxide was first dry etched using RIE in a mixture of fluoroform (CHF3), carbon tetrafluoride (CF4), and argon (Ar) gases, masked by the aluminum on the supports and the aluminum nitride elsewhere, as shown in FIG. 5H. Finally, the exposed silicon was DRIE etched using a standard Bosch process, as shown in FIG. 5I.

Figure 6A:
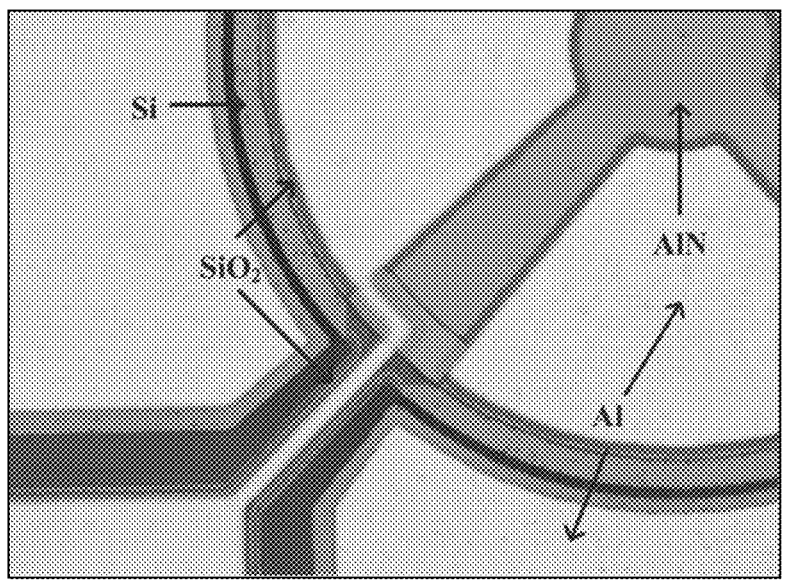
FIG. 6A depicts an optical micrograph of a disk resonator support before post-processing for a MEMS resonator according to an embodiment of the invention.
Figure 6B:
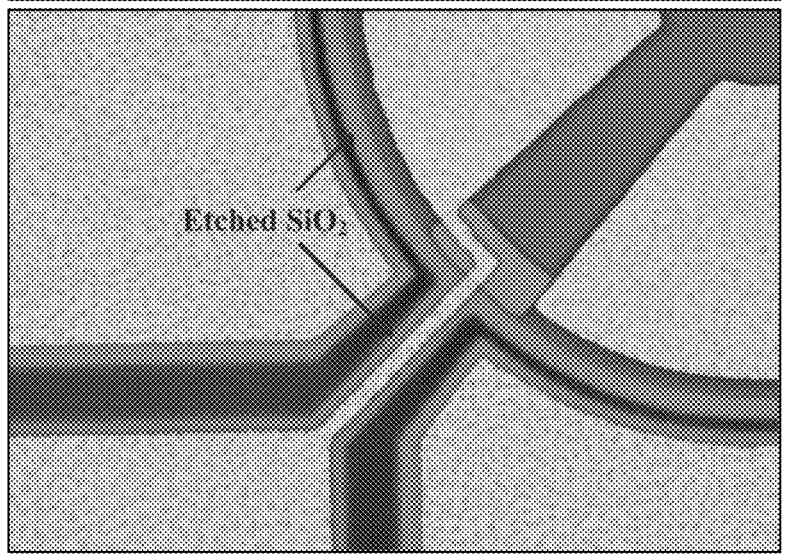
FIGS. 6B and 6C depict optical micrographs of a disk resonator support after oxide reactive ion etching (RIE) and silicon deep RIE etching respectively for a MEMS resonator according to an embodiment of the invention.
Figure 6C:
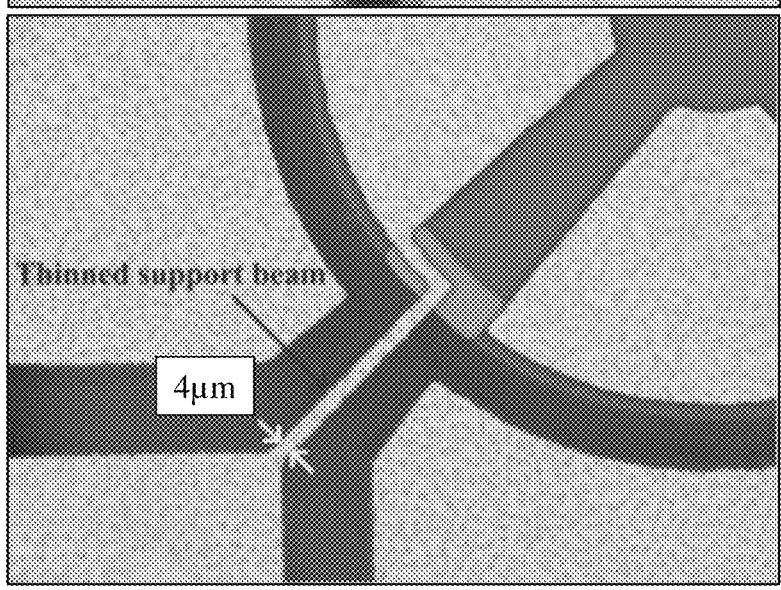
Figure 7:
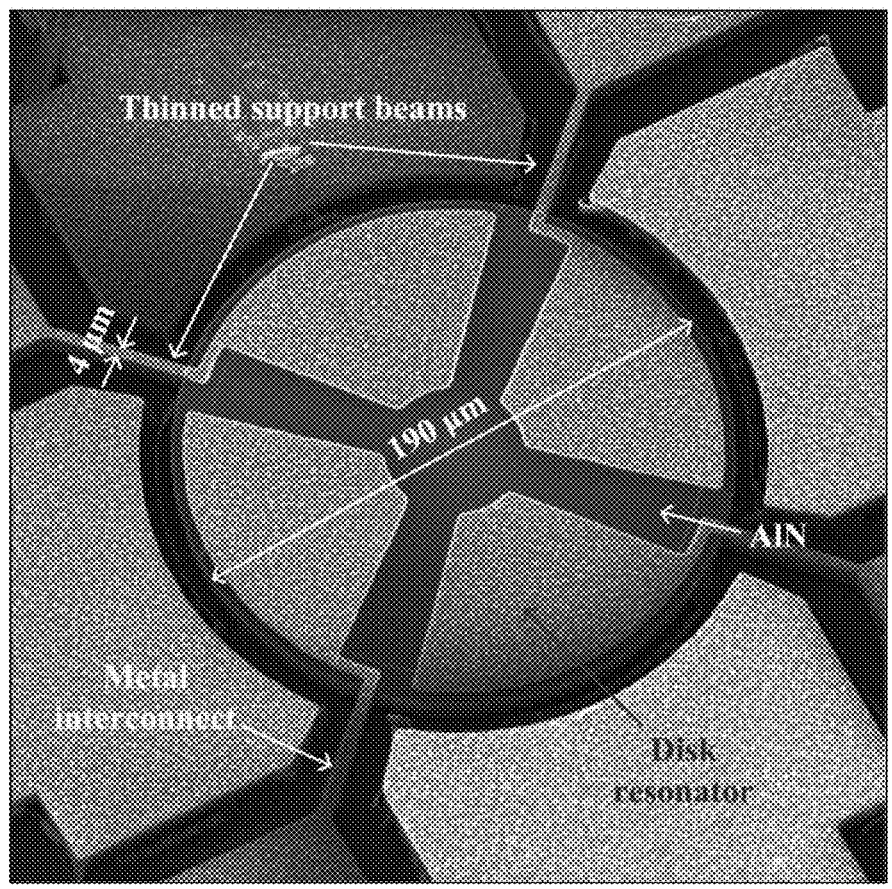
FIG. 7 depicts an SEM micrograph of a single post-processed MEMS resonator according to an embodiment of the invention illustrating the narrower 4 μm-wide supports.
Figure 8:
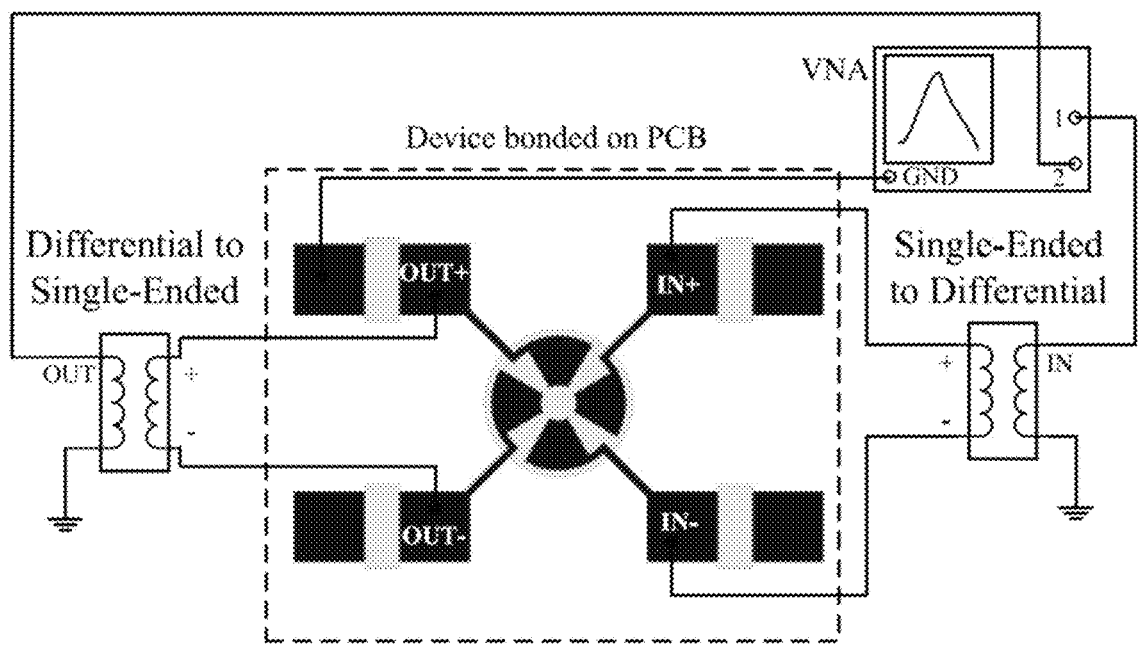
FIG. 8 depicts a schematic of the differential resonance test setup employed.

Now referring to FIG. 6A there is depicted an optical micrograph of a disk resonator support before post-processing for a MEMS resonator according to an embodiment of the invention. FIGS. 6B and 6C depict optical micrographs of a disk resonator support after oxide reactive ion etching (RIE) and silicon deep RIE etching respectively for a MEMS resonator according to an embodiment of the invention. FIG. 7 depicts an SEM micrograph of a single post-processed MEMS resonator according to an embodiment of the invention illustrating the narrower 4 μm-wide supports.

It is evident from FIGS. 6A to 7 that the aluminum is attacked slightly during the post-process dry etching, but not to an extent that would affect the resonator's performance, as metal is not a main structural material of the resonator. The oxide RIE recipe used has an oxide to aluminum selectivity of 2.5:1, while the silicon DRIE recipe used has a silicon to aluminum selectivity higher than 2500:1. Accordingly, the aluminum thickness is reduced by less than 85 nm after the whole post-processing sequence. Also, the aluminum roughness increases by ~20 nm. However, the quality of the aluminum surface is still good enough for wire bonding to the bond pads without any problems.

A5. Measurement Results

The structure was intentionally designed with four independent signal electrodes to enable its use within both single-ended and differential electrical configurations, making it possible to directly connect to different amplifier types without the need for extra components or converters such as baluns. It is worth mentioning that operation in differential configuration increases the signal transmission by ~10 dB due to the added actuation, and does not affect the quality factor, compared to single-ended operation. The device could have been built with only two opposite electrodes and consequently two support beams (i.e., targeted for single-ended operation) in order to achieve higher quality factor due to the lower anchor loss at the expense of potentially higher motional resistance due to the asymmetry in the mode resulting from the geometrical asymmetry.

Figure 9A:
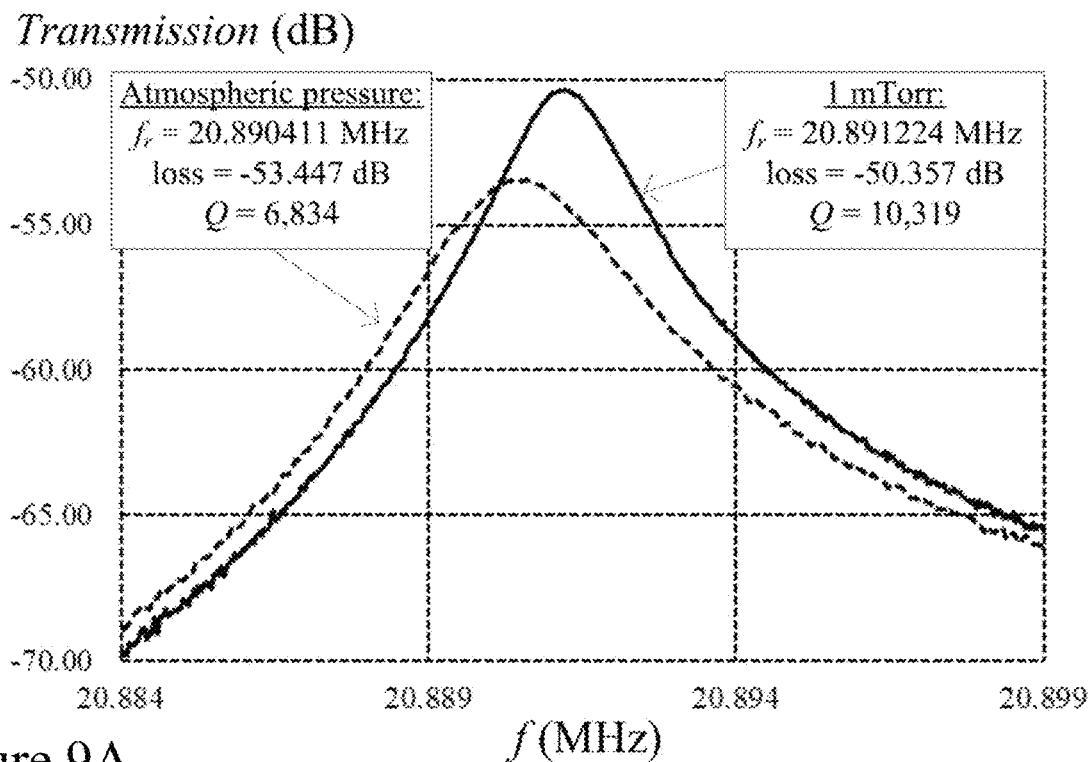
FIGS. 9A and 9B depict measured resonance characteristics for a MEMS resonator according to an embodiment of the invention at atmospheric pressure and in vacuum for before post-processing and after post-process support thinning respectively.
Figure 9B:
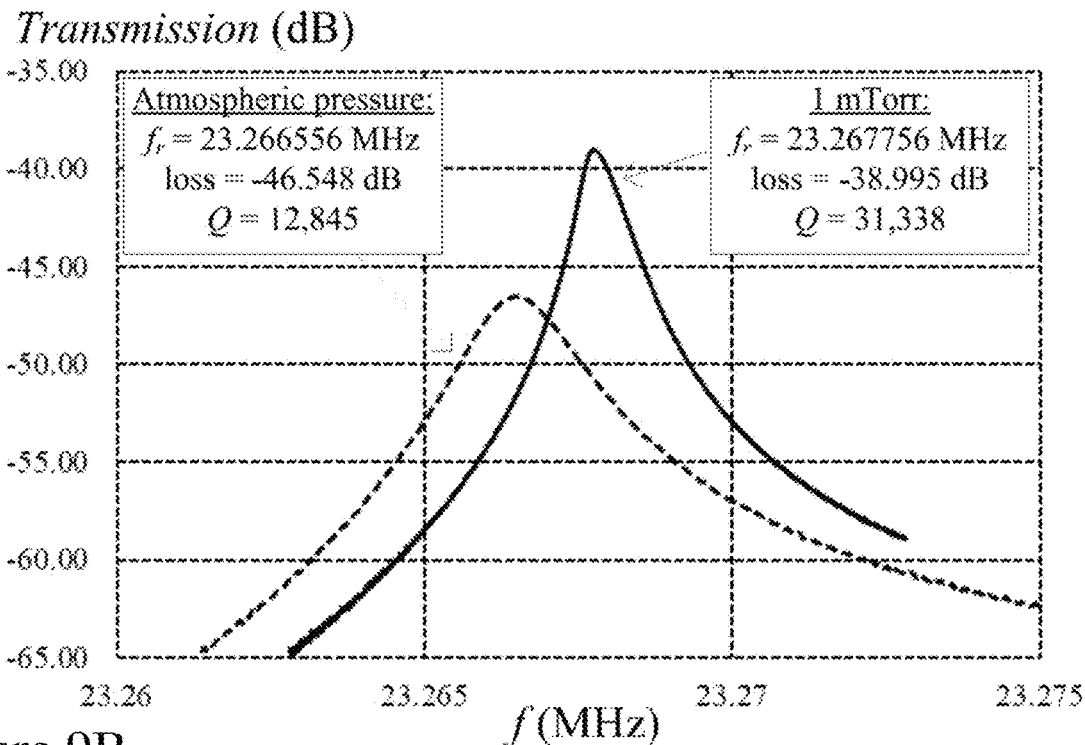

The dies of the tested devices were directly wire bonded onto a gold-plated PCB. This direct bonding approach was preferred to packaging in order to avoid added parasitics. The resonance characteristics of the devices were measured using the differential test setup shown in FIG. 8, both at atmospheric pressure and in ~1 mTorr vacuum. Referring to FIGS. 9A and 9B there are depicted the measured resonance characteristics for the MEMS resonator according to an embodiment of the invention at atmospheric pressure and in vacuum for before post-processing and after post-process support thinning respectively.

Accordingly, before post-processing the MEMS resonator exhibits a resonance frequency, $f_0$, of ~20.89 MHz and quality factor, Q, of ~6,830 and ~10,320 under atmospheric and 1 mTorr vacuum levels, respectively. After post-processing the resonance frequency is increased to ~23.27 MHz, which is in good agreement with the FEM simulation results, and the quality factor is now increased to ~12,850 and ~31,340 under atmospheric and 1 mTorr vacuum levels, respectively. This illustrates a factor of ~3× increase in the quality factor as a result of the post-process support narrowing, which is in good agreement with the simulation results presented in Section A3.

Figure 10A:
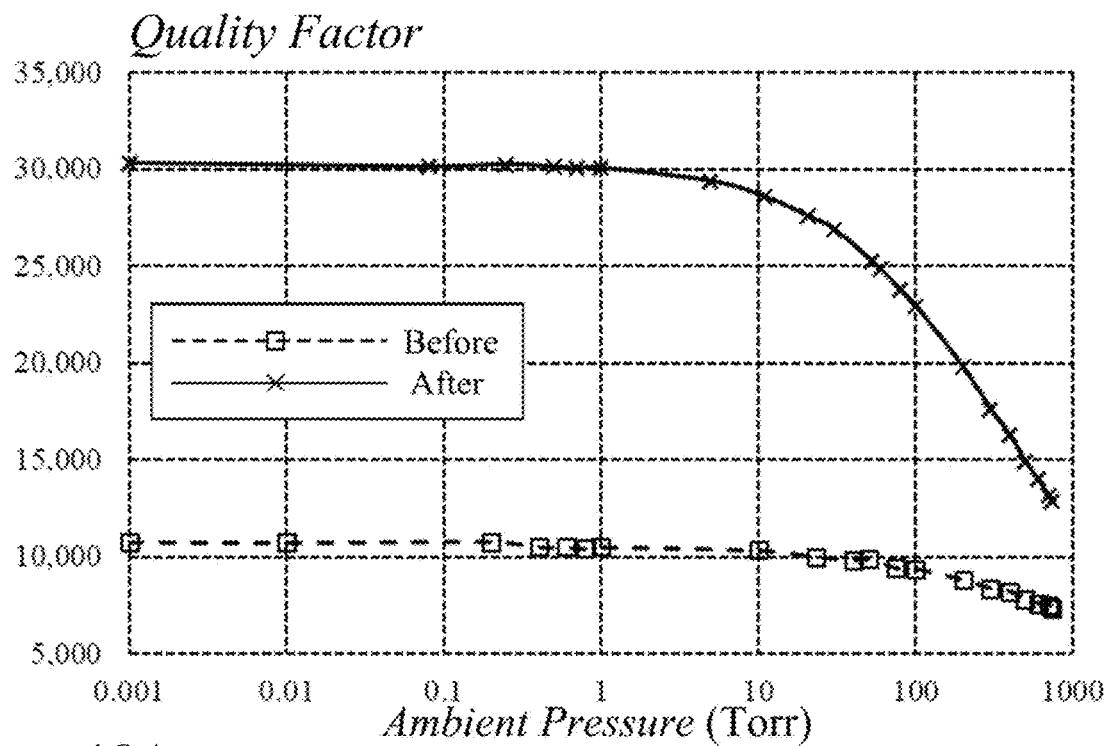
FIGS. 10A and 10B depict the measured resonance quality factor and resonator motional resistance versus ambient pressure for a MEMS resonator according to an embodiment of the invention before and after post-process support thinning respectively.
Figure 10B:
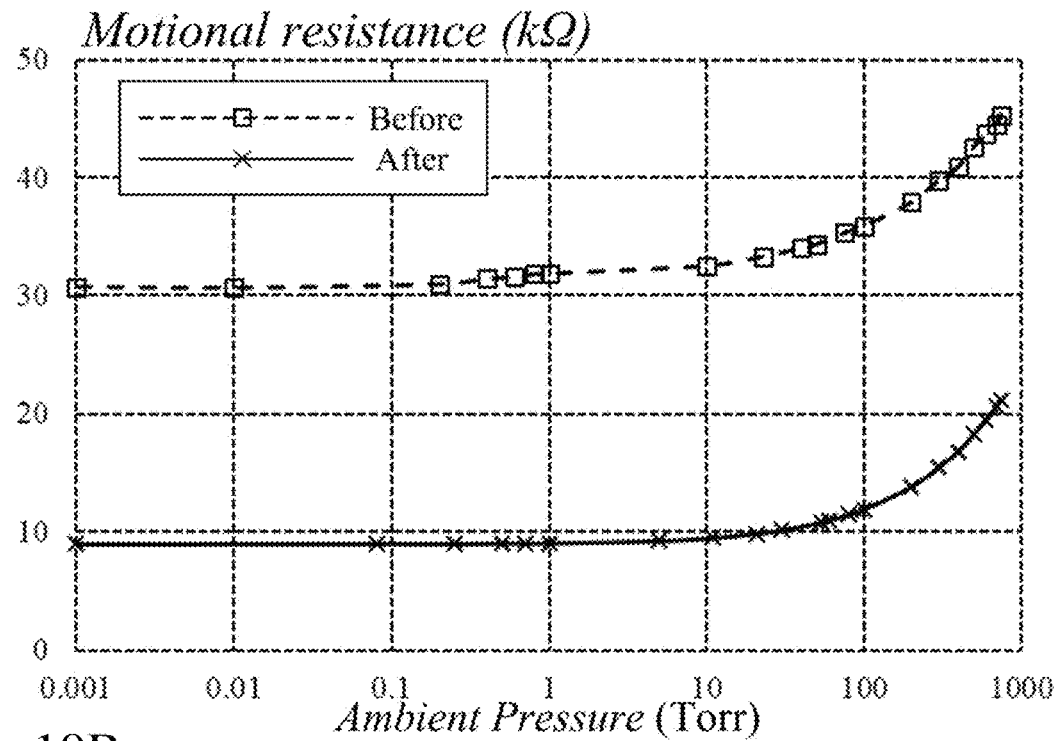

The quality factor was extracted directly from the 3-dB bandwidth in the device transmission curves. It is worth mentioning that the frequency is increased after post-processing due to the 10 μm reduction of the disk diameter as a result of the masking aluminum nitride inclusion within the silicon disk structure required by the design rules of the technology. The post-processed resonator exhibits a transmission of ~46.5 dB (i.e., an insertion loss of 46.5 dB) at atmospheric pressure, which corresponds to a motional resistance of ~21 kΩ, while it exhibits a transmission of −39 dB (i.e., an insertion loss of 39 dB) under a 1 mTorr vacuum level, which corresponds to a motional resistance of ~8.8 kΩ. FIG. 10 illustrates the effect of the ambient pressure level on the resonance quality factor and motional resistance, deduced from the device transmission curve based on Equation (A4) where $Z_O$ is the measurement characteristic impedance (50Ω here) and $T_{MAX}$ is the transmission at resonance.

$$R_x = 2Z_O \cdot \left( \frac{1}{T_{MAX}} - 1 \right) \quad (A4)$$

The post-process narrowing of the supports results in more than a factor of three improvement compared to original devices without post-processing. Because of the bulk-mode nature of the resonator, air damping has relatively little impact on the device performance, as the quality factor varies only by a factor of ~2.4 over the full range of the studied pressures.

The quality factor approaches its maximum (within 5%) at pressures below 10 Torr. It is to be noted that the reduction of anchor losses is apparent through the stronger dependence of the quality factor of the post-processed devices on ambient pressure (2.4× increase vs 1.5× increase), indicating that air damping is a more significant loss mechanism in the post-processed structures, as a result of the mitigated anchor losses.

Referring to Table A4 there are compared devices according to an embodiment of the invention implemented via post-processing a low-cost commercial MEMS foundry processed device to other state-of-the-art resonators combining bulk-mode resonance and piezoelectric actuation. A few prior art piezoelectric and capacitive bulk-mode devices are also included with Table A4 to highlight the advantages of the design according to embodiments of the invention. The inventive resonator devices achieve the highest quality factor among comparable bulk-mode devices with piezoelectric actuation, which is very close to the quality factor achieved with capacitive devices, and achieve a relatively low motional resistance as well. Importantly, the resonators according to embodiments of the invention no DC voltage for operation which is a key advantage over electrostatic devices. The motional resistances of piezoelectric devices are lower than their capacitive counterparts due to the higher transduction efficiency of piezoelectric transduction.

mance resonators, and can ultimately result in MEMS-based oscillators that do not require any high voltage biasing circuit, can operate with lower gain sustaining amplifiers, and yield better close-in phase noise performance, because

TABLE A4

Comparison Between the Resonator Proposed in this Work and State-of-the-Art

| | Act. Type | Mode | Freq. (MHz) | Quality Factor | Trans. (dB) | $R_x^*$ ($\Omega$) | $V_{DC}$ (V) |
|---|---|---|---|---|---|---|---|
| 1 | Piezo. | Contour | 271 | 2100 | | 188 | |
| 2 | Piezo. | Lateral | 527.4 | 1780 | | 110 | |
| 3 | Cap. | Wine-Glass | 210 | 7700 (200 µTorr) | | 9.16k | 15 |
| | | | 1520 | 3,000 200 µTorr) | | 791.6k | 5 |
| 4 | Cap. | 2ary Elliptic | 1.5 | 33,000 (10 mTorr) | −50 | 31.5k | 50 |
| 5 | Cap. | Lamé | 17.93 | 871,000 (100 mTorr) | −57.5 | 7.5k | 100 |
| | | | | 42,000 (atm.) | −85 | 1.8M | |
| 6 | Cap./Piezo. | Wine-Glass | 51 | 1 µm Wide Supports | | | — |
| | | | | 12,748 | −34 | 4.9k | |
| | | | | 2 µm Wide Supports | | | |
| | | | | 7,076 | −40 | 9.9k | |
| 7 | Cap./Piezo. | Radial | 300 | 250 nm Gap and 1.2 µm Anchor | | | — |
| | | | | 8,800 (vacuum) | −40 | 9.9k | |
| | | | | 120 nm Gap and 1.8 µm Anchor | | | |
| | | | | 6,600 (vacuum) | −30 | 3.01k | |
| 8 | Piezo. | Lamé | 36.23 | 30,700 (100 µTorr) | −66 | 199.4k | — |
| 9 | Piezo. | Wine-Glass | 14.63 | 4,894 (≤100 mTorr) | −22 | 1.2k | — |
| | | | | 1,952 (atm.) | | | |
| 10 | Piezo. (This Work) | Wine-Glass | 20.89 23.27 | Before Post-Processing | | | — |
| | | | | 10,319 (1 mTorr) | −50.4 | 33k | |
| | | | | 6,834 (atm.) | −53.4 | 47k | |
| | | | | After Post-Processing | | | |
| | | | | 31,338 (1 mTorr) | −39 | 8.8k | |
| | | | | 12,845 (atm.) | −46.5 | 21k | |

Notes:
1. AlN contour mode resonators.
2. Lithium-Niobate (LiNbO3) piezoelectric resonators.
3. Poly-Si wine-glass mode ring resonators with 63-85 nm capacitive gaps and 1.6 µm wide anchor beams.
4. Dodecagon disk gyro with combs utilizing a Si structural layer.
5. Capacitive Lamé bulk mode square resonators fabricated in a novel SOI technology, and anchored using either corner supports or a central support.
6. AlN disk resonators with capacitive-piezoelectric actuation/sensing electrodes above/below the structure with 260 nm gap and anchor beams of 1-2 µm width.
7. AlN capacitive-piezoelectric disk resonators with ON/OFF switching capability utilizing capacitive electrodes above/below the structure with 120-250 nm gap and center anchors.
8. Lamé mode resonator with piezoelectric actuation.
9. Si wine-glass disk resonators using piezoelectric actuation/sensing, electrostatic frequency tuning, and anchor beams of 10 µm width.
10. Piezoelectric wine-glass disk resonators employing in-house post-processing to narrow down the support beams to 4 µm.

This work demonstrates inventive resonators exploiting a wine-glass bulk mode disk resonator utilizing a transverse piezoelectric actuation technique to drive the single crystalline silicon disk structure in bulk mode resonance in order to offer a desirable combination of high quality factor, frequency, and low motional resistance without requiring any DC voltage for operation. The length of the resonator supports was optimized to reduce anchor losses and increase the quality factor. Devices were fabricated in a commercial MEMS technology and post-processed in-house to narrow down the anchor beam supports and consequently reduce the anchor losses, allowing for a better quality factor and lower resulting motional resistance. This post-processing methodology allows for overcoming some of the limitations imposed by the fabrication technology and results in a factor of ~3 increase in the quality factor and same order decrease in the motional resistance. Post-processed resonators were measured to have resonance frequencies of ~23 MHz and quality factors of ~13,000 in atmospheric pressure, increasing to ~31,000 in 1 mTorr vacuum. The devices also demonstrate motional resistances of ~21 kΩ in atmospheric pressure, reducing to ~8.8 kΩ in 1 mTorr vacuum. This post-processing technique hence allows for higher perfor- of the increased quality factor and reduced motional resistance of the resonator.

B: Silicon Lamé Mode Resonators with Dual Wafer SOI Technology

A1. Introduction

Interest in MEMS resonators for timing applications is increasing, as their phase noise performance is improving due to the higher performance of the MEMS resonator and the sustaining circuitry. Moreover, the power consumption of the MEMS resonator-based oscillators is decreasing to compete with quartz oscillators, ranging from the mW range down to the µW range, depending on the oscillator's frequency and sustaining circuit design. Bulk-mode devices typically exhibit high stiffness, and are consequently less prone to thermoelastic damping, compared to flexural devices, allowing them to achieve large quality factors (>10,000), even under atmospheric pressure. Within the prior art surface micromachined capacitive bulk-mode resonators exhibiting quality factors of 2,000-150,000 and frequencies as high as 1.52 GHz have been reported. Further, actuation and sensing of a surface micromachined bulk-mode disk resonator made of AlN exploiting a combination of piezoelectric and capacitive methods has also been reported where the device resonates at 51 MHz with quality factor of ~13,000. Also, within the prior art a radial mode AlN resonator operating at 300 MHz with quality factor of 8,800 has been presented employing a capacitive-piezoelectric actuation scheme using metal electrodes above and beneath the disk structure. The electrostatic electrodes beneath the disk structure are also used to pull it down to the substrate and consequently power the resonator off upon the application of a switching DC voltage. Alternatively, a wine glass bulk mode disk resonator with piezoelectric actuation fabricated in a commercial SOI technology has been reported operating at a frequency of ~15 MHz and a quality factor as high as ~5,000 as have piezoelectric actuated Lamé mode resonators utilizing oxide refilled trenches for temperature compensation are presented. Resonance frequencies of ~36 MHz and quality factors of ~30,700 are reported. All the previously mentioned resonators utilize mainly two different anchoring schemes for the released movable structures. The first is support beams attached to the nodal points of the structure mode shape and the second is a central anchor in the center nodal point. Both schemes achieve quality factors in the same range. However, the support beam approach is not suitable for creating bulk mode gyroscopes because this type of device utilizes two resonance modes, where the nodes of one mode coincide with the antinodes of the other. Therefore, the circumference of the structure needs to be free, without any anchoring points, so as to allow for free motion in both modes. Piezoelectric cross-sectional Lamé mode resonators with frequencies as high as 1.02 GHz and quality factors of ~600 have been reported. It is worth mentioning that the quality factor in these prior art structures is mostly limited by several factors including structure thickness, anchor loss, and damping losses resulting from materials added to the main structural materials. Within the prior art, bulk mode resonators including Lamé mode and wine glass mode devices with quality factors in the $10^6$ range have been presented. Such high quality factors are achievable as a result of superior structural material, single crystalline silicon, which is formed into a pure bulk resonating structure, without the need for release holes, and also due to the reduced anchor losses resulting from the narrow anchoring beams. Also, within the prior art are a wine-glass disk resonator with movable electrodes to reduce the transduction gap whilst microfluidic channels have also been combined with a Lamé mode resonator for real-time mass sensing in liquids.

According to the embodiments of the invention Lamé bulk mode square resonators have been fabricated using a novel silicon-on-insulator technology, MicraGEM-Si™ from Micralyne™. These structures are implemented by patterning two wafers with different etched depths and wafer bonding them to create the released movable structures. Within embodiments of the invention two anchoring architectures have been evaluated, one with suspension beams at the nodal corner points, and the other with a central anchoring support. Devices with different support dimensions are fabricated and characterized to evaluate the impact of support size on device performance. The center support architecture presented is also highly suitable for realizing high performance gyroscopes, without the need for release holes or wide center supports, which are probably creating limitations on their quality factors. It would be evident that for this application, the resonating geometry will have to be tailored to support the desired modes for gyroscope operation.

B2. Design

Referring to FIGS. 11A to 11D there are depicted exploded and assembled 3D renditions of the resonator structure with the two proposed anchoring designs, wherein FIG. 11A is exploded view of MEMS resonators according to an embodiment of the invention with corner supports;

FIG. 11B is an assembled view for a MEMS resonator according to an embodiment of the invention with corner supports;

FIG. 11C is exploded view of MEMS resonators according to an embodiment of the invention with central support; and FIG. 11D is an assembled view for a MEMS resonator according to an embodiment of the invention with central support.

Embodiments of the invention are realized through the processing and wafer bonding of two SOI wafers (i.e., the top wafer and the bottom wafer). The top wafer has its handling layer removed after bonding to the bottom wafer such that the resonator is mainly composed of a single-crystalline silicon central square suspended structure acting as the Lamé bulk mode resonator. Within the prototypes manufactured this suspended square is 30 μm thick, has a 230 μm side length, and is formed in the device layer of the top SOI wafer. The Lamé mode resonance frequency can be calculated to be 17.9 MHz from [Equation (B1) below where L is the resonator side length, G and p are the equivalent shear modulus and density of the material, respectively. Two anchoring designs are proposed, wherein one design features corner suspension beams, placed at the nodal points of the resonance mode, as shown in FIG. 11A. The length of the beams ($L_S$) is designed according to Equation (B2) where $w_S$ is the support width, $f_0$ is the resonance frequency, E and p are the Young's modulus and density of the single-crystalline structural material used, respectively, and A, can be approximated by Equation (B3) so that so that the support beams resonate at the same frequency as the main suspended structure. This allows the square to vibrate unimpeded and consequently minimizes the associated anchor losses.

$$f_r = \frac{1}{\sqrt{2}L}\sqrt{\frac{G}{\rho}} \tag{B1}$$

$$L_S = \sqrt{\frac{\lambda_i^2 w_S}{4\pi\sqrt{3}\,f_o}}\sqrt{\frac{E}{\rho}} \tag{B2}$$

$$\lambda_i = (4i+1)\frac{\pi}{4}, \quad i=1,2,\ldots \tag{B3}$$

Pads for electrical connection to the central square are present in the end of each suspension beam. This allows for connecting the DC polarization voltage required for the electrostatic actuation of the device. These support beams are patterned in the device layer of the top SOI wafer. The second design utilizes a central square support to anchor the square resonator structure to the substrate. In this case, electrical connection to the resonating structure is routed through an underlying silicon interconnect formed in the device layer of the bottom SOI wafer, as illustrated in FIG. 11C. Several suspension beam widths and square support side lengths were fabricated in order to study their impact on device performance, as will be presented in Section B4.

In both designs, the central structure is surrounded by four electrodes utilized for capacitive actuation and sensing of the structure. The electrodes are formed in the device layer of the top SoI wafer and are separated from the central square by a 2 µm capacitive transduction gap, which is the minimum spacing allowed by the technology. The device layer of the bottom SOI wafer is patterned to form the electrode anchors, the anchors at the end of the suspension beams in the case of corner supported resonators, as well as the central support and interconnect in the case of the centrally supported resonators. Table B1 summarizes the design parameters and targeted resonant frequency of the resonator devices fabricated to demonstrate embodiments of t the invention.

TABLE B1

Summary of Resonator Device Design Parameters

| Parameter | Value |
|---|---|
| Square side length (µm) | 230 |
| Structure thickness (µm) | 30 |
| Capacitive gap (µm) | 2 |
| Resonance frequency (MHz) | ~17.9 |

Figure 12:
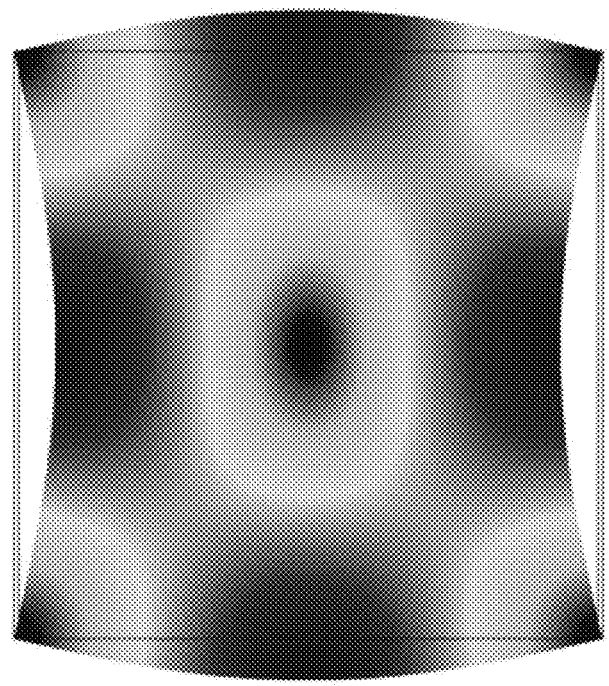
FIG. 12 depicts an FEM simulation illustrating the resonator Lamé mode shape.

Finite-element-methods (FEM) simulation illustrating the mode-shape of the resonator in the Lamé mode is depicted in FIG. 12, showing the corner and central nodal points. The resonance frequency of the structure is simulated to be of 17.9 MHz, as predicted theoretically by Equation (B1).

B3. Fabrication Process

The resonators in this work were fabricated in the Micra-GEM-Si™ technology from Micralyne™. The fabrication process sequence is depicted schematically in FIGS. 13A to 13F respectively. The process begins with two SOI wafers, a top wafer with 30 µm device layer thickness and a bottom wafer with 50 µm device layer thickness.

Figure 13A:
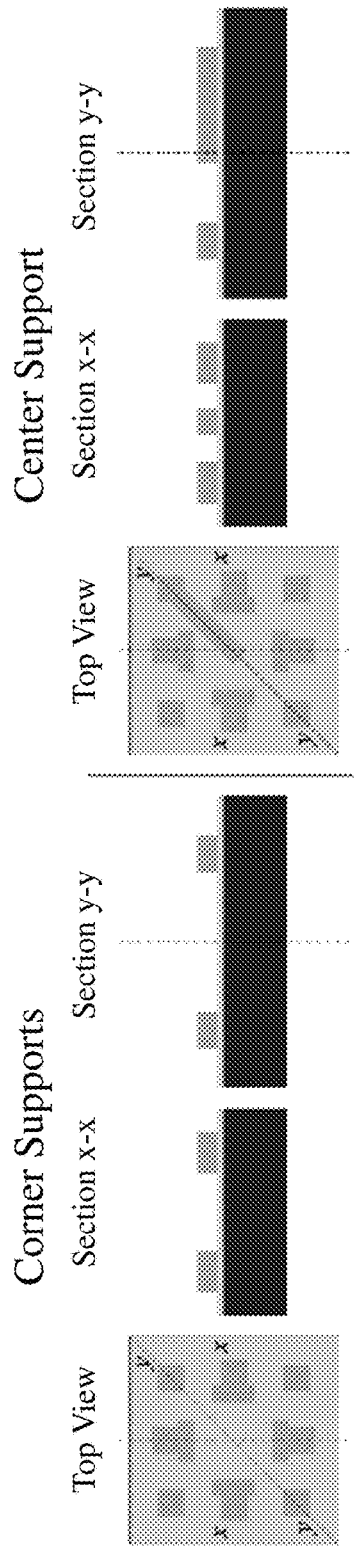
Figure 13B:
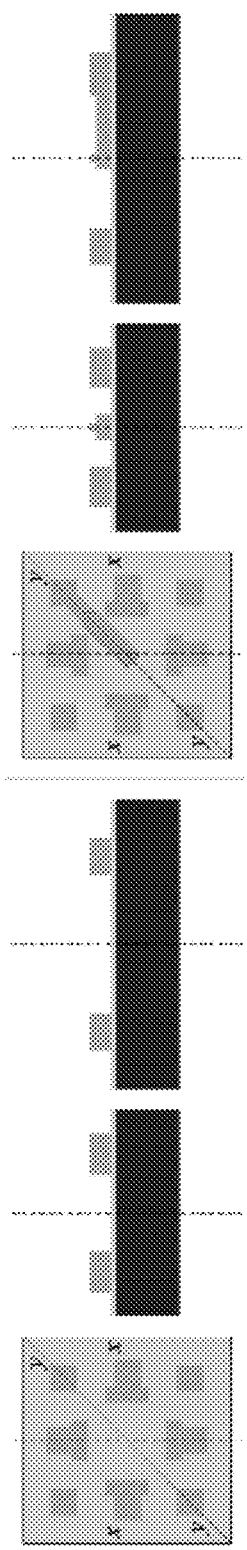
Figure 13C:
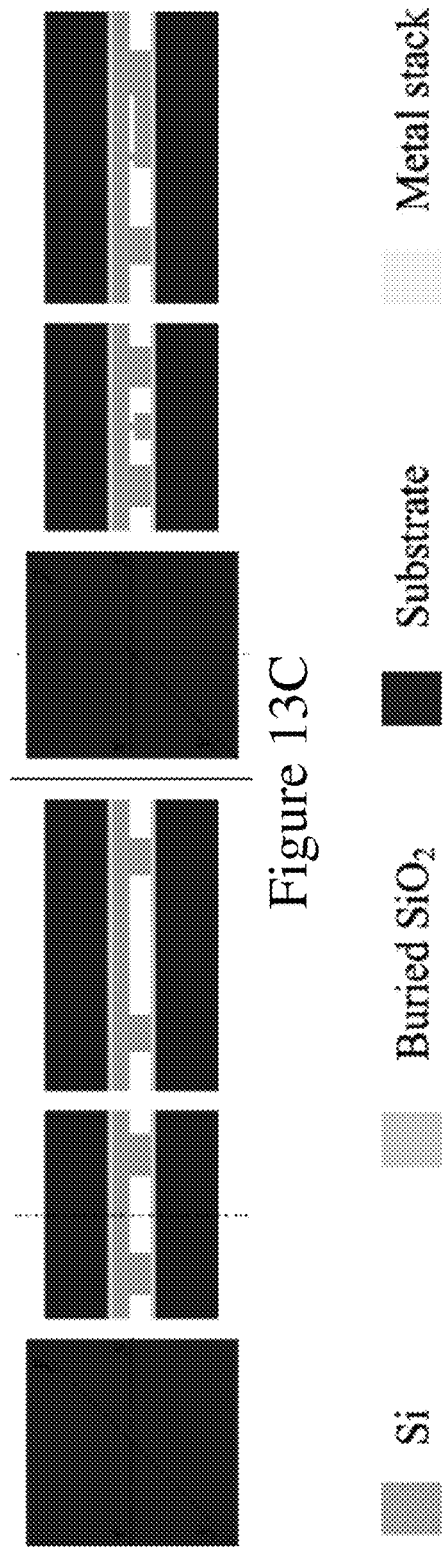

The buried oxide for both wafers is 1 µm thick. The device layer of the bottom wafer is patterned and etched using deep reactive ion etching (DRIE) stopping on the buried oxide layer isolating the electrical interconnects and forming the anchors for the resonator structure as well as the electrode anchors, as shown in FIG. 13A. The remaining parts are then patterned and partially DRIE etched up to a depth of 10 µm to create the interconnect and the square support for the center support design, as illustrated on the right side of FIG. 13B. Afterwards, the top SOI wafer is flipped and bonded to the bottom wafer, as shown in FIG. 13C. The handle and buried oxide layers of the top wafer are then etched away leaving the device layer bonded on top of the patterned bottom wafer, as illustrated in FIG. 13D. A metal stack composed of 10 nm of titanium-tungsten and 75 nm of gold is subsequently deposited and wet patterned forming the electrical pads, as shown in FIG. 13E. Finally, the top device layer is patterned and DRIE etched forming the resonator structure, the pad anchors, as well as the supporting beams for the corner support design, leaving the released resonator structures, as illustrated in FIG. 13F. The chips are then diced using a laser without any wet-processing to prevent damaging the released structures.

Figure 14A:
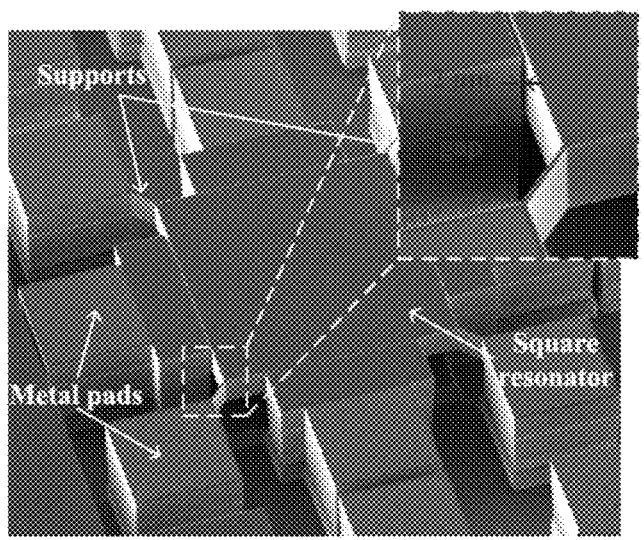
FIGS. 14A and 14B depict SEM micrographs of fabricated resonators according to embodiments of the invention with corner supports and center support respectively.
Figure 14B:
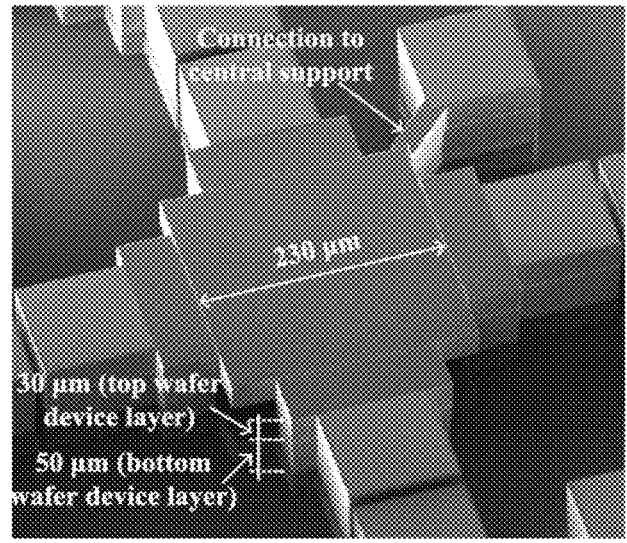
Figure 14C:
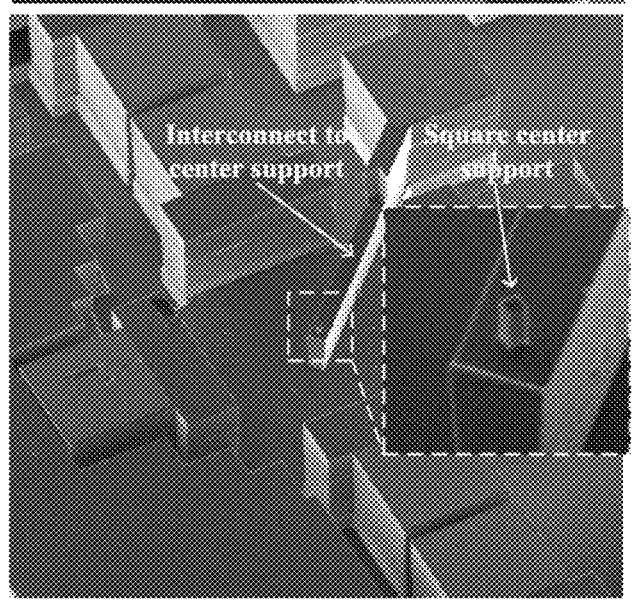
FIG. 14C depicts an SEM micrograph of one of the center support MEMS resonators according to an embodiment of the invention after mechanically removing the resonator square structure to illustrate the square center stem support and interconnect.

FIGS. 14A and 14B depict SEM micrographs for two of the fabricated resonator devices according to embodiments of the invention, one with corner supports and the other with center support, whilst FIG. 14C depicts an SEM micrograph of one of the center support devices after purposefully removing the resonator square structure in order to expose the underlying square center stem support and interconnect.

B4. Measurement Results

Figure 16A:
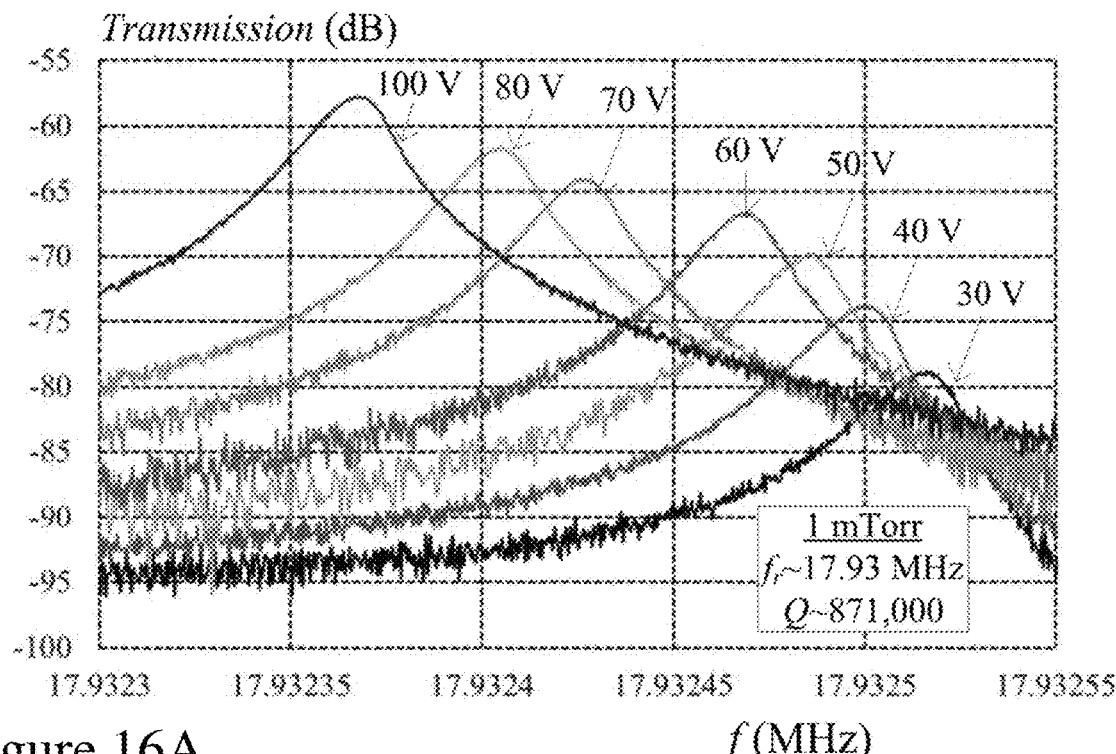
FIGS. 16A and 16B depicted measured resonance characteristics under vacuum for resonators according to embodiments of the invention with 2 µm-wide corner supports and center support of 7 µm square side length respectively.
Figure 16B:
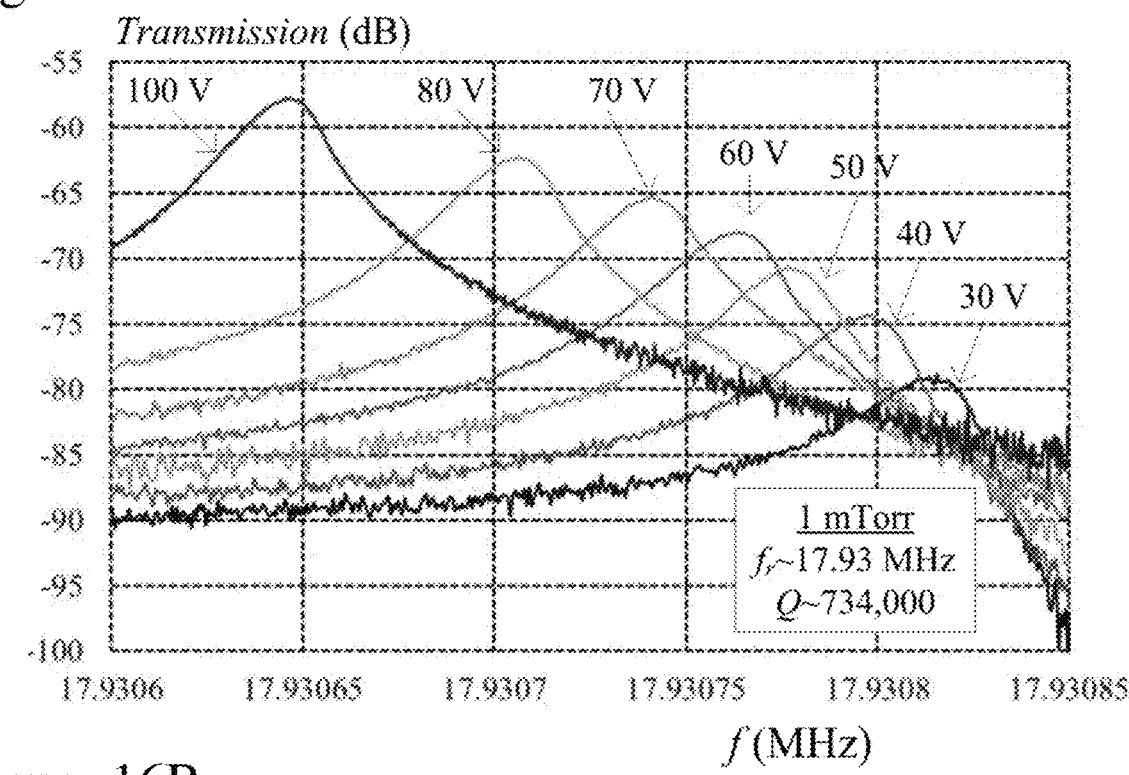
Figure 17:
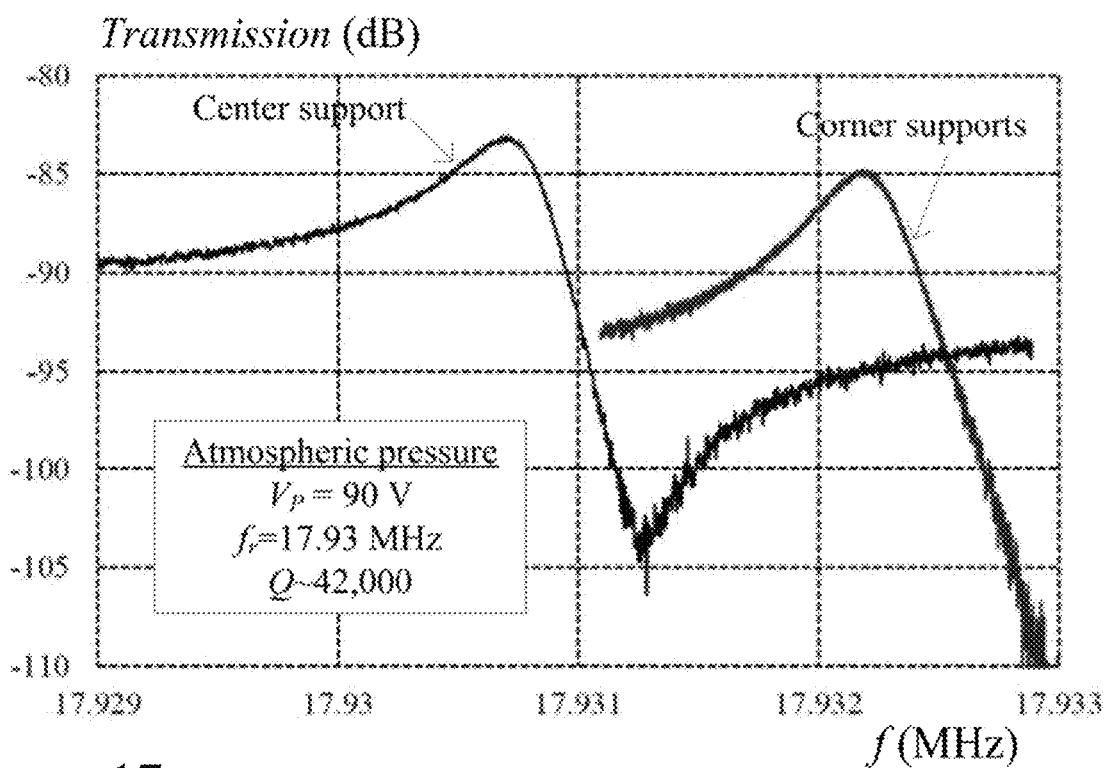
FIG. 17 depicts measured resonance characteristics at atmospheric pressure for resonators according to embodiments of the invention with 2 µm-wide corner supports and center support of 7 µm square side length respectively.
Figure 18:
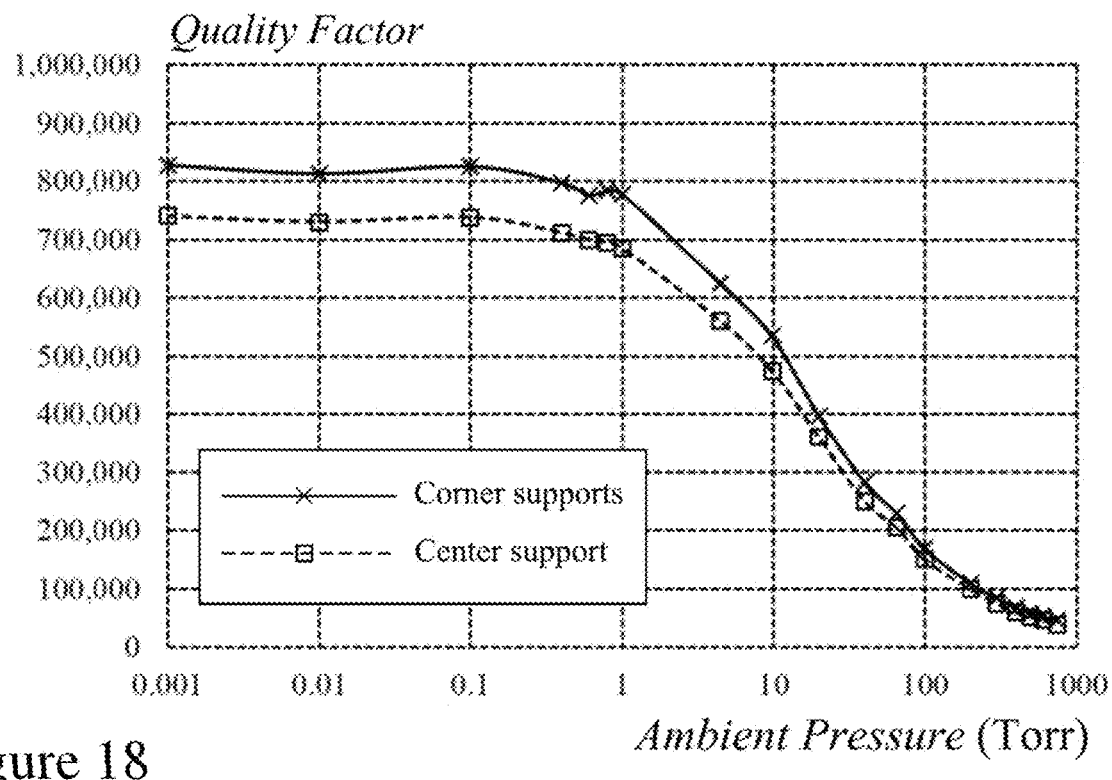
FIG. 18 depicts resonator quality factor versus ambient pressure for resonators according to embodiments of the invention with 2 µm-wide corner supports and center support of 7 µm square side length respectively.

The structure was intentionally designed with four independent signal electrodes to enable its use within both single-ended and differential configurations, making it possible to directly connect to different amplifier types without the need for extra components or converters such as baluns. The dies of the tested devices were wire bonded directly onto a gold-plated PCB. This direct bonding approach was preferred to packaging in order to avoid added parasitics. The resonance characteristics of the devices were measured using the differential test setup shown in FIG. 15, both at atmospheric pressure and in ~1 mTorr vacuum. Measurement results for corner support devices with 2 µm-wide supports are shown in FIG. 16A, while FIG. 16B shows the measured frequency response of devices with center support of 7 µm square side length, both under 1 mTorr vacuum and with different biasing voltages. The responses of both device types in atmospheric pressure are illustrated in FIG. 17. The devices exhibit a resonance frequency, $f_r$, of ~17.93 MHz, which is in very good agreement with theoretical values and FEM simulation results. In vacuum, corner support devices with 2 µm wide corner supports exhibit a quality factor, Q, of ~871,000, while center support devices with 7 µm side length support exhibit a quality factor of ~734,000. Under atmospheric pressure, both types of devices exhibit a quality factor of ~42,000, which is to the inventors' knowledge is the highest reported to date for atmospheric pressure operation. The quality factor was extracted directly from the 3-dB bandwidth in the device transmission curves. FIG. 18 illustrates the effect of the ambient pressure level on the resonance quality factor for both resonator types. The quality factor approaches its maximum at pressures below 100 mTorr.

Figure 19:
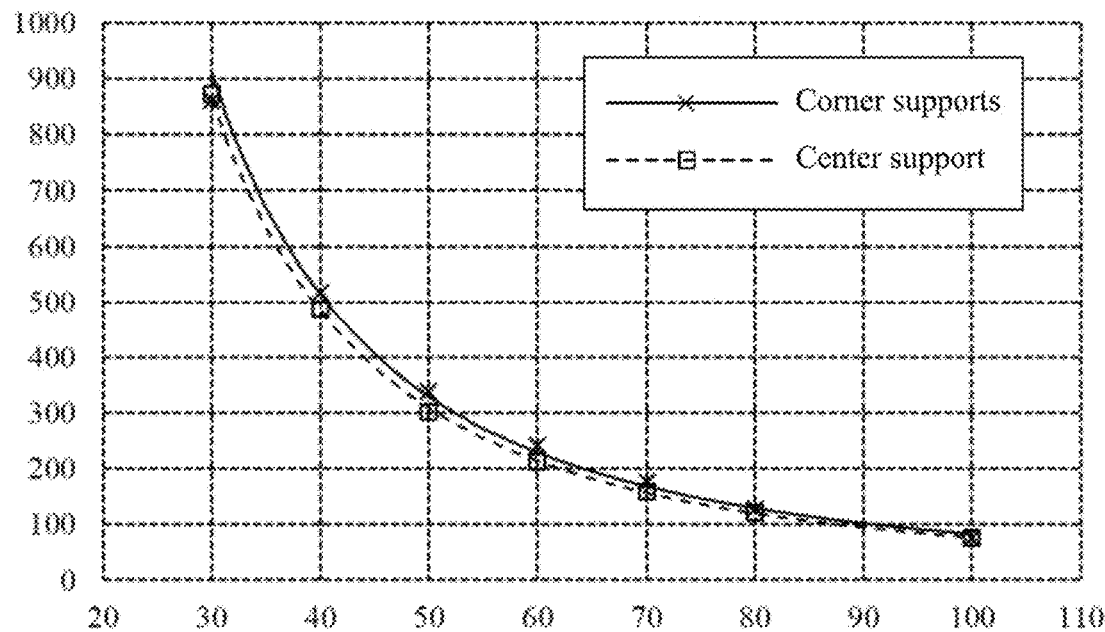
FIG. 19 depicts resonator motional resistance versus applied polarization DC voltage for resonators according to embodiments of the invention with 2 µm-wide corner supports and center support of 7 µm square side length respectively.

The motional resistance, $R_x$, of a resonator is given by Equation (B4) where $T_{max}$ is the signal transmission of the resonator (on a linear scale) at resonance and $Z_0$ is the characteristic impedance (50Ω in the case presented here). The effect of the applied DC polarization voltage, $V_P$, on the motional resistance for both resonator types is illustrated in FIG. 19. The measured motional resistance to voltage curve is very close to the ideal inverse squared proportionality as given by Equation (B5).

$$R_x = 2Z_0\left(\frac{1}{T_{MAX}} - 1\right) \quad (B4)$$

$$R_x \propto \frac{1}{V_P^2} \quad (B5)$$

The devices exhibit a motional resistance of ~850 kΩ at 30 V, and of ~75 kΩ at 100 V. Resonators with different support dimensions were fabricated as discussed supra.

Table B2 illustrates the effect of the support design on the resonance quality factor in vacuum. Devices with corner supports of 2 and 3 µm width, and devices with center supports of 5, 6, and 7 µm width were fabricated. It is worth mentioning that the 5 µm support devices did not survive the fabrication process, which can indicate that this dimension was too small to achieve effective wafer bonding between the bottom and top wafers. The 6 µm support devices exhibited a higher yield and the 7 µm devices survived in all the fabricated dies. Center support devices exhibit quality factors ~15% lower than corner support ones. All characterized devices with corner supports achieve quality factor within the same range suggesting that the performance of this type of devices is not limited by anchor loss. However, center support devices with 6 µm supports exhibit slightly higher quality factor than the 7 µm ones illustrating room for improvement with smaller supports.

TABLE B2

Effect of Anchor Type on Resonator Quality Factor

| Anchor Type | Dimensions (µm) | Quality Factor (1 mTorr vacuum) |
|---|---|---|
| Corner | 2 | 870,880 |
|  | 3 | 871,170 |
| Center | 6 | 739,800 |
|  | 7 | 734,280 |

Table B3 compares the device proposed here to other state-of-the-art bulk-mode resonators. The proposed resonator achieves superior quality factor in atmospheric pressure, reducing the need for vacuum packaging in some applications. It also exhibits relatively high resonance frequency, and has one of the highest f·Q products. The center support architecture presented is also highly suitable for realizing high performance gyroscopes, without the need for release holes, or for wide center supports, which could improve the achieved quality factors in such designs.

TABLE B3

Comparison Between Resonators according to Embodiments of the Invention and State-of-the-Art

|  | Type | Mode | Freq. (MHz) | Q | f · Q |
|---|---|---|---|---|---|
| 1 | Cap. | Wine-Glass | 210 | 7,700 (200 µTorr) | $1.62 \times 10^{12}$ |
|  |  |  | 1520 | 3,000 (200 µTorr) | $4.56 \times 10^{12}$ |
| 2 | Cap./Piezo. | Wine-Glass | 51 | 12,748 | $6.5 \times 10^{11}$ |
| 3 | Cap./Piezo. | Radial | 300 | 8,800 (vacuum) | $2.64 \times 10^{12}$ |
| 4 | Piezo. | Wine-Glass | 14.63 | 4,894 (≤100 mTorr) | $7.16 \times 10^{10}$ |
|  |  |  |  | 1,952 (atm.) | $2.86 \times 10^{10}$ |
| 5 | Piezo. | Lamé | 36.23 | 30,700 | $1.11 \times 10^{12}$ |
| 6 | Cap. | $1^{st}$ elliptic | 2.9 | 66,000 (1 mTorr) | $1.91 \times 10^{11}$ |
|  |  | $2^{nd}$ elliptic | 5.9 | 100,000 (1 mTorr) | $5.9 \times 10^{11}$ |
| 7 | Cap. | $2^{nd}$ elliptic | 1.5 | 33,000 (10 mTorr) | $4.95 \times 10^{10}$ |
| 8 | Cap. | Lamé | 1020 | 600 | $6.12 \times 10^{11}$ |
| 9 | Cap. | Lamé | 6.35 | 1.6M (36 µTorr) | $1.02 \times 10^{13}$ |
|  |  |  |  | 5,100 (atm.) | $3.24 \times 10^{10}$ |
| 10 | Cap. | Wine-Glass | 5.43 | 1.9M (10 mTorr) | $1.03 \times 10^{13}$ |
|  |  |  |  | 10,000 (atm.) | $5.43 \times 10^{10}$ |
| 11 | Cap. | Lamé | 12.9 | 1.2M (vacuum) | $1.55 \times 10^{13}$ |
| 12 | Cap./Piezo. | Lamé | 12.9 | 930,000 (<40 µTorr) | $1.2 \times 10^{13}$ |
| 13 | Cap. | Lamé | 6.89 | 3.24M (10 mTorr) | $2.23 \times 10^{13}$ |
| 14 | Cap. | Wine-Glass | 9.45 | 27,200 (0.01 mTorr) | $2.57 \times 10^{11}$ |
| 15 | Cap. | Lamé | 78 | 4,300 | $3.3 \times 10^{11}$ |
| 16 | Cap. | Lamé | 17.93 | Corner Supports | |
|  |  |  |  | 871,000 (<100 mTorr) | $1.56 \times 10^{13}$ |
|  |  |  |  | 42,000 (atm.) | $7.53 \times 10^{11}$ |
|  |  |  |  | Central Support | |
|  |  |  |  | 740,000 (<100 mTorr) | $1.332 \times 10^{13}$ |
|  |  |  |  | 42,000 (atm.) | $7.53 \times 10^{11}$ |

Notes:
1 Poly-Si wine-glass mode ring resonators with 63-85 nm capacitive gaps and 1.6 µm wide anchor beams.
2 AlN disk resonators with capacitive-piezoelectric actuation/sensing electrodes above/below the structure with 260 nm gap and anchor beams of 1-2 µm width.
3 AlN capacitive-piezoelectric disk resonators with ON/OFF switching capability utilizing capacitive electrodes above/below the structure with 120-250 nm gap and center anchors.
4 Si wine-glass disk resonator using piezoelectric actuation/sensing, electrostatic frequency tuning, and anchor beams of 10 µm width.
5 Piezoelectric actuated Lamé mode resonator with corner supports and using oxide refilled islands for temperature compensation.
6 Bulk-mode disk gyroscopes in <111> and <100> single-crystalline Si with 180-250 nm capacitive gaps.
7 Dodecagon gyroscope with combs utilizing a Si structural layer.
8 Cross sectional Lamé mode resonators utilizing a coherent combination of the transverse and longitudinal piezoelectric coefficients to increase the electromechanical coupling.
9 Lamé mode square capacitive resonator with Si structural layer with 2 µm transduction gap.
10 Capacitive disk resonator with Si structural layer with 2 µm transduction gap.
11 Mechanically coupled capacitive Lamé' mode square resonator arrays with corner supports.
12 Piezoresistive sensing used to enhance the electromechanical coupling of a capacitive actuated Lamé mode square resonator.
13 Wafer-level encapsulated capacitive Lamé mode square resonator.
14 Si wine-glass disk resonator with movable electrodes utilized for gap reduction.
15 Lamé-mode resonator with an integrated fluidic channel for real-time mass sensing in liquids.
16 Capacitive Lamé bulk mode square resonators fabricated in a novel SOI technology, and anchored using either corner supports or a central support.

Accordingly, the Lamé bulk mode square resonators fabricated in a novel silicon-on-insulator technology, where structures are formed by patterning two SOI wafers with several etched depths and wafer bonding them to create the released movable resonator structures. Two distinct anchoring architectures, one with suspension beams at the nodal corner points, and the other with a central anchoring support have been demonstrated. The latter is also suitable for creating high performance bulk mode gyroscopes, without the need for release holes, or for wide center supports, both of which can limit the achieved quality factors. The effect of the support size on the resonance quality factor was studied experimentally. Fabricated devices were measured to operate at a resonance frequency of ~18 MHz and quality factors as high as ~42,000 in atmospheric pressure, which to the inventors' knowledge is the highest reported to date in such pressure, and ~871,000 in 100 mTorr vacuum. The resonators also exhibit a f·Q product of $1.56 \times 10^{13}$ in vacuum, which is one of the highest reported in the literature. Accordingly, the presented devices are well-suited to a wide-range of MEMS resonator applications such as timing, and can provide relatively high performance even in air, reducing the packaging costs. Moreover, the motional resistance can be substantially decreased if the fabrication technology minimal spacing can be further reduced or an alternative solution is established to reduce the capacitive gap size as the motional resistance is proportional to the fourth power of the gap.

C: Capacitive Lamé Resonator with Gap Closing Mechanism for Motional Resistance Reduction C1. Introduction As noted supra the motional resistance, R, is proportional to the fourth power of the gap, i.e. $R \propto g^4$. Within the prior art this has led to devices exploiting complex manufacturing sequences and/or high resolution lithography in order to achieve the desired features. However, within the prior art gap closing structures have been introduced as an alternative method for transduction gap reduction to overcome the fabrication technology limitations. These include a relatively complex gap closing and locking structure for which no experimental results were reported together with gap closing structures were employed in width extensional and wine-glass disk resonators. However, the gap closing structures suffered from break points which led to electrical contact between the electrodes and the resonator structure resulting in permanent failure.

In order to overcome these limitations, the inventors have established a novel gap closing methodology which is demonstrated in conjunction with a Lamé mode resonator. The gap closing mechanism relies upon the one effect MEMS designers normally seek to mitigate, namely the electrostatic pull-in between the resonator structure and the electrodes. Electrostatic MEMS based actuators form the basis of a wide variety of devices, including micromotors, microswitches, microrelays, microresonators, micromirrors, micropumps, microvalves, and microfilters. However, the electrostatic coupling as voltages increase and/or gaps reduce results in highly nonlinear dynamics, leading to a saddle-node bifurcation, called "pull-in". Pull-in instability is a crucial effect in electrostatically actuated MEMS and limits their travel ranges, for example. The instability has at its root the domain where the electrostatic force increases more rapidly than the spring force such that the "spring" is overcome, and a sprung portion of a MEMS device is drawn into contact with another portion of the MEMS and electrostatically "fixed" together.

However, in the embodiments of the invention the inventors exploit "pull-in" specifically to overcome the spring force but by exploiting stopper structures, which are added to the MEMS elements in order to avoid electrical contact between the electrodes (spring portion of MEMS device) and resonator structure (other portion of MEMS), and consequently ensure reliable operation. The minimum gap achievable using the novel structure is only limited by the mask grid size thereby allowing for realization of resonators with high quality factor and low loss bulk mode resonators without requiring excessive voltages or complex fabrication steps.

C2. Resonator Design

Figure 20A:
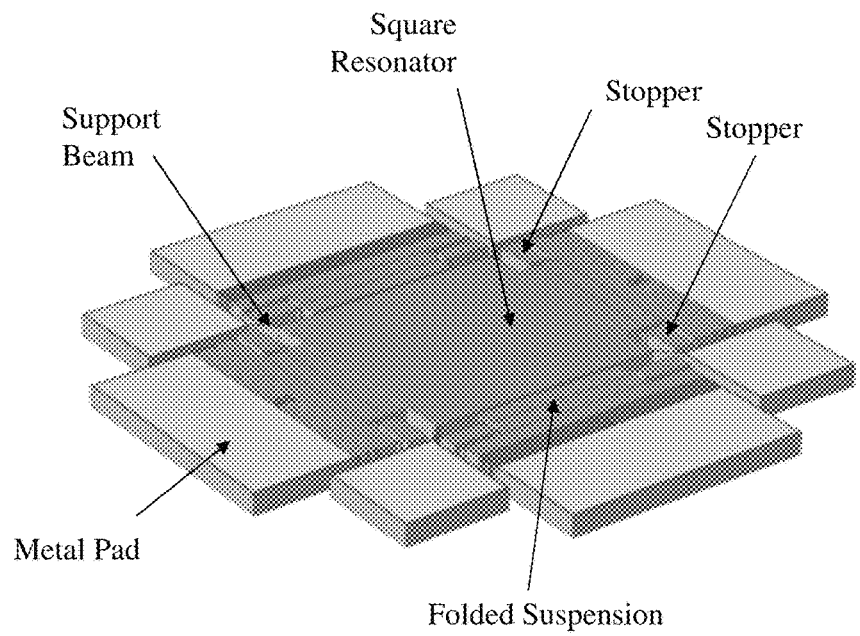
FIGS. 20A and 20B depict schematics of a Lamé mode resonator according to an embodiment of the invention with gap closing mechanism for motional resistance reduction.
Figure 20B:
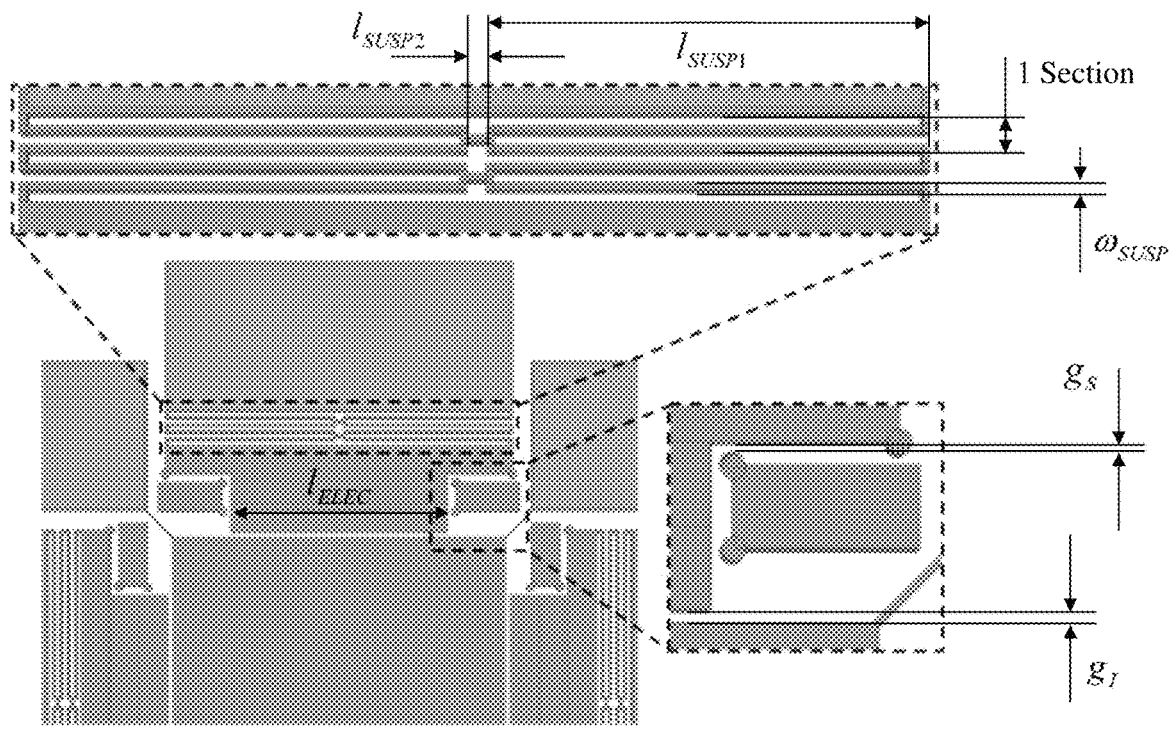

The resonator's employed within the prototype devices according to an embodiment of the invention are composed of a central square structure which is the main resonator structure. This square is anchored to the substrate through four support beams located at the corner nodal points. The resonator is surrounded by four electrodes as shown schematically in FIG. 20A. The resonator is separated from the electrodes by a capacitive gap ($g_I$). Each of the electrodes is composed of a movable shuttle which is anchored through a folded suspension. Stopper structures are added which are initially separated for the movable shuttle by a certain gap ($g_S$), 2 μm in the prototype devices. Dimples are added to the structure in a version of the design to avoid stiction and ensure reversible pull-in. No dimples were included within another version of the design to use stiction and surface forces to provide a stable pull-in position. No significant difference in the device behaviour was observed during measurements of both versions. FIG. 20B depicts a close-up schematic of one of the moveable electrodes with insets illustrating the folded suspension and stopper with the important design dimensions. As a DC voltage is applied to the resonator, the movable electrodes move towards the resonator as a result of the electrostatic force generated. When the voltage exceeds the pull-in voltage, the electrodes are pulled-in stopping on the stoppers resulting in a final gap ($g_F$) which is given by Equation (C1). This final gap is predominantly limited by the mask grid size of the fabrication technology used and gaps as low as 200 nm have been demonstrated by the inventors, the results of which are presented below.

Alternatively, welding may be used to realise permanent pull-in by locally fusing the silicon together as a result of the localized heating induced by current flowing through small contact regions. Optionally, both stiction and welding may be employed. Stiction (a contraction of static friction) within MEMS refers to where two surfaces with areas below the micrometer range come into close proximity, they may adhere together. At this scale, electrostatic and/or Van der Waals and hydrogen bonding forces become significant. Dimensions of the gap closing folded suspensions were optimized by simulation to ensure a reasonable gap closing voltage.

$$g_F = g_I - g_S \quad (C1)$$

Figure 21:
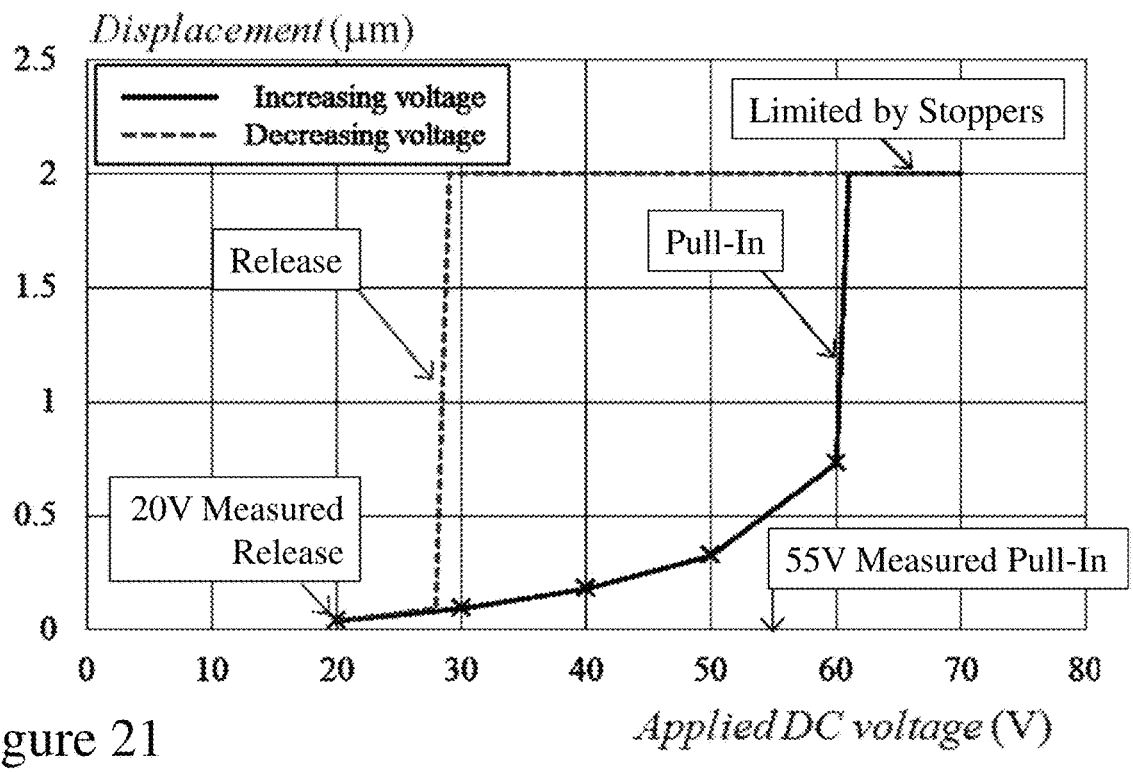
FIG. 21 depicts FEM simulation for electrode displacement versus DC voltage for a MEMS resonator according to an embodiment of the invention.

Referring to FIG. 21 there are depicted FEM simulation results for the electrode displacement as a result of the applied DC voltage for one version of a design according to an embodiment of the invention with dimensions that are summarized in Table C1. Accordingly, as the DC voltage is increased from 0V the movable shuttle moves with the spring force of the movable shuttle (electrode) offsetting the electrostatic force at smaller gaps until a threshold voltage, the "pull-in" voltage where the electrostatic voltage overcomes the spring force and the movable shuttle moves fully where its motion is now limited by the stoppers. As the applied voltage is now lowered, the electrodes maintain the pulled-in position till a certain release voltage ($V_r$) is reached wherein the restoring spring force becomes higher than the electrostatic voltage again bringing the electrodes back towards their original position where electrostatic force and spring force were balance. Reducing the applied voltage further back to 0V results in the movable shuttle (electrode) returning to its original state. As the release voltage is lower than the pull-in voltage this results in the hysteresis evident in FIG. 21. The FEM simulation projects a pull-in voltage of ~61 V. The release voltage can be calculated based on force balance by Equation (C2) where k is the equivalent spring constant of the suspension, $\varepsilon_0$ is the relative permittivity of free space, and A is the overlap area. For the implemented prototypes Equation (C2) yields a release voltage of ~28 V.

TABLE C1

Summary of Design Parameters used for FEM Simulation

| Design Parameter | Value | Design Parameter | Value |
|---|---|---|---|
| Initial gap ($g_I$) (μm) | 2.5 | $l_{SUSP1}$ (μm) | 117.5 |
| Stopper gap ($g_S$) (μm) | 2.0 | $l_{SUSP2}$ (μm) | 5 |
| Final gap ($g_F$) (μm) | 0.5 | $\omega_{SUSP}$ (μm) | 2 |
| Electrode length ($l_{ELEC}$) (μm) | 150 | Number of sections | 3 |

$$V_r = \sqrt{\frac{2k \cdot g_s \cdot g_f^2}{\varepsilon_0 \cdot A}} \quad (C2)$$

Prototypes were fabricated in two commercial SOI technologies, namely PiezoMUMPs™ from MEMSCAP and MicraGem-Si™ from Micralyne™, highlighting the flexibility of the design. The latter technology provides finer mask grid size (i.e., 100 nm for MicraGem-Si™ versus 250 nm for PiezoMUMPs™). It also allows for smaller device footprint as it avoids deep release trench etching which requires many design rules in PiezoMUMPs™ FIGS. 22A and 22B illustrates SEM micrographs of the two devices according to embodiments of the invention fabricated in both technologies, and FIGS. 22C and 22D depict SEM micrographs of one of the electrodes in its original position and in closed position, respectively. Note that gap closing is realized in this case through the SEM charging effect.

C3. Measurement Results

Figure 15:
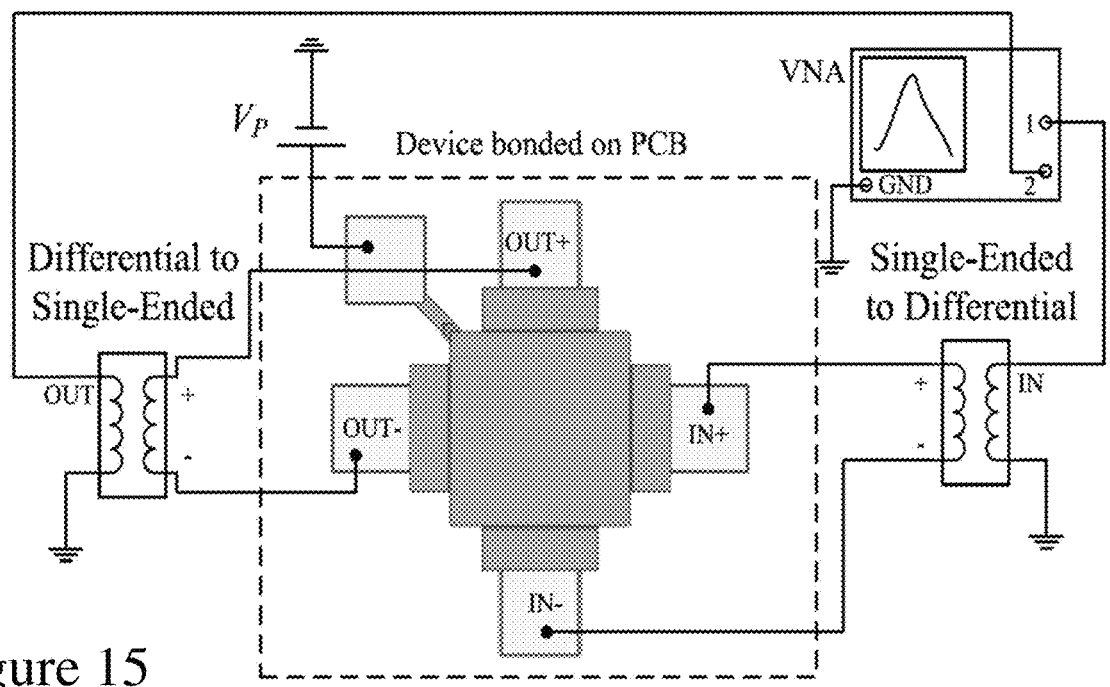
FIG. 15 depicts a differential test setup used for characterizing the fabricated resonators.

A differential setup was used for resonance characterization of the devices, as shown in FIG. 15. A pull-in voltage of 55 V and a release voltage of 20 V were observed. In the tests, the bias voltage was first ramped up and then ramped down, and the transmission characteristic of the resonators were extracted with a vector network analyser. Baluns were used at the input and at the output of the resonator to convert between single-ended signals and differential signals to excite the resonators and sense the output signals.

Figure 24A:
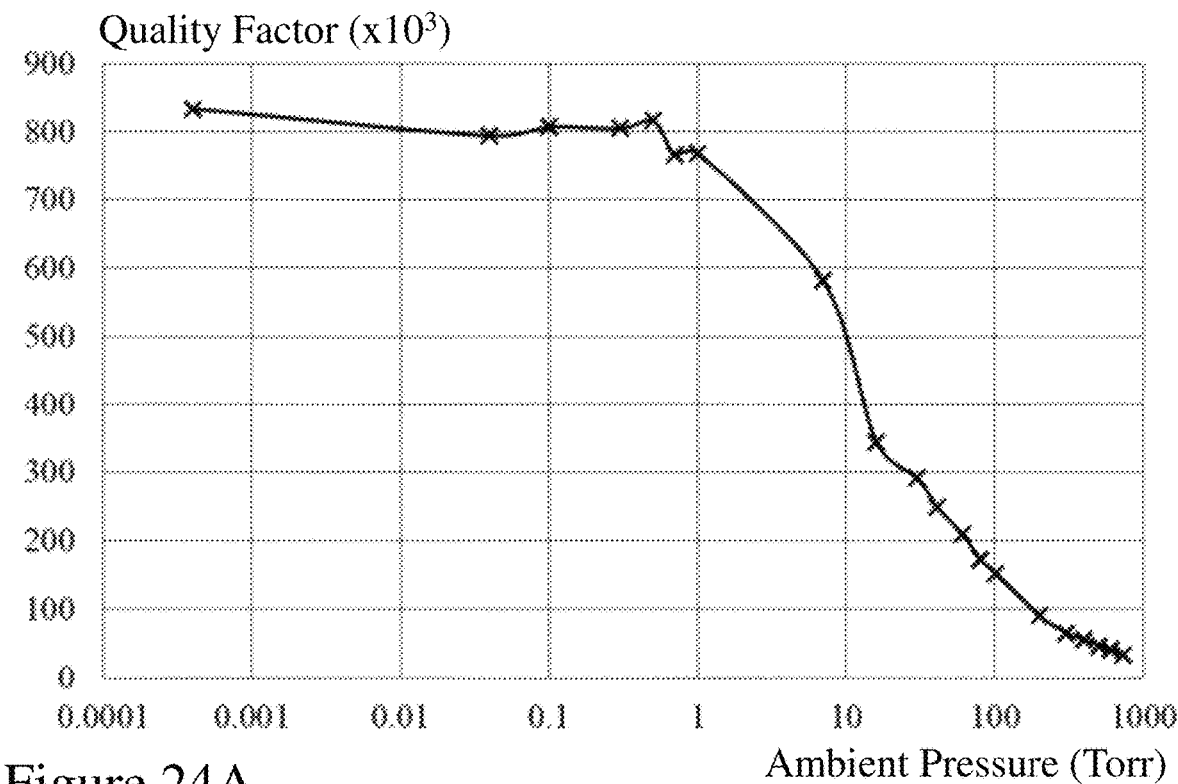
FIG. 24A depicts the effect of ambient pressure on the Q-factor of a Lamé mode resonator according to an embodiment of the invention fabricated using the MicraGem-Si™ process.
Figure 24B:
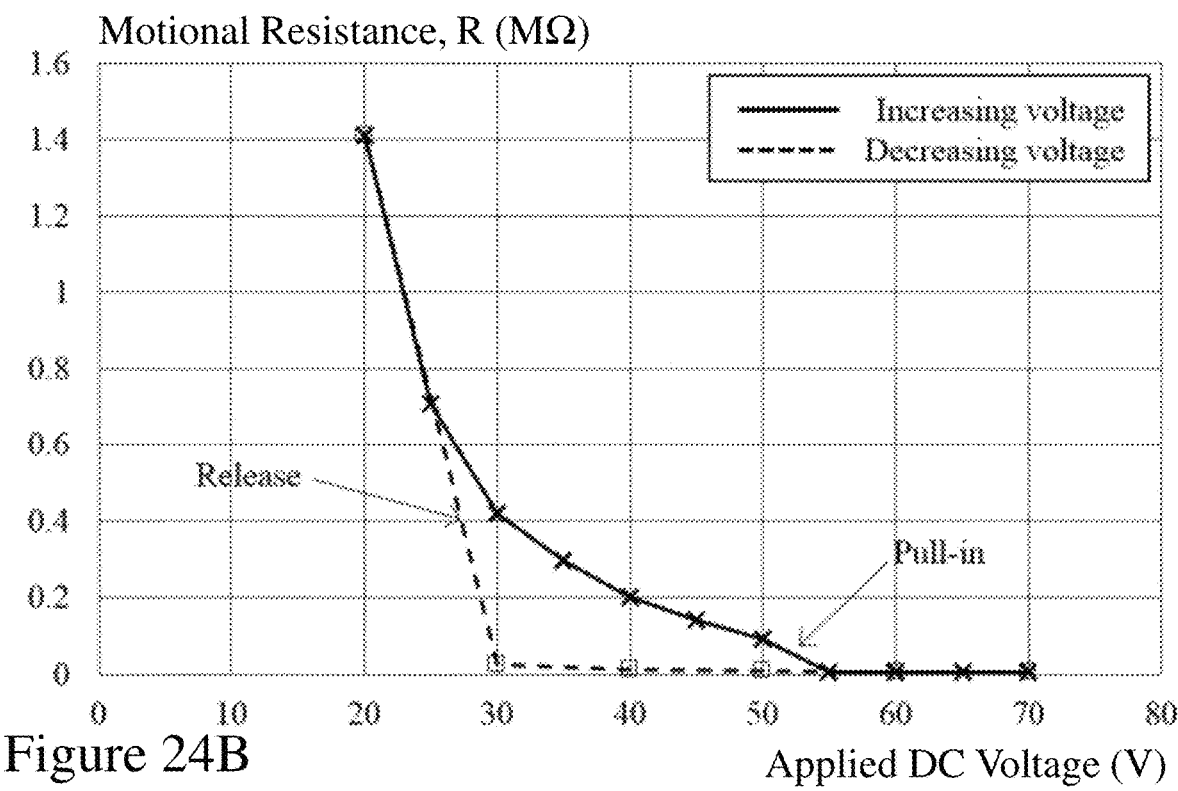
FIGS. 24B and 24C depict the effect of DC voltage on the motional resistance of Lamé mode resonators according to an embodiment of the invention fabricated using the MicraGem-Si™ process with a 200 nm transducer gap under vacuum and at atmospheric pressure respectively.
Figure 24C:
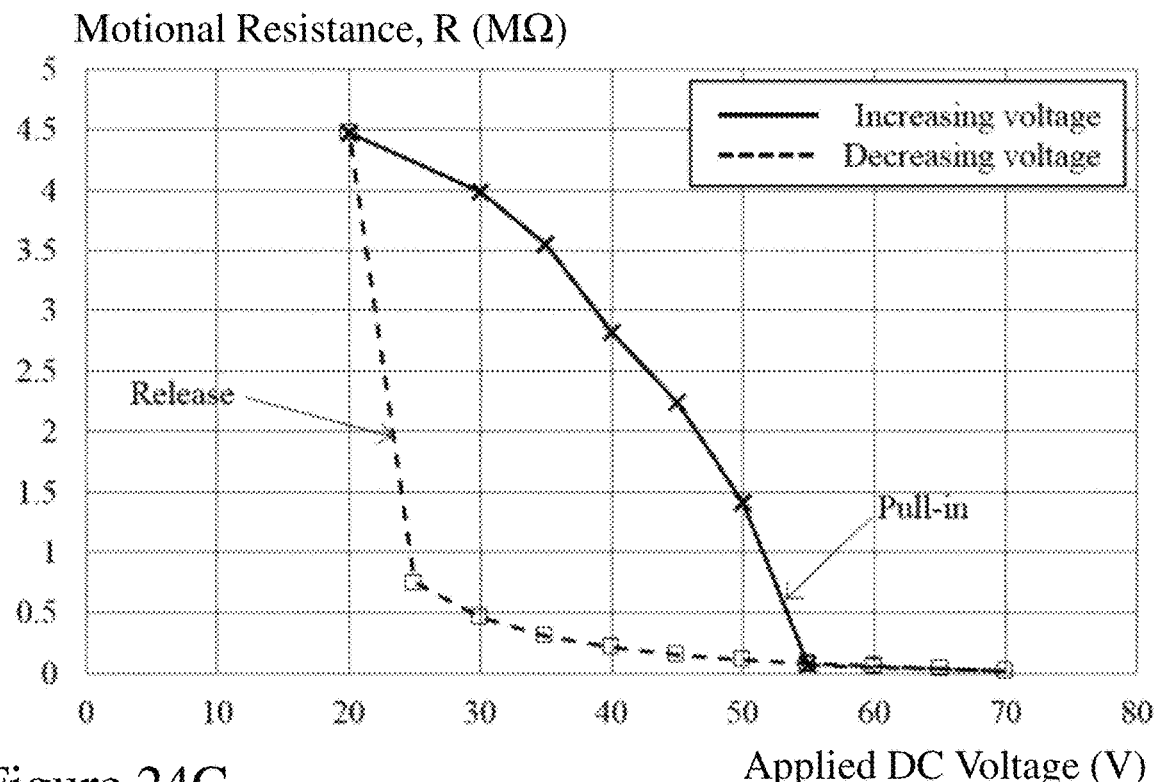
Figure 24D:
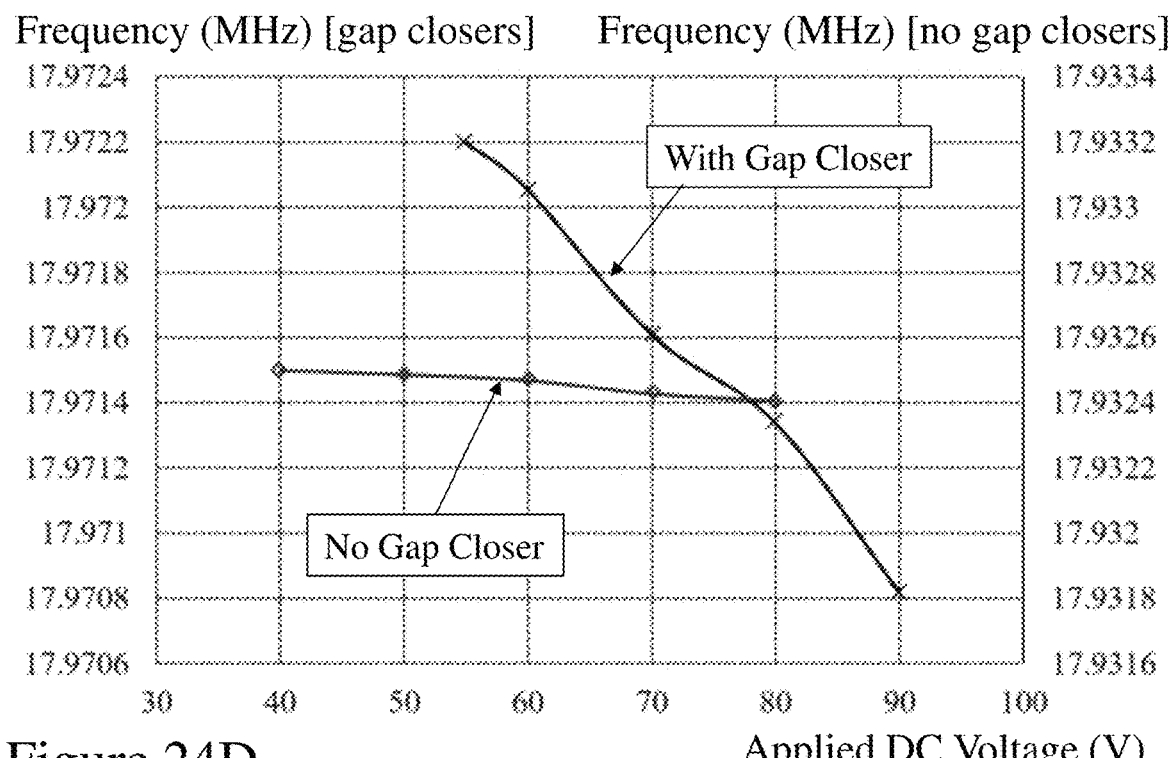
FIG. 24D depicts the effect of DC voltage on resonance frequency for Lamé mode resonator according to an embodiment of the invention after the gap is closed to 500 nm and a similar resonator without gap closers.

FIGS. 24A to 24E depict the resonator transmission curves for the resonator according to an embodiment of the invention fabricated using the PiezoMUMPs™ process technology wherein the bias voltage is ramped up and down at a vacuum level of 1 mTorr (FIGS. 24A and 24B) and at atmospheric pressure (FIGS. 24C and 24D). For these devices, the closed transduction gap size realized was of 500 nm. During the testing, the voltage was first ramped up, and no resonance peaks could be observed for DC voltages lower than the pull-in voltage, at a pull-in voltage of 55 V, resonance frequencies of ~17.97 MHz with Q-factors of 15,600 in atmospheric pressure increasing to 120,230 in vacuum were observed. As seen in FIG. 24A, at a vacuum level of 1 mTorr, an insertion loss of 55 dB was measured at resonance, corresponding to a motional resistance of 56 kΩ, which is 5 times lower than that reported in the prior art for a similar resonator without gap closers, highlighting the advantage of the inventive design. As shown in FIG. 24B, as the voltage was ramped down, resonance could still be observed down until voltages as low as 20 V, the electrode release voltage, which is in good agreement with the hysteresis effect simulations depicted in FIG. 21.

Figure 23A:
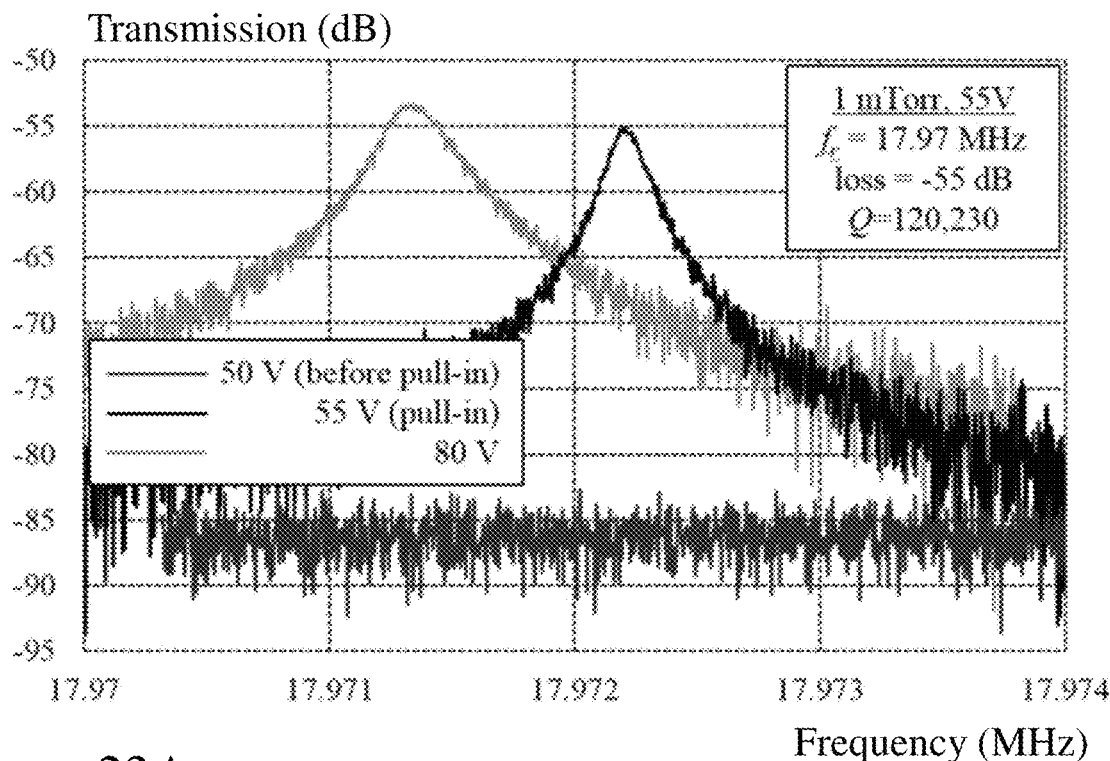
FIGS. 23A and 23B depict measured resonance characteristics Lamé mode resonators according to an embodiment of the invention fabricated using the PiezoMUMPs™ process at 1 mTorr with the bias voltage increasing and decreasing respectively.
Figure 23B:
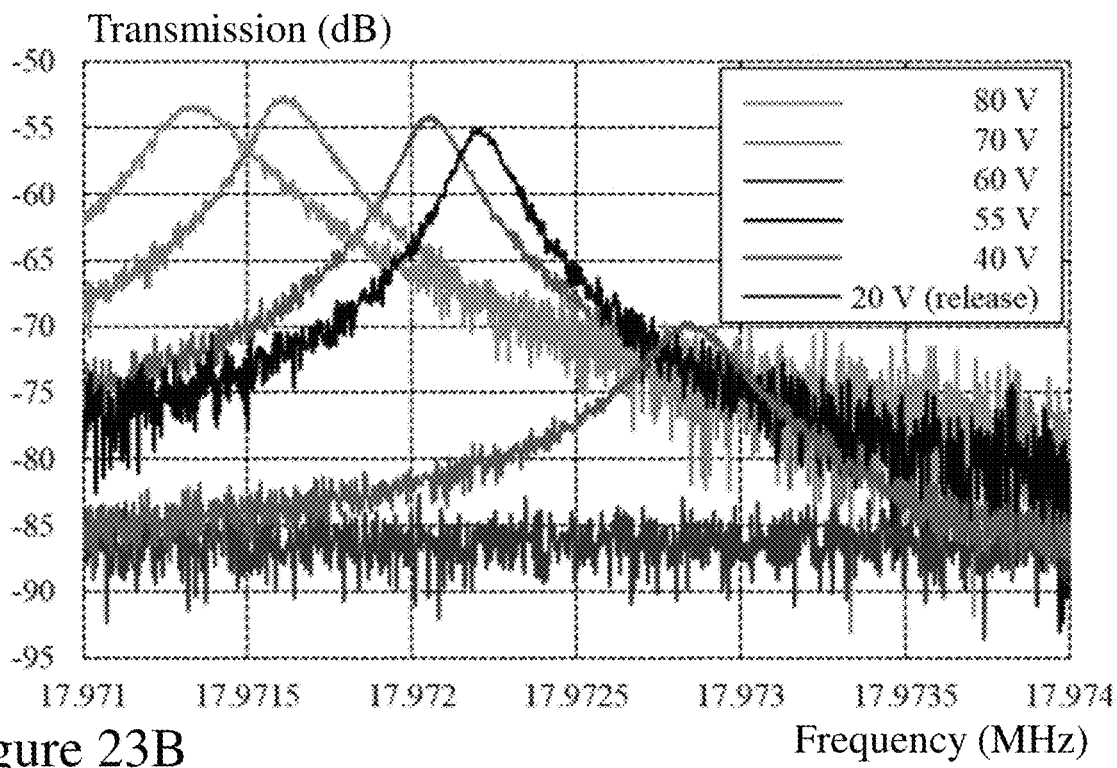
Figure 23C:
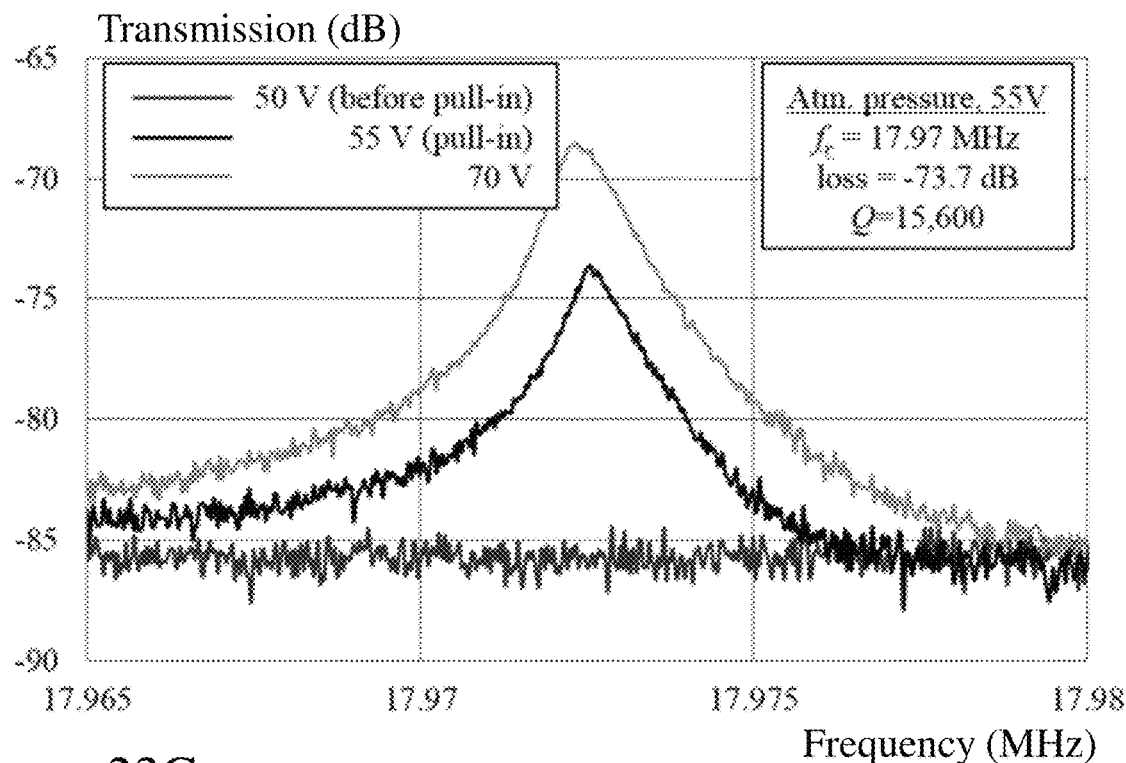
FIGS. 23C and 23D depict measured resonance characteristics Lamé mode resonators according to an embodiment of the invention fabricated using the PiezoMUMPs™ process at atmospheric pressure with the bias voltage increasing and decreasing respectively.
Figure 23D:
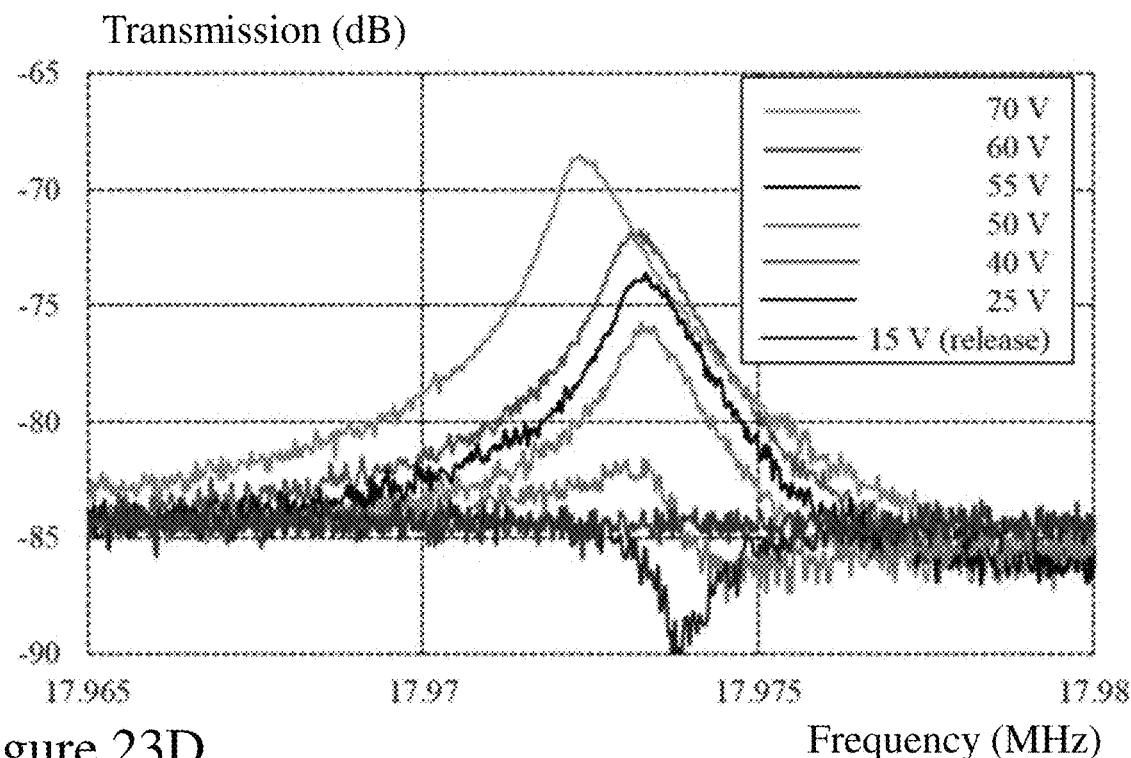
Figure 23E:
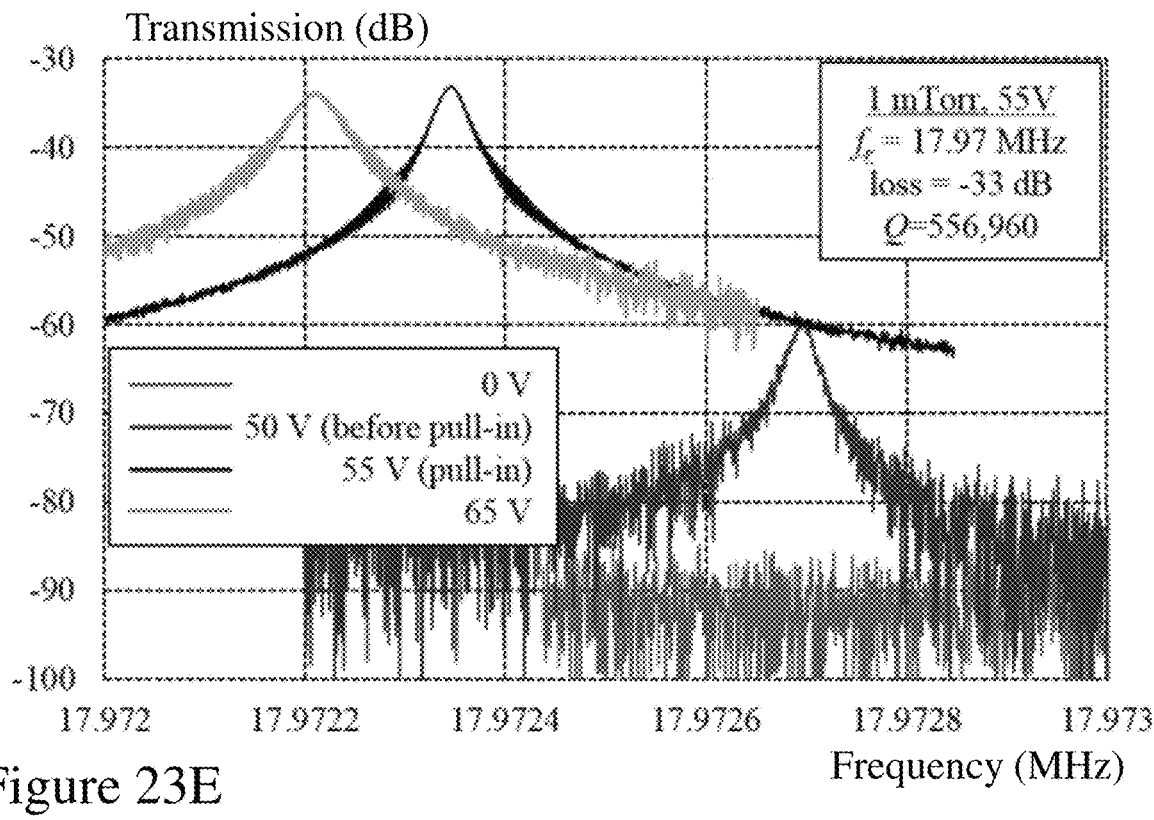
FIGS. 23E and 23F depict measured resonance characteristics Lamé mode resonators according to an embodiment of the invention fabricated using the MicraGem-Si™ process at 1 mTorr with the bias voltage increasing and decreasing respectively.
Figure 23F:
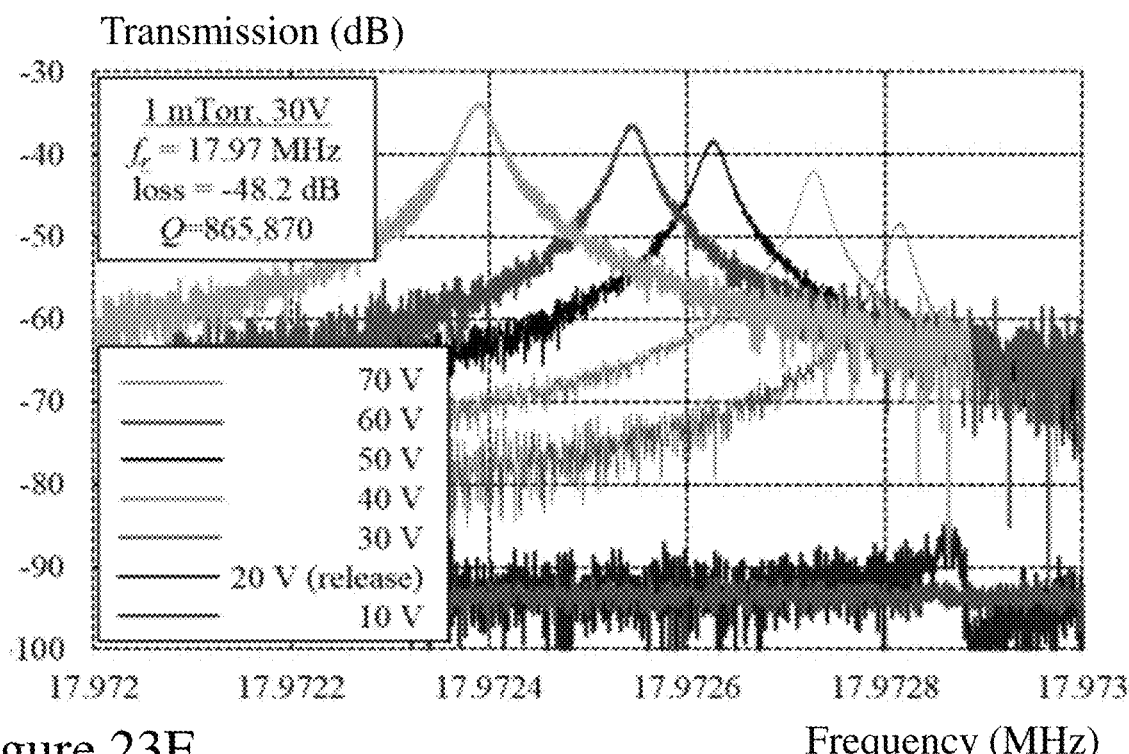
Figure 23G:
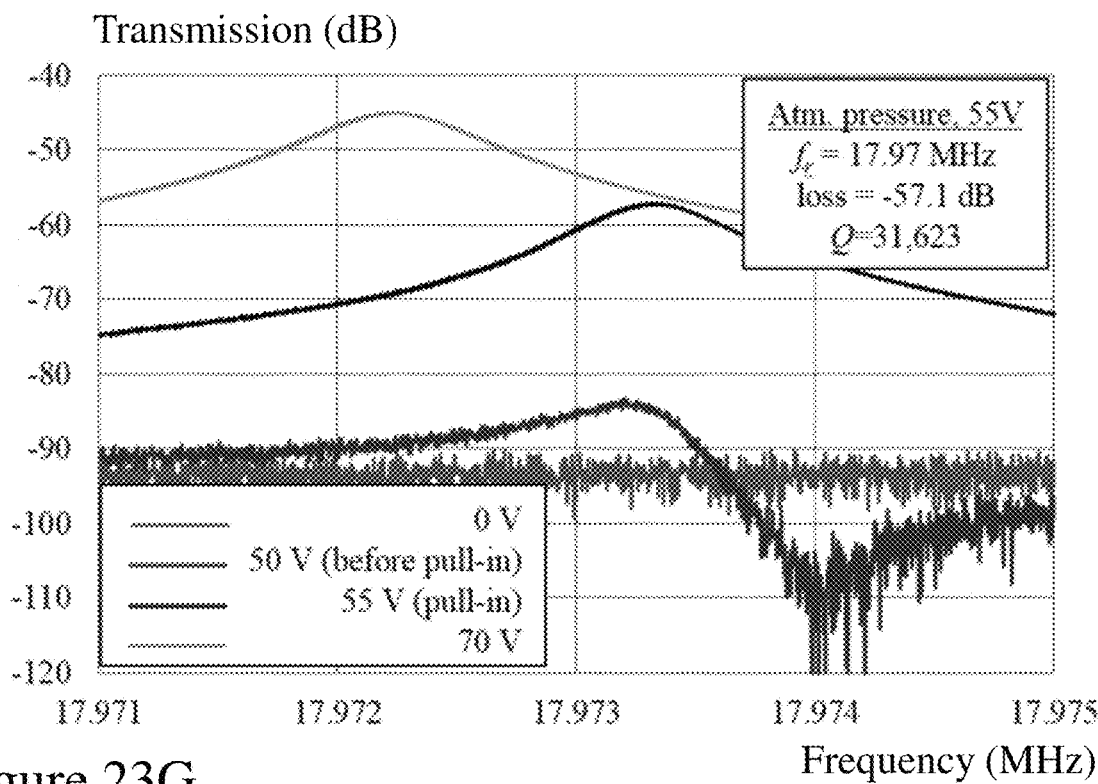
FIGS. 23G and 23H depict measured resonance characteristics Lamé mode resonators according to an embodiment of the invention fabricated using the MicraGem-Si™ process at atmospheric pressure with the bias voltage increasing and decreasing respectively.
Figure 23H:
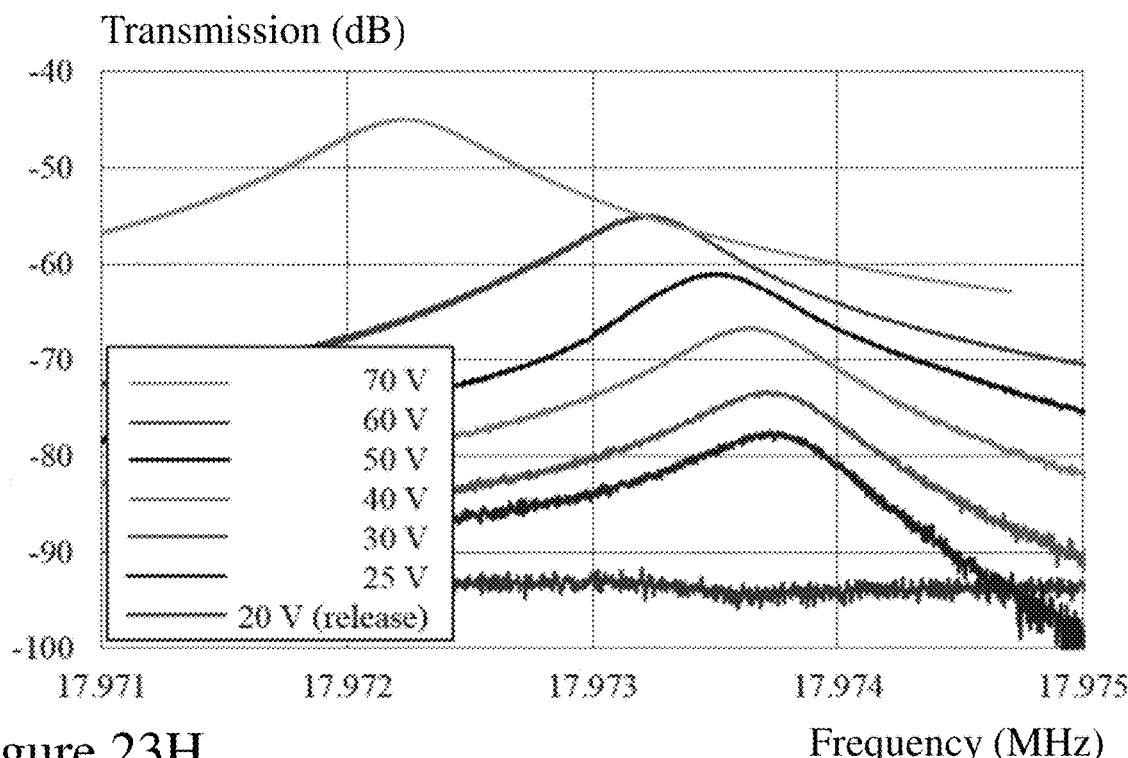

As noted supra the prototype resonators according to embodiments of the invention were also fabricated in another commercial technology, MicraGem-Si™, which offers better grid resolution, allowing narrower transducer gaps to be achieved after the electrodes are actuated. FIGS. 23E to 23G depict the transmission curves of these resonators for a bias voltage ramp up and ramp down using a similar testing setup at a vacuum level of 1 mTorr (FIGS. 23E and 23F) and at atmospheric pressure (FIGS. 23G and 23H). A transducer gap size of 200 nm was realized after the electrode actuation. This technology also allows for thinner anchor beams (i.e., 2 μm for MicraGem-Si™ versus 3 μm for PiezoMUMPs™), and the length of the anchor beams was also optimized, which allows for reduced anchor losses and thus higher Q-factors. During voltage ramp up, no resonance peaks could be observed for DC voltages lower than the pull-in voltage. At a pull-in voltage of 55 V, resonance frequencies of ~17,97 MHZ with Q-factors of 32,000 in atmospheric pressure were observed increasing to 866,000 in vacuum. After the closing of the electrode at a bias voltage of 55 V to achieve a 200 nm transducer gap, an insertion loss at resonance of 33 dB was measured at vacuum level of 1 mTorr. This corresponds to a motional resistance of 4.4 kΩ, which is more than 60 times lower than that reported in the prior art for a similar resonator without gap closers, highlighting the advantage of the inventive design. The effect of the ambient pressure on the Q-factor of these resonators is shown in FIG. 24A. The devices maintain Q-factors within 10% of the peak Q-factor in vacuum for pressures as high as 1 Torr, and the Q-factor remains relatively high even at atmospheric pressure at a value of 32,000.

The effect of the bias voltage on the motional resistance is illustrated in FIGS. 24B and 24C for resonators fabricated in the MicraGem-Si™ technology with a transduction gap of 200 nm after electrode actuation. Two superimposed curves are shown, one for increasing the voltage beyond pull-in and one for reducing the voltage again beyond the electrode release to illustrate the effects of pull-in and release, as well as the hysteresis. The motional resistance ($R_X$) is calculated from the resonator transmission curves based on Equation (C3) where $T_{MAX}$ is the signal transmission of the resonator (on a linear scale) at resonance and $Z_0$ is the characteristic impedance (50Ω in the case presented here). As seen in FIGS. 24B and 24C, the motional resistance improvement enabled by the gap closing mechanism is significant, highlighting the insertion loss advantage of these inventive devices over that of devices that would be fabricated with the same technology by relying only on the spacing critical dimension of 2 μm to achieve the transducer gaps. Interestingly, if a higher motional resistance can be accommodated by an application, the resonator can be operated after pull-in of the electrodes at a bias voltage that is below the pull-in voltage. This can be used to enhance the linearity of the resonator if required, for instance.

FIG. 24D depicts the tuning of the resonant frequency that is achieved by varying the bias voltage for one gap closing resonator and a similar resonator that does not feature a gap closer mechanism. The resonance frequency is tunable based on the electrostatic spring softening phenomenon. The tuning range of the gap closing design according to an embodiment of the invention is ten times higher than that of a resonator without a gap closer, outlining the tuning range increase enabled by the gap closing mechanism.

Table C2 lists the performance metrics of a number of published start-of-the art resonators in comparison to those achieved with embodiments of the invention. The inventive design achieves one of the highest frequency Q-factor products (f-Q) while featuring one of the lowest motional resistances, to the inventor's knowledge the lowest reported to date for capacitive resonators, while maintaining relatively low bias voltage. Notably, the design does not require any complex fabrication steps and is fully compatible with commercial silicon-on-insulator microfabrication technologies.

Whilst the embodiments of the invention described and depicted supra in Section C have been square Lamé resonators it would be evident that the electrostatic gap closing mechanism, electrostatic gap closers, and electrostatic pull-in may be applied to other MEMS resonators with other geometries other than square. It would also be evident that the methodology of the electrostatic gap closing mechanism via electrostatic pull-in with electrostatic gap closers and gap stoppers may also be applied to other MEMS resonators such as those exploiting a central support under the resonator beam etc.

TABLE C2

Comparison Between Inventive Resonator and State-of-the-Art

| | Type | Mode | Freq. (MHz) | Q-factor | | f-Q Product | $V_{DC}$ (V) | $R_X$ (Ω) |
|---|---|---|---|---|---|---|---|---|
| 1 | Cap. | Wine-glass | 210 | 7,700 | (200 μTorr) | $1.62 \times 10^{12}$ | 15 | 9.16k |
| | | | 1520 | 3,000 | (200 μTorr) | $4.56 \times 10^{12}$ | 5 | 791.6k |
| 2 | Cap. | Lamé | 17.93 | 871,000 | (<100 mTorr) | $1.56 \times 10^{13}$ | 100 | 75k |
| | | | | 42,000 | (atm.) | $7.53 \times 10^{11}$ | | 1.8M |
| 3 | Cap. | Lamé | 6.35 | 1.6M | (36 μTorr) | $1.02 \times 10^{13}$ | 50 | 9.9k |
| | | | | 5,100 | (atm.) | $3.24 \times 10^{10}$ | | |
| 4 | Cap. | Wine-glass | 5.43 | 1.9M | (10 mTorr) | $1.03 \times 10^{13}$ | 60 | 17k |
| | | | | 10,000 | (atm.) | $5.43 \times 10^{10}$ | | |
| 5 | Cap. | Lamé | 6.89 | 3.24M | (10 mTorr) | $2.23 \times 10^{13}$ | 50 | — |
| 6 | Cap. | Lamé | 12.9 | 1.2M | (vacuum) | $1.3 \times 10^{13}$ | N/A | 330k |
| 7 | Cap./Piezo | Lamé | 12.9 | 930,000 | (<40 μTorr) | $1.2 \times 10^{13}$ | 50 | 34.4k |
| 8 | Cap. | 2ary elliptic | 1.5 | 33,000 | (10 mTorr) | $4.95 \times 10^{10}$ | 50 | 31.5k |
| 9 | Cap./Piezo | Wine-glass | 51 | 12,748 | | $6.5 \times 10^{11}$ | — | 4.9k |
| 10 | Cap./Piezo | Radial | 300 | 8,800 | (vacuum) | $2.64 \times 10^{12}$ | — | 9.9k |
| 11 | Piezo. | Lamé | 36.23 | 30,700 | (vacuum) | $1.11 \times 10^{12}$ | — | 199.4k |
| 12 | Piezo. | Wine-glass | 14.63 | 4,894 | (≤100 mTorr) | $7.16 \times 10^{10}$ | — | 1.2k |
| | | | | 1,952 | (atm.) | $2.86 \times 10^{10}$ | | 3k |
| 13 | Piezo. | Wine-glass | 23.27 | 31,338 | (1 mTorr) | $1.2 \times 10^{13}$ | — | 8.8k |
| | | | | 12,845 | (atm.) | $1.2 \times 10^{13}$ | | 21k |
| 14 | Cap. | Wine-glass | 9.45 | 27,200 | (0.01 mTorr) | $2.57 \times 10^{11}$ | 20 | 1.1M |
| Invention | Lamé | | 17.97 | 866,000 | (<1 Torr) | $1.56 \times 10^{13}$ | 55 | 4.4k |
| | | | | 32,000 | (atm.) | $5.75 \times 10^{11}$ | | 71.4k |

Notes:
1. Poly-Si wine-glass mode ring resonators with 63-85 nm capacitive gaps and 1.6 μm wide anchor beams.
2. Capacitive Lamé bulk mode square resonators fabricated in a novel SOI technology, and anchored using either corner supports or a central support.
3. Lamé mode square capacitive resonator with Si structural layer with 2 μm transduction gap.
4. Capacitive disk resonator with Si structural layer with 2 μm transduction gap.
5. Wafer-level encapsulated capacitive Lamé mode square resonator.
6. Mechanically coupled capacitive Lamé mode resonator arrays for motional resistance reduction.
7. Piezoresistive sensing used to enhance the electromechanical coupling of a capacitive actuated Lamé mode square resonator.
8. Dodecagon gyro with combs utilizing a Si structural layer.
9. AlN disk resonators with capacitive-piezoelectric actuation/sensing electrodes above/below the structure with 260 nm gap and anchor beams of 1-2 μm width.
10. AlN capacitive-piezoelectric disk resonators with ON/OFF switching capability utilizing capacitive electrodes above/below the structure with 120-250 nm gap and center anchors.
11. Piezoelectric actuated Lamé mode resonator with corner supports and using oxide refilled islands for temperature compensation.
12. Si wine-glass disk resonators using piezoelectric actuation/sensing, electrostatic frequency tuning, and anchor beams of 10 μm width.
13. Piezoelectrically actuated Si wine-glass disk resonators employing in-house post-processing to narrow down the anchor beams and reduce anchor loss for enhanced Q-factor.
14. Si wine-glass disk resonator with movable electrodes utilized for gap reduction.

Accordingly, Lamé mode resonators exploiting a novel gap closing mechanism have been development employing electrostatic force to reduce the capacitive transduction gaps to sub-micron values overcoming the fabrication technology limitations. Accordingly, this leads to significant resonator loss and motional resistance reduction, and tuning range increase, for the resonators whilst allowing significant cost reductions in the manufacture of the MEMS resonators through use of commercial MEMS production processes.

The inventive mechanism does not have a negative impact on the Q-factor achievable, and the devices maintain a high Q-factor even in air. Prototypes have been fabricated in two commercial silicon-on-insulator processes. Upon the application of a bias voltage of 55 V the capacitive transduction gaps are reduced to sizes as small as 200 nm. A resonance frequency of 18 MHZ with Q-factors as high as ~870,000 were observed under a 1 mTorr vacuum, with this Q-factor being relatively unaffected at a vacuum level of up to 1 Torr, and reducing to 32,000 at atmospheric pressure. The resonance operation is maintained while reducing the operating bias voltage as low as 20 V. An insertion loss of 33 dB was measured at 55 V, which corresponds to a motional resistance of 4.4 kΩ, more than 60 times lower than that of a similar design without gap closers at the same voltage, which to the inventors' knowledge is the lowest reported to date for capacitive bulk mode resonators. The frequency tuning range is also increased by an order of magnitude, which can be very useful for overcoming ambient conditions and fabrication process variations, D: Sub-MW MEMS Oscillator Exploiting Adjustable Bandwidth Fully Differential Transimpedance Amplifier and a Lamé-Mode Resonator D1. Introduction Resonators can be classified based on their vibration modes as either flexural or bulk mode devices. Bulk-mode devices typically exhibit high stiffness, and are consequently less prone to thermoelastic damping, compared to flexural devices, allowing them to achieve large quality factors (>10,000), even at atmospheric pressure. Bulk mode resonators including Lamé-mode and wine glass mode devices with quality factors in the $10^6$ range have been reported within the prior art based upon capacitive actuation. Such high quality factors are achievable as a result of superior structural material, single crystalline silicon, which is formed into a pure bulk resonating structure, without the need for release holes, or additional layers on top, which is one of the limitations for the quality factors achieved by piezoelectrically actuated devices On the other hand, capacitive bulk-mode devices typically exhibit lower transduction efficiencies compared to piezoelectric devices, which translate to higher losses and motional resistances. This can be accounted for by either enhancing the transduction, e.g., sub-micron gaps realized by complex fabrication, high voltages, added combs, or increasing the gain for the transimpedance amplifier (TIA) in order to sustain oscillation. Several transimpedance topologies have been reported in the literature for MEMS-based oscillator purposes. Designs proposed include an automatic gain control circuit to regulate the oscillation amplitude and reduce the resonator mechanical non-linearity effect. Furthermore, the power consumptions of fully differential transimpedance amplifier designs are higher than single-ended TIAs.

Generally, an oscillator is realized by connecting a TIA with the resonator in positive feedback loop to sustain a steady-state oscillation by converting the resonator output current to an output voltage signal and ensure sharp response. The sharpness and quality of the output oscillation is usually determined by the quality factor of the resonator. It is necessary for the TIA to have high transimpedance gain due to the resonator loss caused by its motional resistance. Large bandwidth is also required to ensure that the oscillator phase shift is around 0°, when MEMS-based oscillator operates in series resonance mode. Thus, Barkhausen conditions are fulfilled. Furthermore, low input and output impedances are required to minimize the resonator Q-factor loading. The inventors have established a MEMS based oscillator based upon a Lamé-mode resonator in conjunction with a novel fully differential high gain TIA thereby achieves very competitive performance in terms of power consumption and phase noise relative to the state of the art.

D2. Lamé Mode MEMS Resonator

Figure 25:
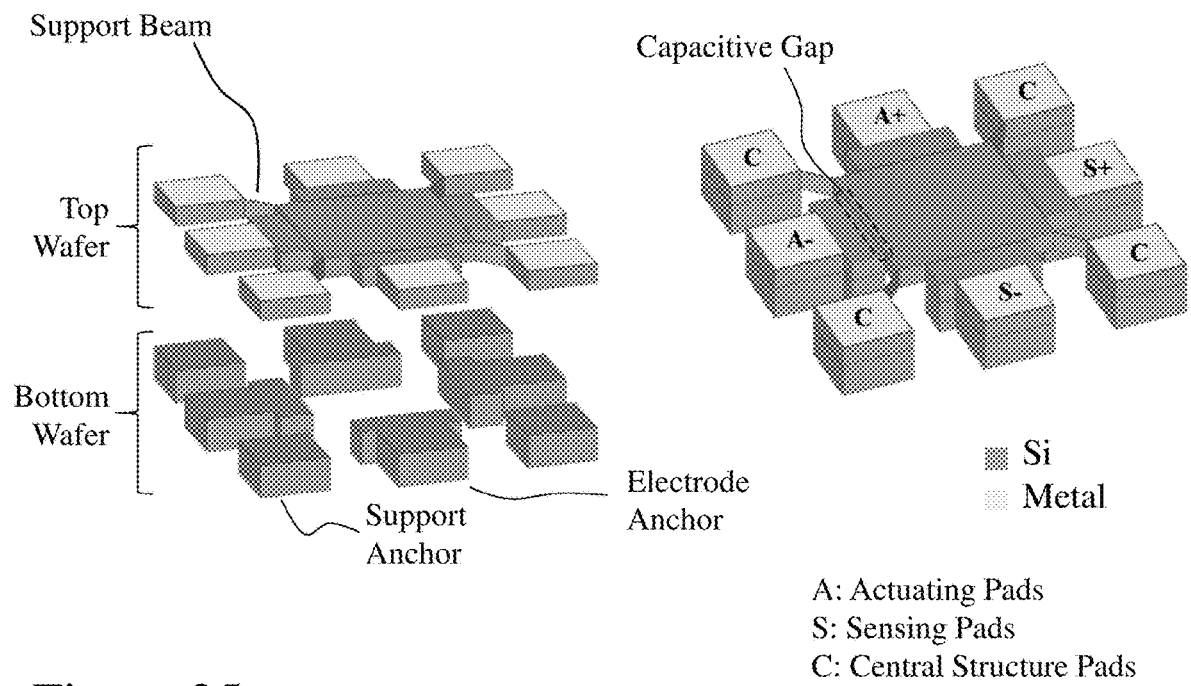
FIG. 25 depicts exploded and assembled views of a MEMS resonator according to embodiments of the invention employing corner supports.

The Lamé MEMS resonator employed is based upon the inventive design and manufacturing methodology presented in Section B supra. For completeness, a brief description is given in this section wherein FIG. 25 illustrates exploded and assembled 3D renditions of the resonator structure. The MEMS resonators were fabricated in a novel silicon-on-insulator (SOI) technology, MicraGEM-Si™, where they are realized through processing and wafer bonding of two SOI wafers (i.e., the top wafer and the bottom wafer). The top wafer has its handle layer removed after bonding to the bottom wafer such that the resonator is mainly composed of a single-crystalline silicon central square suspended structure acting as the Lamé bulk mode resonator. This suspended square is 30 μm thick, has a 230 μm side length, and is formed in the device layer of the top SOI wafer. The resonator square structure is anchored to the substrate through four suspension beams placed at the corner nodal points of the resonance mode.

Figure 26:
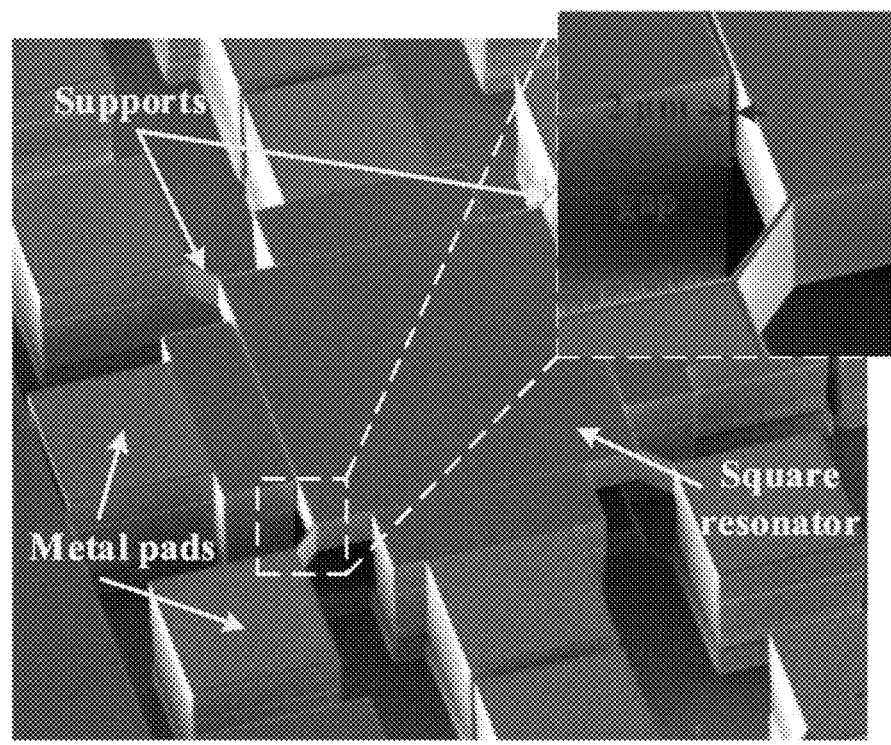
FIG. 26 depicts an SEM micrograph of a fabricated MEMS resonator with corner supports according to an embodiment of the invention.

Pads for electrical connection to the central square are present in the end of each suspension beam. This allows for connecting the DC polarization voltage required for the electrostatic actuation of the device. These support beams are patterned in the device layer of the top SOI wafer. The central structure is surrounded by four electrodes utilized for capacitive actuation and sensing of the structure. The electrodes are formed in the device layer of the top SOI wafer and are separated from the central square by a 2 μm capacitive transduction gap, which is the minimum spacing allowed by the technology. The device layer of the bottom SOI wafer is patterned to form the electrode anchors and the anchors at the end of the suspension beams. SEM micrographs of the resonator are shown in FIG. 26. FEM simulations as well as theoretical calculations predict a resonance frequency of 17.9 MHz.

D3. Transimpedance Amplifier Circuit Design

Figure 27:
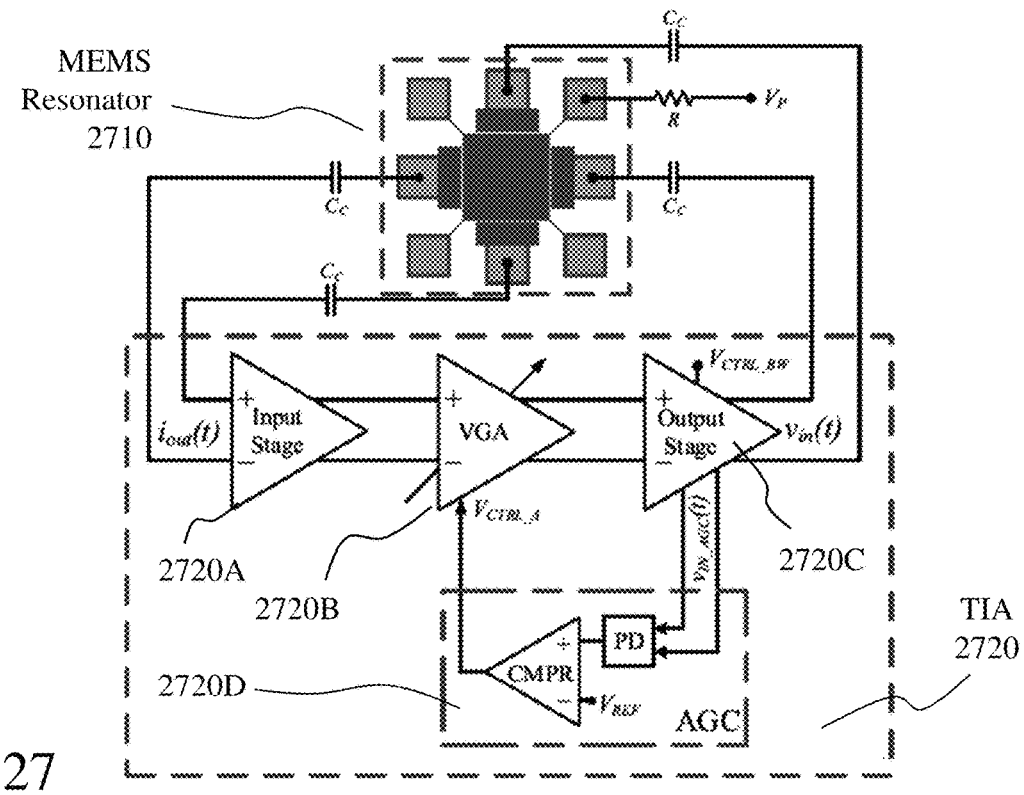
FIG. 27 depicts a MEMS resonator based oscillator functional diagram according to an embodiment of the invention.

The transimpedance amplifier circuit shown is in FIG. 27 comprising the MEMS resonator 2710 coupled to a TIA 2720 which is composed of three fully differential stages, namely an Input Stage 2720A followed by a Variable Gain Amplifier (VGA) 2720B controlled by an Automatic Gain Control circuit (AGC) 2720D and an output stage 2720C based upon super source follower (SSF). The complete schematic circuit is shown in FIGS. 28A and 28B in which the biasing and common-mode feedback (CMFB) circuits are not shown for clarity.

Figures 28A, 28B:
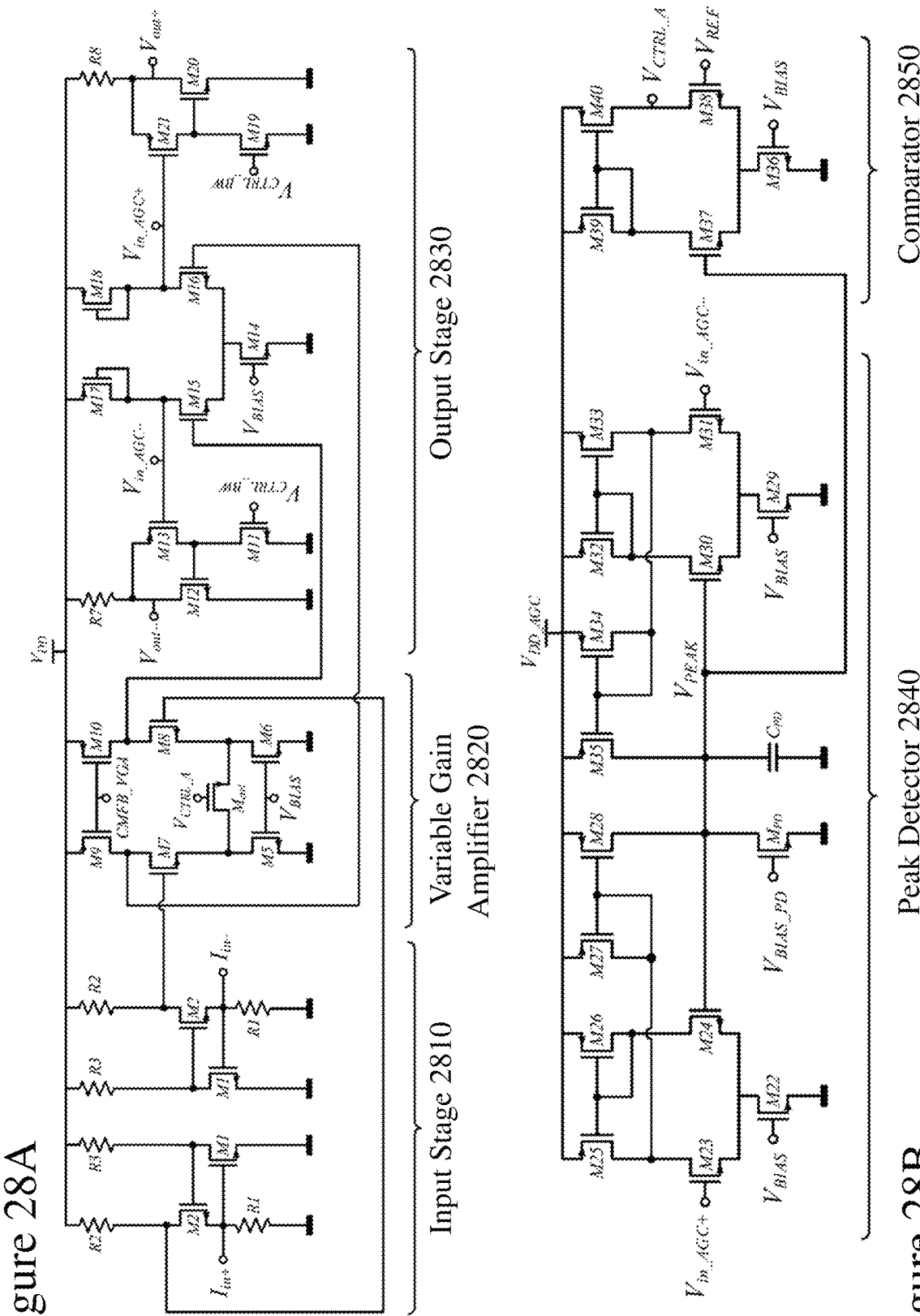
FIGS. 28A and 28B depict circuit schematics of a fully differential transimpedance amplifier (TIA) design according to an embodiment of the invention and automatic gain control (AGC) circuit according to an embodiment of the invention.

FIG. 28A depicting:
Input Stage 2810 forming part of Input Stage 2720A in FIG. 27;
VGA 2820 forming part of VGA 2720B in FIG. 27; and
Output Stage 2830 forming part of Output Stage 2720C in FIG. 27.

FIG. 28B depicting:
Peak Detector 2840 forming part of AGC 2720D; and
Comparator 2850 also forming part of AGC 2720D.

The sustaining amplifier provides low input impedance ($R_{IN}$) and low output impedance ($R_{OUT}$) in order to compensate for large parasitic capacitance ($C_P$=4 pF) and push the dominant pole far beyond the oscillation frequency of the MEMS oscillator circuit. This can be translated into high gain-bandwidth (GBW) product for the TIA.

An exemplary embodiment of the invention exploits a MEMS resonator such as an electrostatic Lamé-mode resonator described in Section B2 supra. The gain of the TIA needs to be high enough in order to compensate for the resonator's high motional resistance and sustain the oscillation. Accordingly, a regulated cascode (RGC) topology was chosen as input stage in order to achieve a reasonable trade-off between bandwidth and power consumption. The input impedance of the RGC input stage is given by Equation (D1) where $g_{m1}$ and $g_{m2}$ are the transconductance of transistors M1 and M2, respectively. Thus, smaller input impedance can be reached by increasing voltage gain of the local feedback stage given by $(1+R_3 g_{m1})$.

The expression of input stage gain is given by Equation (D2) where $C_{IN}$, $C_1$ and $C_{gd2}$ are the total input capacitances of the input stage, the equivalent capacitance between the drain of M1 and the gate of M2, and the gate-drain capacitance of transistors M2, respectively. To achieve a higher gain, $R_2$ should be increased, although it cannot be indeterminately enlarged because of design constraints.

$$R_{IN} = \frac{1}{g_{m2}(1 + R_3 g_{m1})} \tag{D1}$$

$$Z_T(s) \cong \frac{R_s\left(1 + s\frac{R_3 C_1}{1 + R_3 g_{m1}}\right)}{(1 + sR_1 C_{IN})(1 + sR_3 C_1)(1 + sR_2 C_{gd2})} \tag{D2}$$

It can be seen from Equation (D2) that the 3-dB bandwidth of the input stage is limited by the dominant pole appearing at the drain of transistor M1 and is given by Equation (D3) where $C_{gd1}$, $C_{gs1}$, and $C_{gs2}$ are the gate-drain capacitance of transistor M1, and the gate-source capacitances of transistors M1, and M2, respectively. The local feedback of the input stage generates a zero at the frequency given by Equation (D4). In order to keep the zero far away from the dominant pole, the gate-drain capacitance of transistor M2 should be decreased by decreasing its width, therefore, RGC input impedance in Equation (D1) will not be dramatically affected since $g_{m2}$ will not decrease considerably as it is proportional to $(WL)_2$, while its gate capacitance is linearly proportional to $(WL)_2$. This can be compensated by increasing $R_3$ as the input impedance is inversely proportional to $(1+R_3 g_{m1})$, as shown in Equation (D1).

Figure 29:
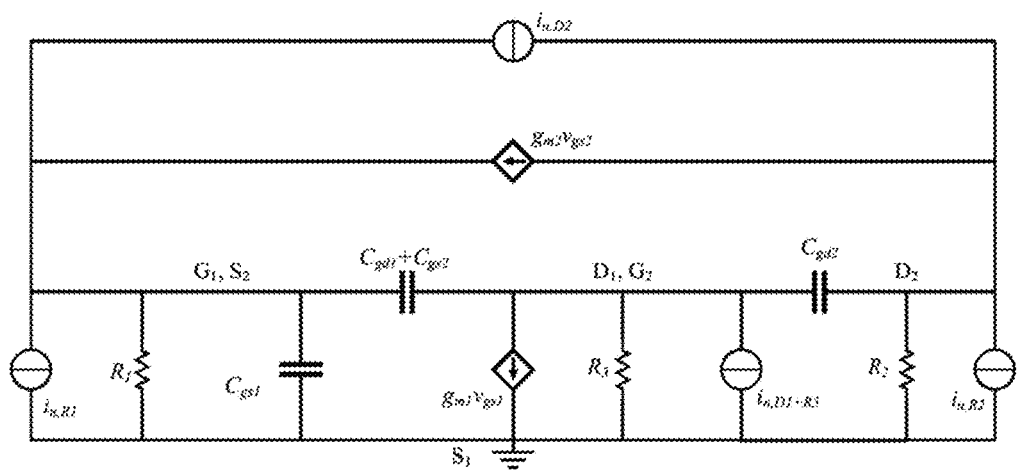
FIG. 29 depicts a simplified noise equivalent circuit of the regulated cascade (RGC) input stage of the oscillator circuit according to an embodiment of the invention depicted in FIGS. 28A and 28B.

The input-referred current noise is an important key performance parameter to be considered when designing the proposed TIA. It can be used to provide a fair comparison between different circuit topologies. Since the noise is mostly contributed by the input stage, then the noise of the other stages can be ignored. Therefore, a noise analysis was derived from FIG. 29 where shot noise and flicker noise are ignored. Assuming that all noise sources are uncorrelated, the input-referred current noise for the input stage is calculated and its expression is given by Equation (D5) where γ is the noise coefficient, k is Boltzmann's constant, T is the absolute temperature and $g_{d0,1}$, and $g_{d0,2}$ are the zero-bias drain conductance of transistors M1, and M2, respectively.

$$f_{-3dB} = \frac{1}{2\pi R_1 C_{IN}} \cong \frac{1}{2\pi R_1 \times (C_{gs1} + C_{gd1} R_3 g_{m1})} \quad (D3)$$

$$f_z \cong \frac{g_{m1}}{2\pi C_1} \cong \frac{g_{m1}}{2\pi \left[ C_{gd1} + C_{gd2}\left(1 + \frac{R_2}{R_1}\right)\right]} \quad (D4)$$

$$\overline{i_{n,in}^2} = \frac{4kT}{R_1} + \frac{\omega^2 (C_1 + C_2)^2}{g_{m2}^2}\left(\gamma g_{d0,2} + \frac{1}{R_2}\right) + \frac{4kT\left(\frac{1}{R_1^2} + \omega^2 C_{IN}^2\right)}{\left(g_{m1} + \frac{1}{R_3}\right)^2}\left(\gamma g_{d0,2} + \frac{1}{R_2}\right) \quad (D5)$$

From (5), the noise can be analysed as follows: the thermal noise contribution from R1 is directly assigned to the equivalent input noise, and as the frequency increases, the noise is dominated by terms containing $\omega^2$. Therefore, low input equivalent noise can be achieved by increasing resistor R1 and thus for better transimpedance gain performance in terms of noise.

D4. Experimental Results

Two test configuration setups were employed as depicted in FIG. 31 in order to characterize the MEMS-based oscillator: i) the open-loop configuration (solid line) and ii) the closed-loop configuration (dashed line). A vector network analyzer (VNA) was used to measure the two-port S-parameters of the resonator and TIA as well as the oscillator in open-loop in order to obtain the frequency response whilst the oscillation spectrum and phase noise were measured with a spectrum analyzer.

D4.A. Resonator Characterization

Figure 30A:
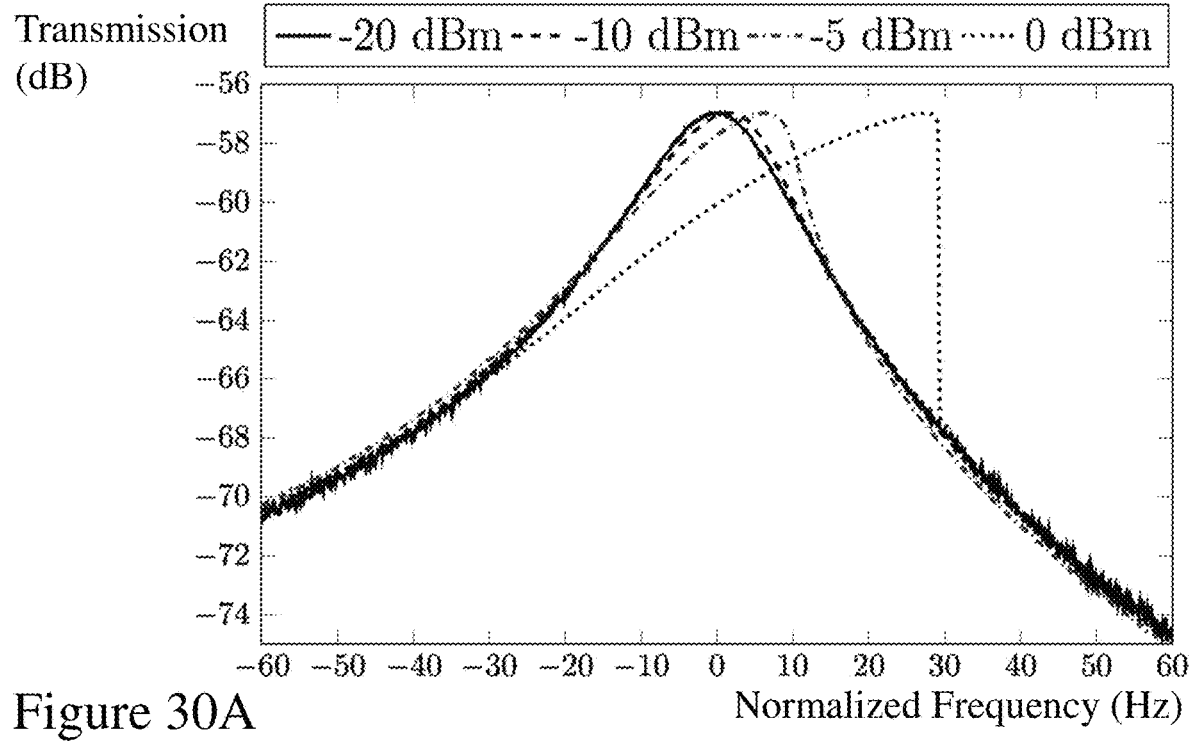
FIGS. 30A and 30B depict normalized transmission characteristic curves for varying output amplitude levels at two bias voltages for a resonator and oscillator circuit according to embodiments of the invention.
Figure 30B:
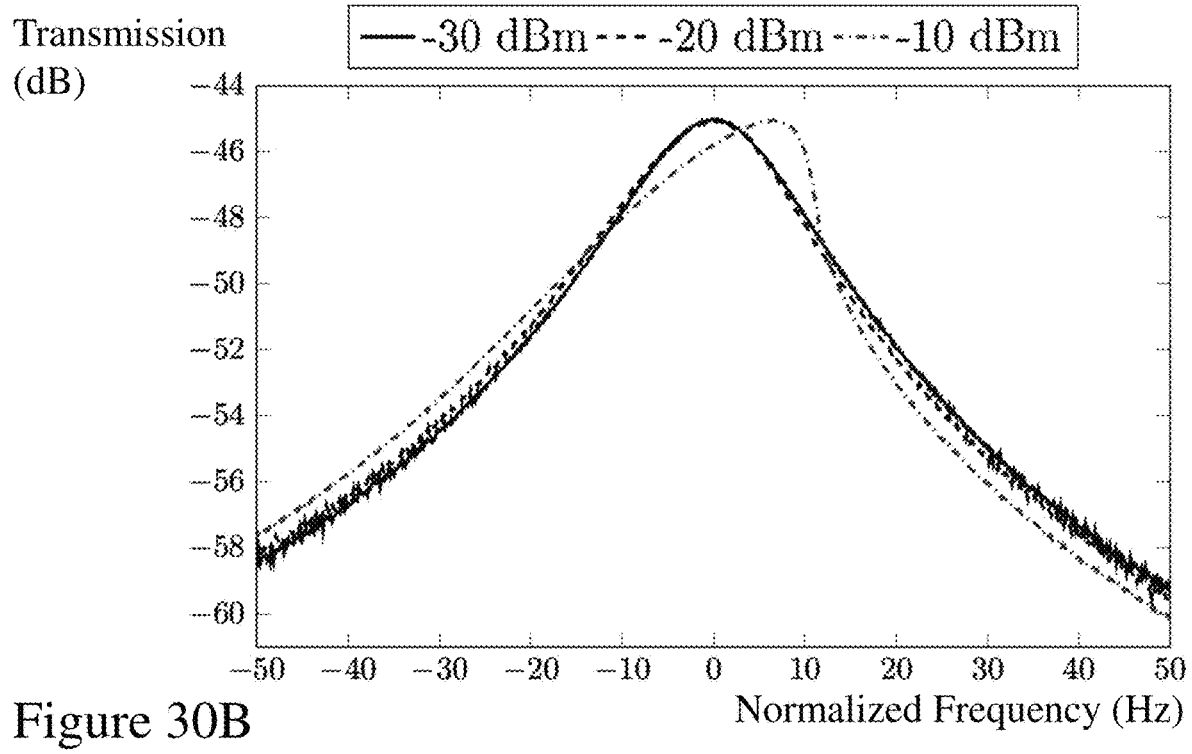

The frequency response of the resonator was measured in differential configuration with the VNA under a vacuum level of 100 mTorr for DC polarisation voltage, $V_P$, of 100 V and 200 V, and various input power levels starting from −30 dBm up to 0 dBm. FIGS. 30A and 30B depict the transmission characteristic curves normalized to the center frequency of 17.93 MHz with a Q-factor of ~890 k, and peak transmissions of −57 dB and −45 dB for $V_P$=100V and $V_P$=200V, which correspond to motional resistances of 35 kΩ and 8.8 kΩ, respectively. Thus, the results indicate spring-hardening non-linear behavior since the Lamé-mode resonator is aligned with the <100> Si orientation. Therefore, a positive amplitude-frequency (A-f) coefficient (a) is associated with this resonator.

D4.B. Transimpedance Amplifier Characterization

The fully differential TIA was fabricated using a Taiwan Semiconductor Manufacturing Company (TSMC) 65 nm low-power process and consumes only 0.9 mA from 1-V supply. The total circuit layout area measures 130×225 µm² as depicted in FIG. 31. To obtain the frequency response of the TIA, S-parameters were measured using the VNA in a frequency range from 100 kHz to 1 GHz with an input power level of −45 dBm.

Figure 32B:
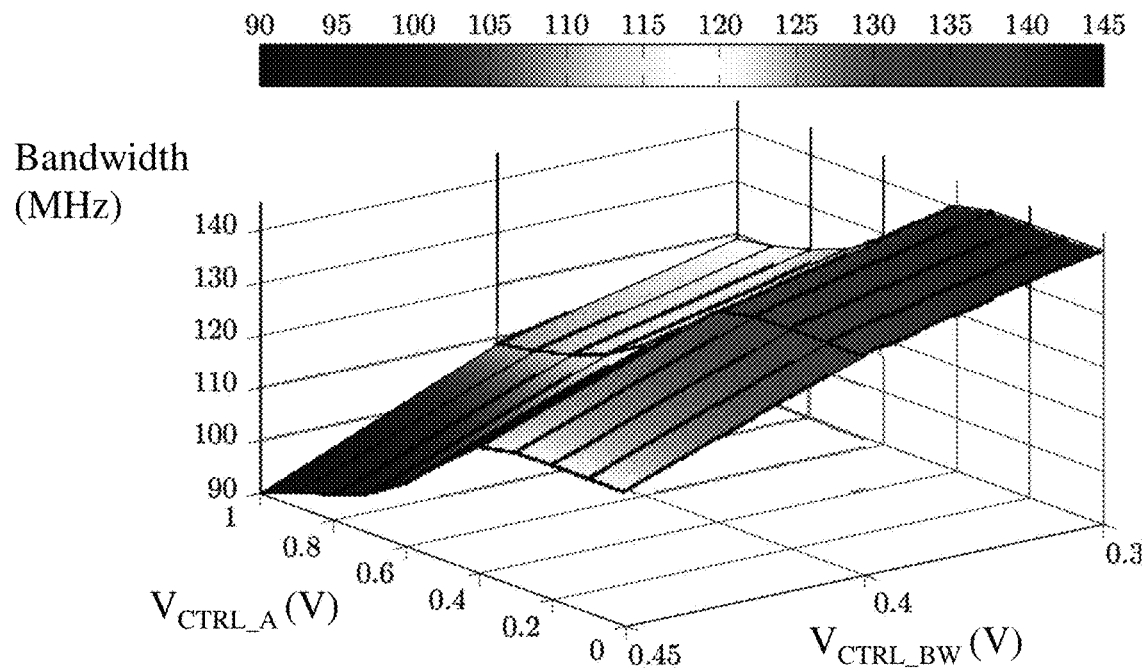

FIGS. 32A and 32B depict the transimpedance gain and the 3-dB bandwidth of the TIA, versus two control signals, $V_{CTRL\_A}$ and $V_{CTRL\_BW}$. The maximum achievable gain is 98 dBΩ with a bandwidth of 90 MHz. The bandwidth can be extended to 142 MHz when the gain is reduced to 83 dB. Control voltages can be varied independently in such a way that the gain and bandwidth are also independent from each other and since $V_{CTRL\_BW}$ varies from 0.35 V to 0.45 V the maximum gain variation (for the same $V_{CTRL\_A}$ value) is ~0.32 dB (FIG. 32A). The motional resistances of 35 kΩ and 8.8 kΩ, extracted from FIGS. 30A and 30B for $V_P$ of 100 V and 200 V, respectively, correspond to 91 dBΩ and 79 dBΩ, respectively, which can be covered by the maximum gain available of the proposed transimpedance amplifier.

Figure 33:
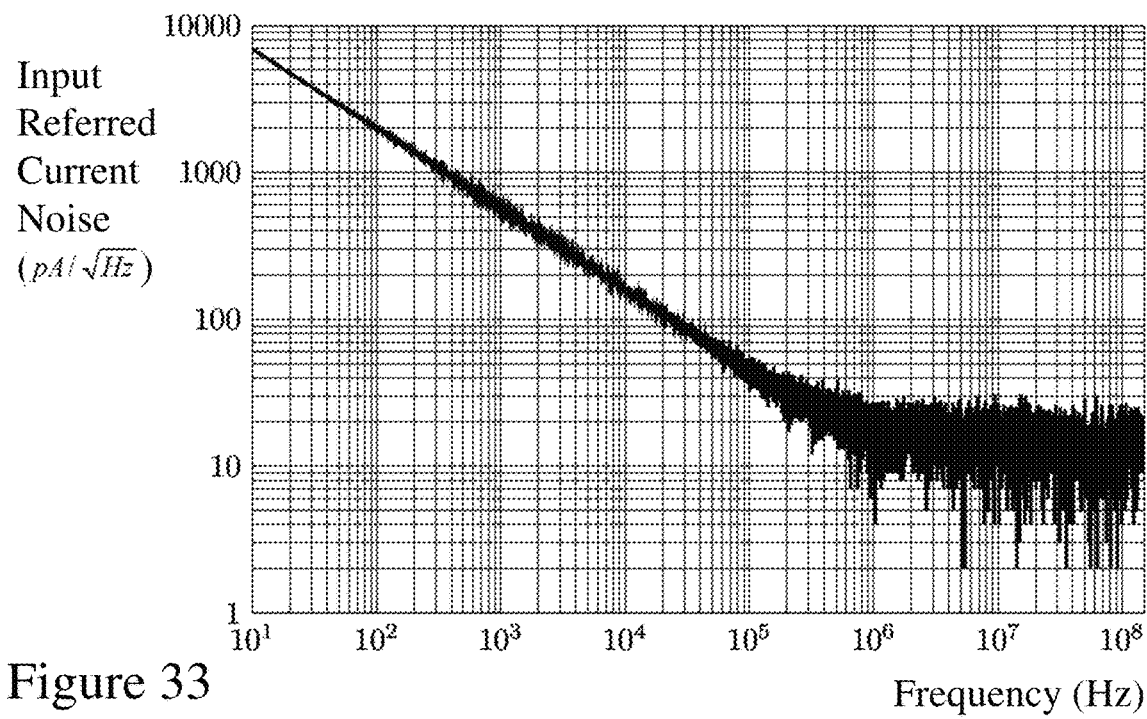
FIG. 33 depicts the measured input-referred current noise for the oscillator circuit according to an embodiment of the invention.

FIG. 33 depicts the input-referred current noise of the TIA measured with the spectrum analyzer across 220 MHz bandwidth. At low frequency range, the noise is dominated by the flicker noise. The white noise from TIA is buried under the flicker noise floor. The input current noise spectrum is flat in the frequency range from ~500 kHz to 200 MHz frequency range in which the input-referred noise is below 15 pA/√Hz.

Figure 34:
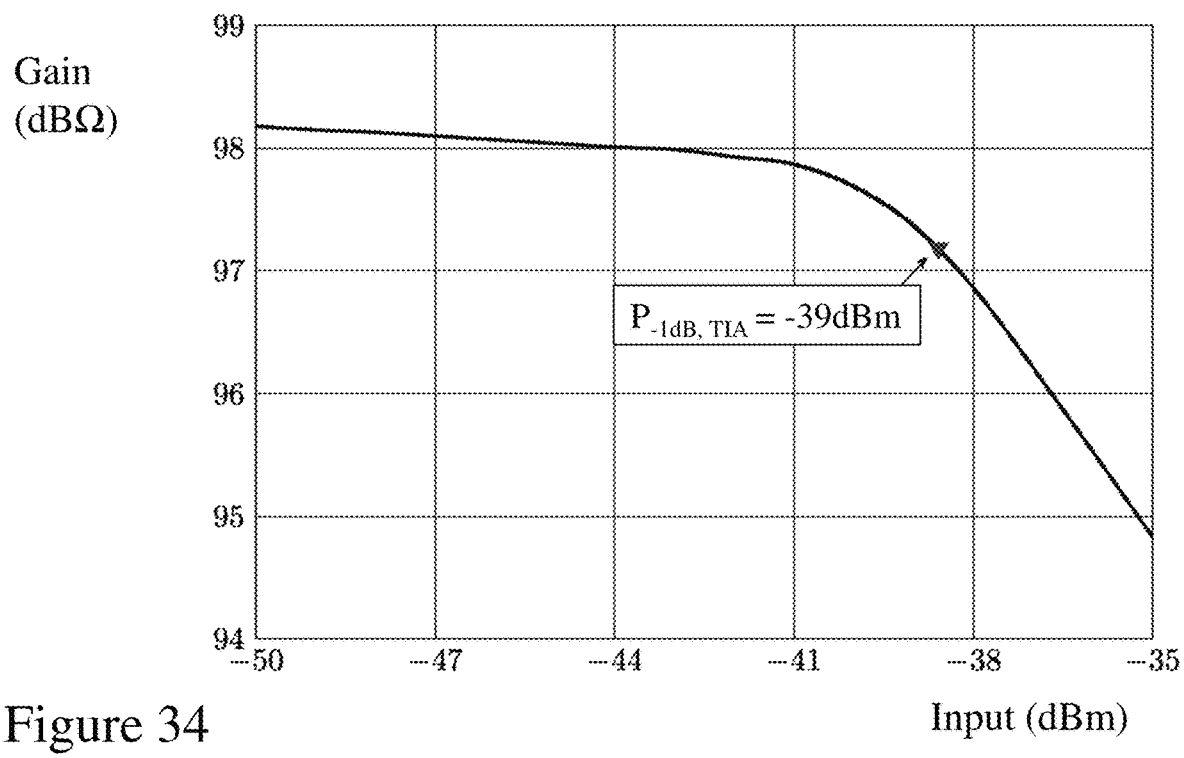
FIG. 34 depicts the measured TIA 1-dB compression point of the TIA within the oscillator circuit according to an embodiment of the invention.

FIG. 34 depicts the measured transimpedance gain for different input power levels varying from −50 dBm to −35 dBm. A value of available power of −39 dBm was recorded for the 1-dB compression point of the TIA. The performance parameters of the TIA are summarized in Table D1

TABLE D1

| Performance Parameters of the TIA | |
|---|---|
| Parameter | Meas. Value |
| Transimpedance Gain (dBΩ) | 98 |
| Bandwidth (MHz) | 142 |
| Input Impedance, $R_{IN}$ @ $f_0$ (Ω) | 89 |
| Output Impedance, $R_{OUT}$ @ $f_0$ (Ω) | 100 |
| Power Supply (V) | 1 |
| Power Consumption, $P_{DISS}$ (mW) | 0.9 |
| 1-dB Compression Point, $P_{1-dB}$ (dBm) | ~39 |
| Input Referred Noise @ $f_0$ (pA/√Hz) | 14.5 |
| Active Area (mm²) | 0.029 |
| Process | 65 nm CMOS |

D4.C. Oscillator Measurement

D4. C1 Open-Loop Measurements: To confirm that sufficient loop gain was present for the oscillation, the resonator was connected to the TIA in open-loop configuration under vacuum, and the frequency and phase responses were measured using the VNA. As illustrated in FIG. 31, the input and output ports of VNA were connected to the differential inputs of the resonator and the differential outputs of TIA, respectively, through an external baluns which are used to convert between single-ended and differential signals.

Figure 36:
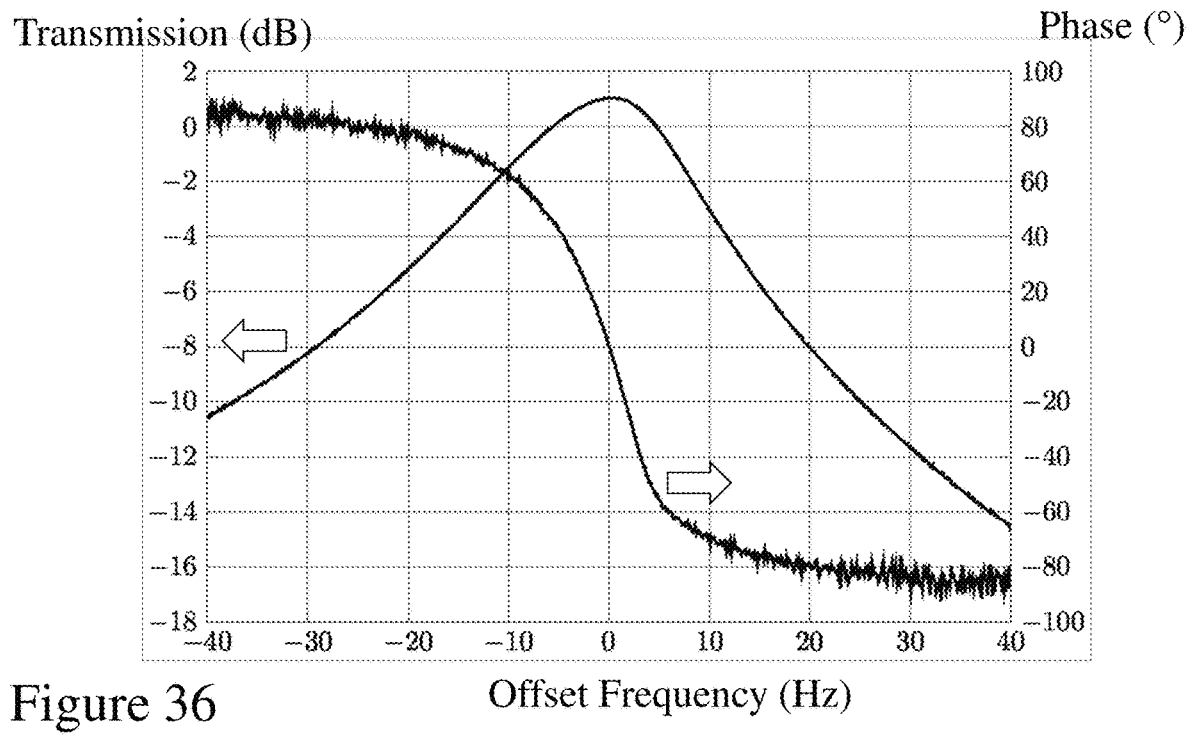
FIG. 36 depicts the measured open-loop gain and phase shift of the oscillator according to an embodiment of the invention under vacuum and bias.

To sustain oscillation in closed-loop, the conditions defined in Equations (D6) and (D7) are required where $\phi_{TOTAL}$ is the total phase shift and $Z_T$, $R_M$, and $R_{OUT}$ are the transimpedance gain, input, and output impedances of TIA, respectively. In this case, both resonator and TIA must have 0° phase shift. It is observed from FIG. 36 that the open-loop gain and phase shift at the resonant frequency of the resonator is higher than 0 dB and equal to 0°, respectively, as formulated in conditions defined by Equations (D6) and (D7), thus ensuring that oscillation could be sustained in closed-loop. Accordingly, the loaded Q-factor was measured from the open-loop gain bandwidth to be around 875 k.

$$\phi_{TOTAL} = 0°  \quad (D6)$$

$$Z_T \geq R_M + R_{IN} + R_{OUT} \quad (D7)$$

2) Closed-Loop Measurements:

The resonator and TIA were set in a closed-loop configuration (dashes lines in FIG. 31) and tested in air and under vacuum to determine the performance of the oscillator. The expression for oscillator phase noise is given by Equation (D8) where F represents the noise figure of the amplifier, $P_0$ is defined as the oscillation power, $f_m$ the offset frequency from the carrier frequency, $f_0$ represents the carrier frequency, $f_C$ is a constant related to 1/f noise corner of the oscillator and $Q_L$ denotes the loaded Q-factor and is defined as Equation (D9) where $Q_{UL}$ is the intrinsic Q-factor of the resonator.

$$\Im(f_m) = \frac{2FkT}{P_0} \times \left[1 + \left(\frac{f_0}{2Q_L f_m}\right)^2 \times \left(1 + \frac{f_C}{f_m}\right)\right] \quad (D8)$$

$$Q_L = Q_{UL} \times \frac{R_m}{R_m + R_{in} + R_{out}} \quad (D9)$$

Figure 35:
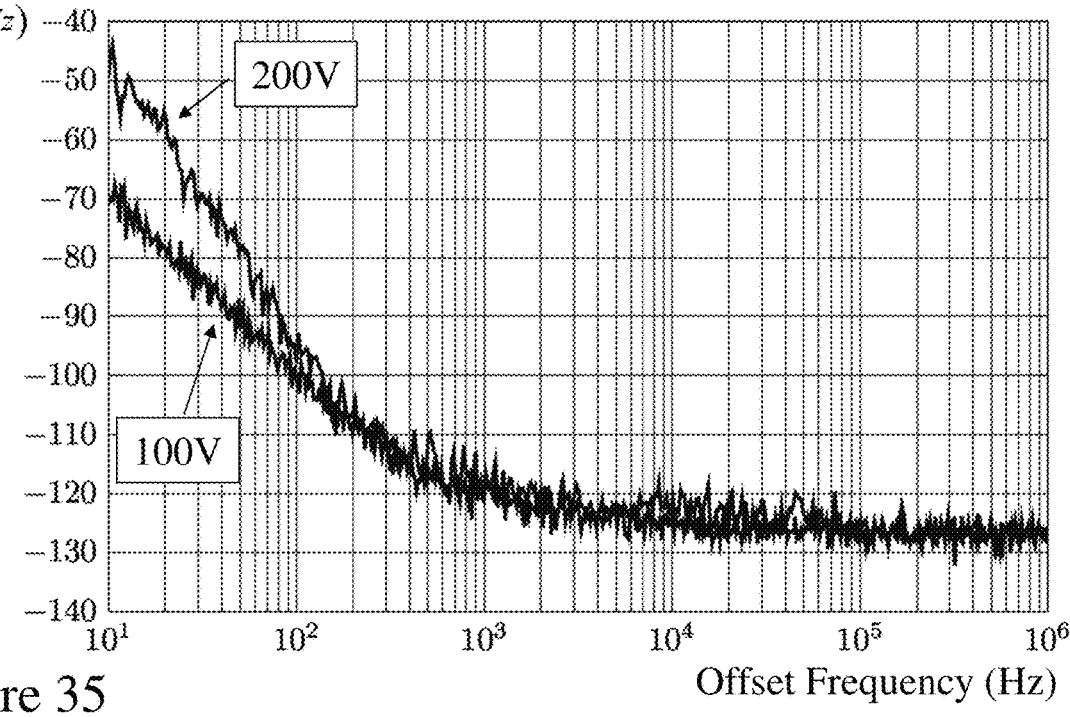
FIG. 35 depicts measured phase noise for two different bias settings of the MEMS resonator within the oscillator circuit according to an embodiment of the invention.
Figure 37:
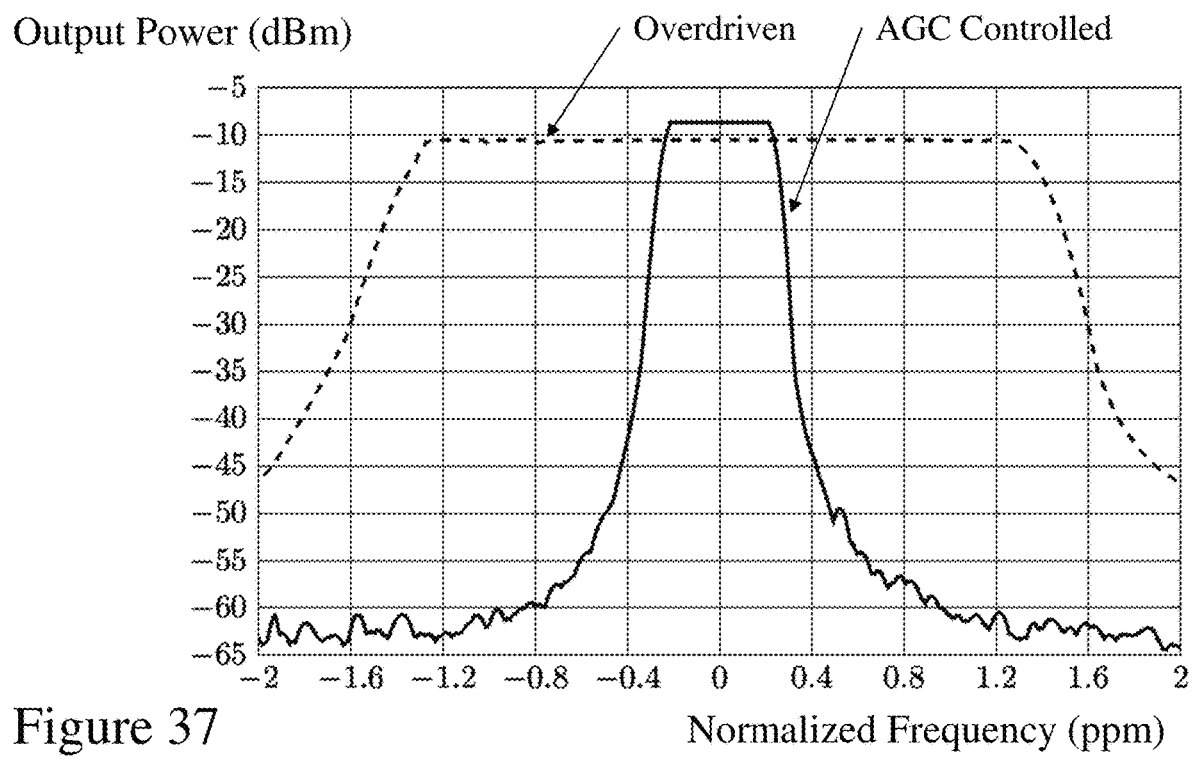
FIG. 37 depicts the oscillator signal short time stability averaged over a minute for a 17.93 MHz oscillator according to an embodiment of the invention.

The phase noise measurements of the oscillator under vacuum are plotted in FIG. 35 for 100 V and 200 V DC polarisation voltages, respectively. The near-carrier phase noise at 10 Hz offset was measured in air to be approximately −50 dBc/Hz and −70 dBc/Hz under vacuum, and at an offset of 1 kHz in air and under vacuum to be about −120 dBc/Hz. The phase noise floor reaches −127 dBc/Hz and is dominated by the TIA. The phase noise in the close-to-carrier region is improved by ∼20 dB when $V_P$ is increased. The non-linear effect on phase noise can be seen at a DC polarisation voltage of 200 V, where the close-in phase noise performance is dominated by resonator non-linearity and not the TIA flicker noise seen with a $V_P$=100V. Since the noise corner frequency is ∼20 kHz so that the 1/f² region is covered. These phase noise measurements translate in time-domain jitter values and the RMS integrated phase jitter (12 kHz-20 MHz) is equal to 14 ps. Short-term stability is one of important performance criteria of the oscillator and is a measure of its frequency stability. The short-term stability is expressed with phase-noise or jitter. Thus, the frequency stability of the resonator is illustrated in FIG. 37. The oscillator shows a broadening of the frequency spectrum over a one-minute time-span and so that the frequency stability is improved when AGC is used, from ±1.04 ppm to ±0.25 ppm.

For fair comparison, two figure-of-merits $FOM_1$ and $FOM_2$, are used to evaluate the overall performance in terms of phase noise and power consumption, phase noise floor and motional resistance, respectively. Their expressions are given by Equations (D10) and (D11) respectively where $\Im(f_m)$ is the oscillator phase noise at $f_m$, a specific offset frequency, $f_0$ is the center frequency, $P_{DISS}$ is the DC power consumption of the oscillator circuit (in mW). It can be noticed that the proposed $FOM_2$ is used to evaluate the spent effort on designing low phase noise TIA toward high resonator motional resistance. The calculated $FOM_1$ and $FOM_2$ values for oscillators based on electrostatic resonators are listed in Table D2. As can be seen, the MEMS-based oscillator demonstrated in this work has the best figure-of-merits $FOM_1$ and $FOM_2$ when compared with other oscillators based on electrostatic MEMS resonators illustrating the superior performance achieved here.

$$FOM_1 = \Im(f_m) - 20\log\left(\frac{f_0}{f_m}\right) + 10\log\left(\frac{P_{DISS}}{1 \text{ mW}}\right) \quad (D10)$$

$$FOM_2 = \frac{kT}{PN_{FLOOR} \times P_{DISS}} f_0^2 R_m^2 \quad (D11)$$

Accordingly, the inventors have demonstrated a MEMS oscillator based upon a Lamé-mode capacitive MEMS resonator and a novel fully differential high gain, which when fabricated in a TSMC 65 nm low-power process consumed 0.9 mW. An RGC amplifier was employed to provide the high gain, wide bandwidth and lower input impedance required for an oscillator based upon an electrostatic resonator. The TIA can reach a maximum gain of around 98 dBΩ and adjustable bandwidth with a maximum bandwidth of around 142 MHz and an input-referred current noise below 15 pA/√Hz in the mid-band. The TIA when integrated with the 18-MHz Lamé-mode MEMS resonator yielded an inventive MEMS oscillator achieving a phase noise of −120 dBc/Hz at 1 kHz offset and phase noise floor of −127 dBc/Hz and offers superior figure-of-merit relative to state-of-the-art devices in respect of power consumption and phase noise.

TABLE D2

Performance Comparison of Inventive Oscillator versus State-of-the-Art

|  | 1 | 2 | 3 | 4 | 5 | 6 | Invention |
|---|---|---|---|---|---|---|---|
| CMOS [μm] | 0.35 | 0.35 | 0.18 | 0.18 | 0.35 | 0.35 | 0.065 |
| Gap [nm] | 1500 | 80 | 200 | 50 | 600 | 100 | 2000 |
| Center frequency, $f_0$ | 20 | 61.2 | 103 | 18 | 1.18 | 10.92 | 17.93 |
| Pressure | vac. | air | air | vac. | vac. | vac. | vac. |
| Quality factor, Q | 160,000 | 48,000 | 80,000 | 8,000 | 3,029 | 1,092 | 889,539 |
| Motional Resistance, $R_m$ [kΩ] | 65 | 1.5 | 5 | 76.9 | 700 | 6 | 20 |

TABLE D2-continued

Performance Comparison of Inventive Oscillator versus State-of-the-Art

| | 1 | 2 | 3 | 4 | 5 | 6 | Invention |
|---|---|---|---|---|---|---|---|
| Polarisation Voltage, $V_P$ [V] | 26 | 12 | 18 | 2.5 | 45 | 5 | 100 |
| AGC Circuit | Yes | No | Yes | No | Yes | No | Yes |
| Power supply, $V_{DD}$ [V] | 2.5 | 3.3 | 1.8 | 1.8 | 2.5 | 3.3 | 1 |
| Power consumption, $P_{DISS}$ [mW] | 6.9 | 0.95 | 2.6 | 5.9 | 1.3 | 0.35 | 0.9 |
| PN @ 1 kHz [dBc/Hz] | −105 | −100 | −108 | −116 | −112 | −80 | −120 |
| PN Floor [dBc/Hz] | −131 | −130 | −136 | −130 | −120 | −96 | −127 |
| $FOM_1$ @ 1 kHz [dB] | −183 | −196 | −204 | −193 | −172 | −165 | −205 |
| $FOM_2$ [$Hz^2 \Omega^2$] | $3.6 \times 10^{17}$ | $1.7 \times 10^{19}$ | $1.3 \times 10^{19}$ | $2.2 \times 10^{18}$ | $1.2 \times 10^{19}$ | $1.9 \times 10^{14}$ | $3.8 \times 10^{19}$ |

Notes:
1. Breathe-mode ring resonator.
2. 60 MHz wine-glass MEMS resonator.
3. 100 MHz bulk acoustic wave MEMS resonator.
4. 17.6 MHz capacitive MEMS resonator.
5. Monolithically integrated CMOS with tuning fork MEMS resonator.
6. Side supported flexural-mode disk resonator array.

E: MEMS Oscillator Based on Differential Adjustable-Bandwidth TIA and Piezoelectric Disk Resonator E1. Introduction MEMS resonators can be operated through two main widespread actuation mechanisms: piezoelectric or capacitive. Piezoelectric actuation generally provides high electromechanical transduction efficiencies and low signal transmission losses, resulting in low motional resistances, which is advantageous as it simplifies the design constraints of the associated electronic circuitry and results in lower power consumption. Also, piezoelectric devices do not require any DC voltage for operation. However, piezoelectric devices generally suffer from lower quality factors, which can deteriorate the phase noise of the oscillator. Resonators can also be classified based on their vibration modes as either flexural or bulk mode devices. Bulk mode devices typically exhibit high stiffness, and are consequently less prone to thermoelastic damping and consequently achieve large quality factors, even at atmospheric pressure. Within the prior art a disk resonator combining bulk resonance with piezoelectric actuation to achieve a desirable combination of low motional resistance, high frequency and quality factor without requiring any DC voltage for operation. The resonator was realized in a commercial silicon on insulator (SOI) technology.

In order to implement an oscillator with a MEMS resonator, a transimpedance amplifier (TIA) needs to be interfaced with the resonator in a positive feedback loop to sustain a steady-state oscillation by converting the resonator driving current to an output voltage signal [8], [12]. The sharpness and quality of the output oscillation is usually determined by the quality factor of the resonator and the contributed noise of the TIA. To sustain oscillation, it is necessary for the TIA to have high transimpedance gain due to the resonator insertion loss caused by its motional resistance. Large bandwidth is also required to ensure that the oscillator phase shift at the resonance frequency is around 0°, when the MEMS oscillator operates in series resonance mode [13]. Furthermore, low input and output impedances are required to minimize the resonator Q-factor loading. Several transimpedance topologies have been reported in the literature for use in MEMS oscillators with the majority of designs being based on regulated cascode topologies whilst other methodologies include an inverting amplifier topology and a current preamplifier.

Furthermore, most TIAs use a single-ended architecture and gain-bandwidth (GBW) product enhancement techniques so that TIA performance in terms of input-referred noise and power consumption will be improved. However, singled-ended TIAs demonstrate inferior noise performance than that of fully differential TIAs. Differential topologies can benefit of common-mode noise rejection and even harmonics rejection, and therefore, are more desired in applications requiring low noise operation.

The inventors have established a novel MEMS oscillator employing a piezoelectric MEMS resonator which is driven directly and differentially by the TIA forming the closed feedback loop required to provide the MEMS oscillator.

E2. Piezoelectric Disk Resonator

Figure 38:
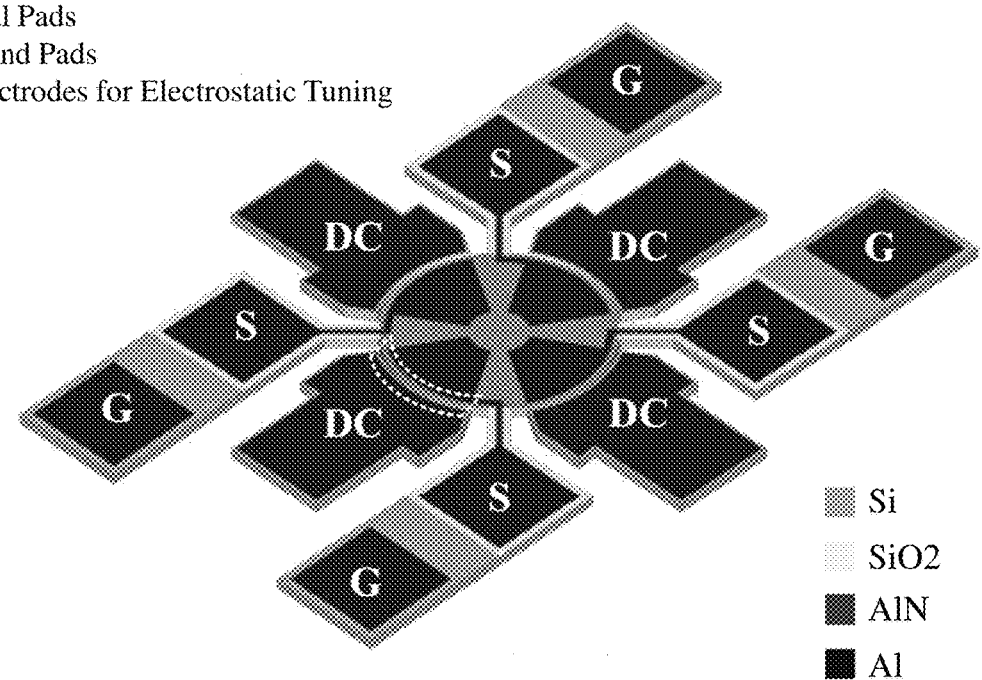
FIG. 38 depicts a simplified diagram of the disk resonator outlining the pads used for differential piezoelectric driving by the TIA and the pads used for electrostatic tuning according to an embodiment of the invention.

The resonator employed is a disk structure excited through piezoelectric actuation as depicted in FIG. 38. The device is composed of a single-crystalline silicon central disk structure acting as the main resonant structure, for example 10 μm thick and 200 μm diameter. This is covered by a 0.5 μm layer of aluminum nitride (AlN), the piezoelectric material used for transduction. The disk structure is supported by four suspension beams, each having a width of 10 μm, the minimum allowed by the design rules of the commercial MEMS fabrication technology employed (PiezoMUMPs™), with 90° angular spacing in order to correspond with the nodal points of the resonance mode of the disk. The support beams are anchored to the substrate at their ends and mechanically connected to the electrical pads. Each of these supports is associated with a pair of pads, one for the signal routed above the piezoelectric layer, and the other for the ground, routed through the underlying silicon structural layer. In order to implement this an aluminum layer above the disk structure is patterned into four distinct quadrants, in order to match the strain distribution and yield differential input/output ports. Each electrode is electrically connected to a distinct signal pad by an aluminum track routed above its respective suspension beam. The conductive structural silicon layer itself acts as the ground plane of the device, and connects with each ground pad while remaining electrically insulated from the signal track by a layer of silicon dioxide. Aluminum nitride is not present on the supports in order to avoid any unintended transduction which would alter the resonance mode and possibly lead to undesirable spurious modes of vibration. Capacitive electrodes are placed around the disk structure for optional electrostatic tuning of the resonance frequency, based on the electrostatic spring softening phenomenon.

E3. TIA Circuit Design

Figure 39:
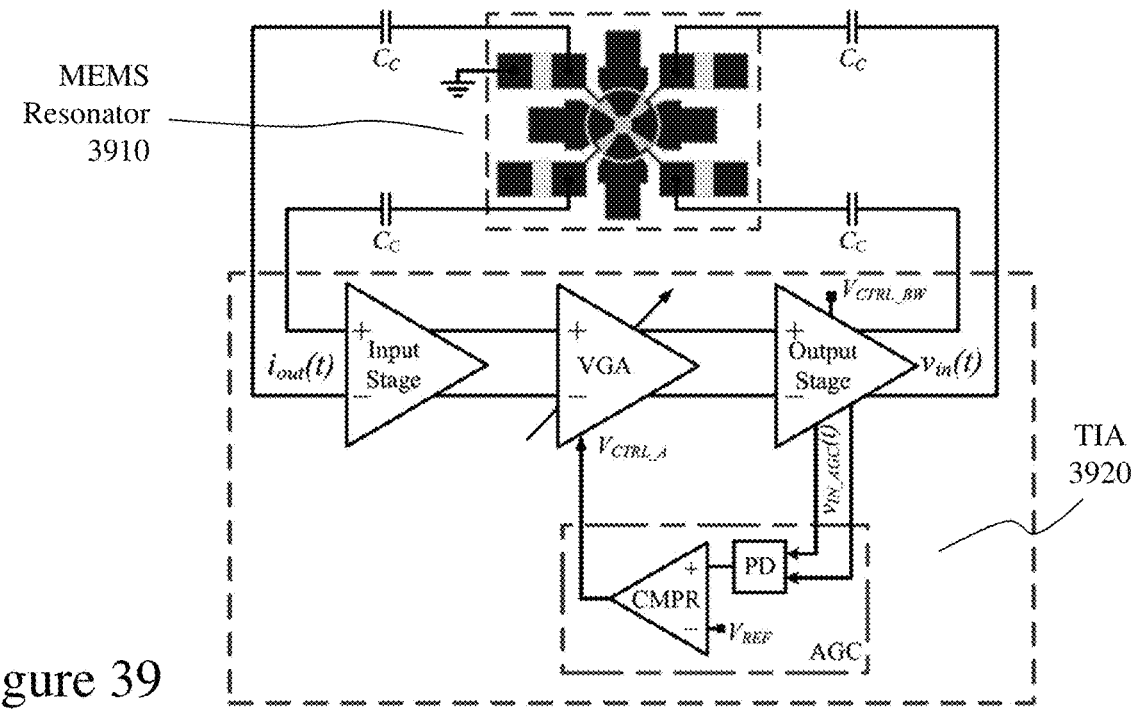
FIG. 39 depicts a MEMS oscillator functional diagram according to an embodiment of the invention.

The transimpedance amplifier circuit (TIA) 3920 according to an embodiment of the invention is depicted in FIG. 39 and is composed of three fully differential stages: i) an input stage followed by ii) a variable gain amplifier (VGA) and iii) an output stage based on a super source follower (SSF). An automatic gain control circuit (AGC) based on a peak detector (PD) and comparator (CMPR) is also included to regulate the oscillation amplitude and reduce the exertion of the resonator's mechanical non-linearity, thereby improving the oscillator frequency stability. The design is undertaken while ensuring sufficient drive capability to support an off-chip resonator in order to facilitate testing. The TIA 3920 is coupled to the MEMS resonator 3910.

The complete schematic of the TIA circuit is shown in FIG. 40 in which the biasing and common-mode feedback (CMFB) circuits are not shown. The TIA provides low input impedance ($R_{in}$) and low output impedance ($R_{OUT}$) so as to compensate a large parasitic interconnect capacitance ($C_P$=4 pF) and push the dominant pole far beyond the oscillation frequency, while reducing the loading on the resonator's quality factor. This translates into a high GBW product requirement for the TIA.

E3.A. TIA Input Stage

The input stage should be carefully designed in such a way to satisfy several criteria. Besides the high GBW product criterion, tradeoffs between lower input impedance, power consumption and current noise are also other key performance parameters to be considered when designing the input stage. Three input stage topologies were selected to be compared with the proposed input stage by means of circuit performance simulations using the SpectreRF simulator in a CMOS 65 nm technology. The first design was based on the $g_m$-boosted common-gate (CG) topology, known as regulated cascode (RGC) input stage. The second topology is the common source feedback (CSFB) amplifier which is used to amplify current and which enhances the bandwidth by reducing the size of the load resistance. The third design considered employs a capacitive-feedback current amplifier which drives current into an active load. The input-referred noise of this configuration is expected to be very low because of the absence of noise sources directly at the input.

TABLE E1

Simulated Input Stage Performance Comparison with Target Transimpedance Gain of 78 dBΩ (Shunt Parasitic Capacitance $C_P$ = 4 pF

| Specification | RGC | Cap. FB | CSFB | Invention |
|---|---|---|---|---|
| BW [MHz] | 197 | 96 | 246 | 264 |
| Power [µW] | 161 | 168 | 190 | 180 |
| $R_{IN}$ [Ω] | 76 | 4406 | 74 | 69 |
| Noise @ $f_0$ [pA/√Hz] | 5.05 | 0.89 | 8.86 | 3.35 |
| $FOM_1$ | 25.34 | 1.16 | 15.67 | 38.95 |

Each topology was simulated with an additional shunt parasitic capacitance of $C_P$=4 pF, and to make a representative comparison of performance, the transimpedance gain was adjusted to be equal (~78 dBΩ). A normalized figure-of-merit is used to evaluate the overall performance of the TIA input stage, and is given by Equation (E1). According to Table E1, the capacitive feedback topology exhibits the lowest input-referred current noise, while the CSFB topology exhibits excessive noise. The gain of the RGC input stage is limited by the large load resistor due to the large DC voltage drop across it. The large gain and bandwidth of the CSFB topology can be readily set. However, the limitation of this topology comes from the noise performance. The capacitive feedback topology benefits from current pre-amplification, and the transimpedance gain can be high with a smaller load resistor, unlike resistive feedback topologies. The major drawback of the capacitive feedback topology is that its input impedance is very high at the resonant frequency, which will load a resonator's Q-factor.

$$FOM_1 = \frac{\text{Gain}[\Omega] \times BW[\text{MHz}]}{P_{DC}[\mu W] \times \text{Noise} @ f_0 [\text{pA}/\sqrt{\text{Hz}}] \times R_{IN}[\Omega]} \quad (E1)$$

Figure 40A:
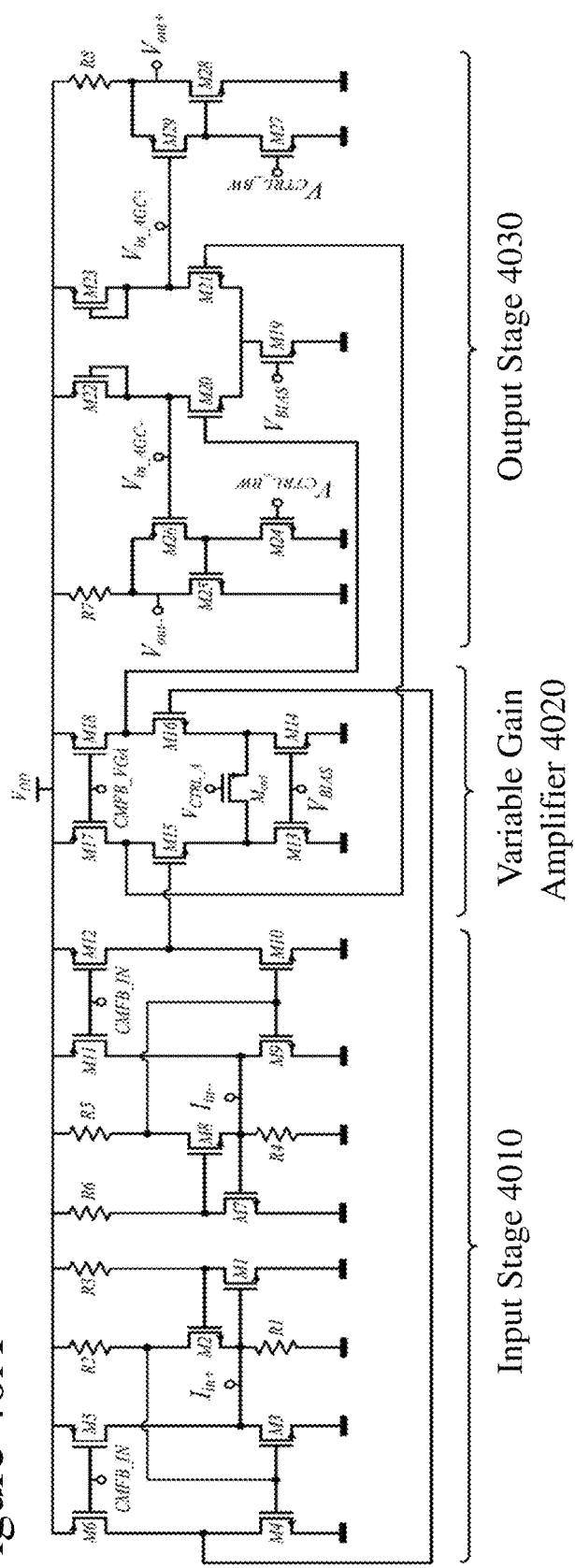
FIGS. 40A and 40B depict circuit schematics of a fully differential transimpedance amplifier (TIA) design according to an embodiment of the invention and automatic gain control (AGC) circuit according to an embodiment of the invention coupled to the piezoelectric resonator.

In order to benefit from lower input impedance while extending transimpedance gain and bandwidth, the proposed input stage is based on modified versions of the RGC and CSFB topologies by using active feedback, as shown in FIG. 40A.

1) Input Impedance:

According to the small-signal analysis, the single-ended low-frequency input impedance of the proposed circuit is given by Equation (D2) where $R_{IN,RGC}$ is the input impedance of the RGC circuit and is given by Equation (D3) where $g_{m1}$, $g_{m2}$, and $g_{m3}$ are the transconductance of transistors M1, M2, and M3 respectively. As indicated by Equation (E2) the input impedance of the input stage is (1+$R_2 g_{m3}$) times smaller than an RGC input stage.

$$R_{IN} = \frac{1}{R_{IN,RGC} \times (1 + R_2 g_{m3})} \quad (E2)$$

$$R_{IN,RGC} = \frac{1}{g_{m2} \times (1 + R_2 g_{m3})} \quad (E3)$$

2) Transimpedance Gain:

The expression for the input stage transimpedance gain is given by Equation (E4) where $C_{IN}$ and $C_{OUT}$ are the total input and the output capacitances of the input stage, respectively, $C_1$ is the equivalent capacitance between the drain of M1 and gate of M2, $C_2$ is the equivalent capacitance between the drain of M2 and gate of M3/M4, and $R_{O,IN}$ is the output impedance of the input stage which is given by $R_{O,IN} = r_{O,4} \, r_{O,6}$ where $r_{O,4}$ and $r_{O,6}$ are the output resistances of transistors M4 and M6, respectively. The DC transimpedance gain can then be expressed by Equation (E5) where $g_{m4}$ is the transconductance of transistor M4.

$$Z_T(s) \cong \frac{\left(\frac{R_{IN,0} g_{m4}}{g_{m3}}\right)\left(1 + s\frac{R_3 C_1}{1 + R_3 g_{m1}}\right)}{(1 + sR_{IN}C_{IN})(1 + sR_3 C_1)} \quad \text{(E4)}$$
$$(1 + sR_2 C_2)(1 + sR_{O,IN}C_{OUT})$$

$$Z_T(0) \cong \frac{R_{OUT} g_{m4}}{g_{m3}} \quad \text{(E5)}$$

3) Bandwidth:

It can be seen from Equation (E4) that the 3-dB bandwidth of the input stage is limited by the dominant pole appearing at the drain of transistor M2 and is given by Equation (E6) where $C_{jd,i=\{2,3,4\}}$ are the gate-drain capacitances of transistors M2, M3 and M4, respectively, and $C_{gs3}$ is the gate-source capacitance of transistor M3. The local feedback of the input stage creates a zero at a frequency given by Equation (E7).

$$f_{-3dB} \cong \frac{1}{2\pi R_2 \times \left[C_{gd2}\left(1 + \frac{R_1}{R_2}\right) + C_{gs3} + C_{gd3} + C_{gd4} g_{m3} r_{O,4}\right]} \quad \text{(E6)}$$

$$f_z = \frac{1 + R_3 g_{m1}}{2\pi R_3 C_1} \cong \frac{g_{m1}}{2\pi C_1} \quad \text{(E7)}$$

To keep the zero far away from the dominant pole the transconductance $g_{m1}$ of transistor M1 should be increased, i.e. increasing its width. However, increasing the width of M1 will significantly increase capacitance $C_1$, specifically the equivalent capacitance of the drain of M1, and will reduce the zero frequency. Instead, capacitance $C_1$ can be lowered by reducing the width of transistor M2 to decrease the equivalent capacitance at its gate. This will affect the input impedance of the RGC stage as given in Equation (3) since the transconductance $g_{m2}$ of transistor M2 will be decreased. However, this will not critically affect the input impedance of the RGC stage or the input stage since $g_{m2}$ is proportional to $\sqrt{(W/L)_2}$, while its gate capacitance is linearly proportional to $(WL)_2$. On the other hand, decreasing the input impedance amounts to increasing $(1+R_2 g_{m3})$ or $(1+R_3 g_{m1})$. The former will affect the TIA DC gain and the input stage bandwidth. Therefore, increasing $R_3$ is selected as the method for input impedance reduction.

4) Noise Analysis:

The input-referred current noise is an important performance parameter to be considered when designing the proposed TIA. It can be used to provide a representative comparison between different circuit topologies (see Table E1). Since the noise is mostly contributed by the input stage, then the noise of the other stages can be neglected to simplify the analysis. Therefore, a noise analysis was carried-out based upon assuming shot noise and flicker noise are ignored and that all noise sources are uncorrelated, the input-referred current noise for the input stage is calculated and its expression is given by Equation (E8) where γ is the noise coefficient, k is Boltzmann's constant, T the absolute temperature and $g_{d0,i=\{1-6\}}$ are the zero-bias drain conductances of transistors M1-M6, respectively.

$$\overline{i_{n,in}^2} = 4kT\left(\frac{1}{R_1} + \gamma \cdot g_{d0,3}\right) + \frac{4kT\gamma\omega^2 C_{OUT}^2}{g_{m4}^2}(g_{d0,4} + g_{d0,6}) + \quad \text{(E8)}$$

$$\frac{\omega^2(C_1 + C_2)^2}{g_{m2}^2}\left(\gamma g_{d0,2} + \frac{1}{R_2}\right) + \frac{4kT\left(\frac{1}{R_1^2} + \omega^2 C_{IN}^2\right)}{\left(g_{m1} + \frac{1}{R_3}\right)}\left(\gamma \cdot g_{d0,1} + \frac{1}{R_3}\right)$$

From Equation (E8), the noise can be analysed as follows: the thermal noise and the channel thermal noise contributions from $R_1$ and M3, respectively, are directly applied to the equivalent input noise. As the frequency increases, the noise is dominated by terms containing $\omega^2$. Therefore, to achieve a low noise, resistor R, need to be increased and it is preferable to keep the size of transistor M3 as small as possible to maintain lower input-referred noise as well as higher transimpedance gain and bandwidth performance. However, reducing the size of M3 can increase the input impedance of the TIA, as mentioned earlier, and increasing $R_3$ can compensate the effect of reducing the size of M3, thereby achieving an overall compromise of performance.

E3.B. Variable Gain Amplifier

The variable gain amplifier shown in FIG. 40A is based on a differential pair amplifier in which transistors M15 and M16 form the input pair and M17 and M18 act as active loads to provide high gain. The source degeneration transistor $M_{CTRL}$ is used in the triode region in order to linearly tune the gain of the VGA over a large range through control voltage $V_{CTRL\_A}$. Assuming that the output resistances of transistors M14 and M16 ($r_{O14}$ and $r_{O16}$) are sufficiently large, the gain of VGA can be expressed as given by Equation (E9) where $r_{O18}$, $g_{m15}$ and $g_{ds,ctrl}$ are the output resistance of transistor M18, transconductance of transistor M15, and the conductance of the source degeneration transistor $M_{ctrl}$ respectively. Evidently, if $g_{m15} \gg g_{ds,ctrl}$, the gain of the VGA can rewritten as Equation (E10) where $k_{n,ctrl}$, $V_{GS,ctrl}$, and $V_{TH,ctrl}$ are the transconductance parameter, gate-source voltage, and threshold voltage of transistor $M_{ctrl}$, respectively. Consequently, source degeneration transistor $M_{ctrl}$ can linearly control the VGA gain through control voltage $V_{CTRL\_A}$.

E3.C. Output Stage

The output stage shown in FIG. 40A is based on the SSF topology. The SSF is formed by transistors M24-M29 and resistors R7 and R8 to drive the fully differential resonator, and it is characterized by a small output impedance in order to avoid loading the resonator's Q-factor. The SSF is preceded by a differential pair amplifier. Transistors M20 and M21 form the input pair and are loaded by diode connected transistors M22 and M23. The outputs of this differential pair are connected to the input of the AGC circuit for the gain control loop, enhancing its sensitivity. The gates of transistors M24 and M27 are controlled by voltage $V_{CTRL\_BW}$ so that TIA bandwidth can be adjusted to yield the optimal phase loop characteristic, as described in section E4-C1.

The gain of the SSF is given by Equation (E11) where $g_{m24}$ and $g_{m26}$, $r_{O25}$ and $r_{O26}$ the transconductances and output resistances of transistors M25 and M26, respectively.

As can be seen in Equation (E11), if $g_{m26}r_{O26} \gg 1$ and $(R_7 \| r_{O25})$ is sufficiently large, the gain of SSF will be close to 1 V/V. The output impedance of the super source follower is given by Equation (E12) where $r_{O24}$ is the output resistance of transistor M24. The output resistance of the SSF is reduced by a factor of $(r_{O26} \times g_{m25})$ in comparison to the conventional source follower, whose output resistance is $\sim 1/g_m$. This enhancement of the output resistance is due to the negative feedback through transistor M25.

E3.D. Automatic Gain Control Circuit

Figure 40B:
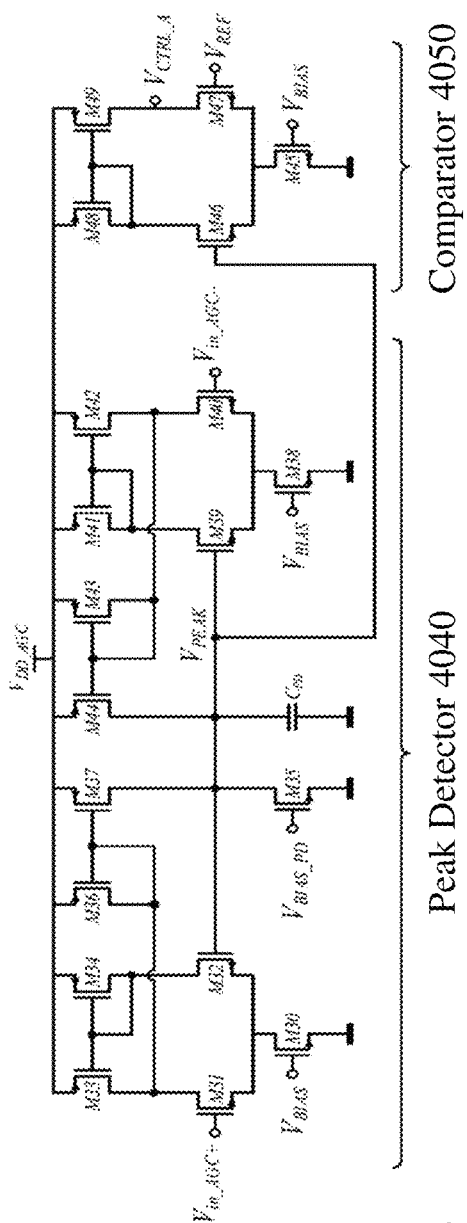

The schematic of the automatic gain control circuit is shown in FIG. 40B. The first stage consists of a differential positive peak detector that monitors the output nodes of the differential pair composed of M20-M21. The peak detector is based on a differential amplifier (M31-M34) and a current mirror (M36 and M37). Transistor M35 is used a small current sink to discharge capacitor $C_{PD}$. The peak of the signal is then compared to an amplitude reference ($V_{REF}$), and the resulting difference is integrated to control the TIA'S gain through ($V_{CTRL\_A}$) connected $M_{ctrl}$.

E4. Experimental Results

Figure 41:
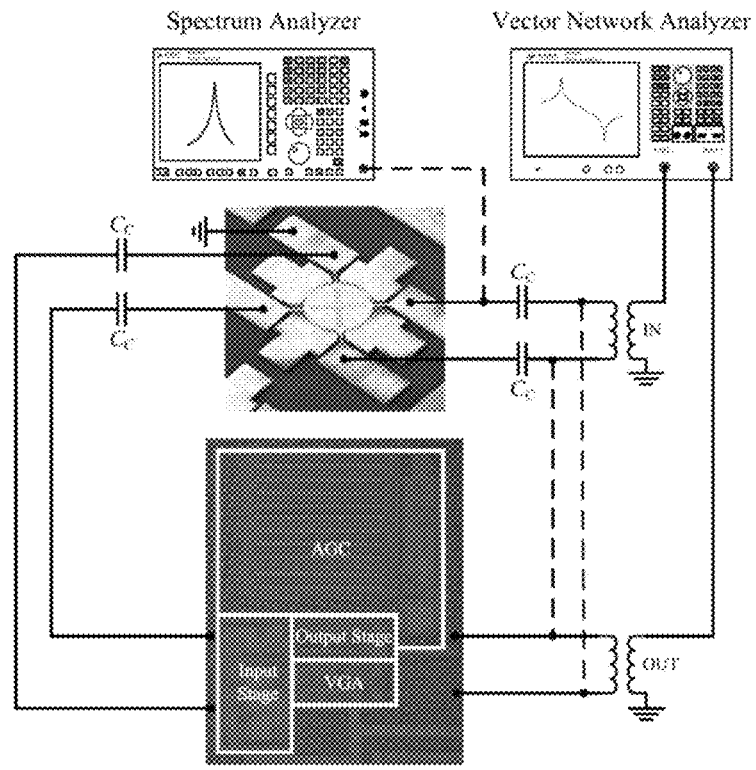
FIG. 41 depicts an exemplary test setup for a MEMS-based oscillator according to an embodiment of the invention in open and closed loop configurations with a micrograph of the TIA and resonator dies.

Two test configuration setups, shown in FIG. 41, were used to characterize the MEMS oscillator: i) the open-loop configuration (solid line) and ii) the closed-loop (dashed line). A vector network analyzer (VNA) was used to measure the two-port S-parameters of the resonator and TIA and as well as the oscillator in open-loop in order to obtain the frequency response. The oscillation spectrum and phase noise were measured with a spectrum analyzer.

E4.A. Resonator Characterization

Figure 42A:
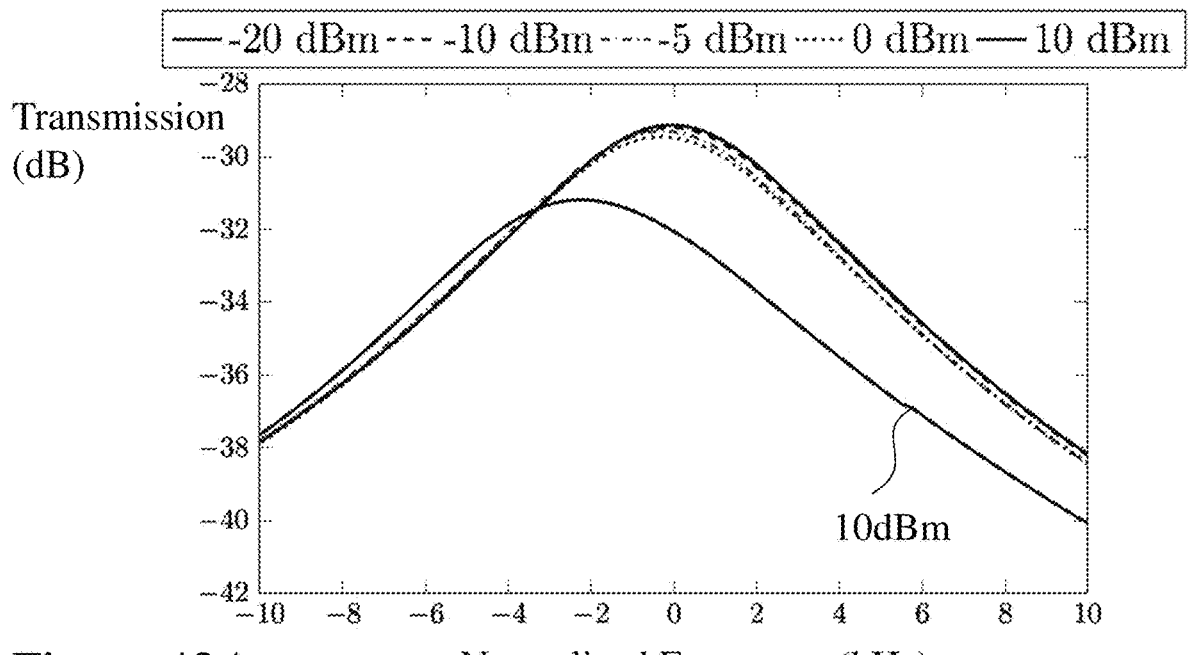
FIGS. 42A and 42B depict normalized resonator transmission characteristics for different input amplitude levels under atmospheric pressure and vacuum respectively for a resonator according to an embodiment of the invention.
Figure 42B:
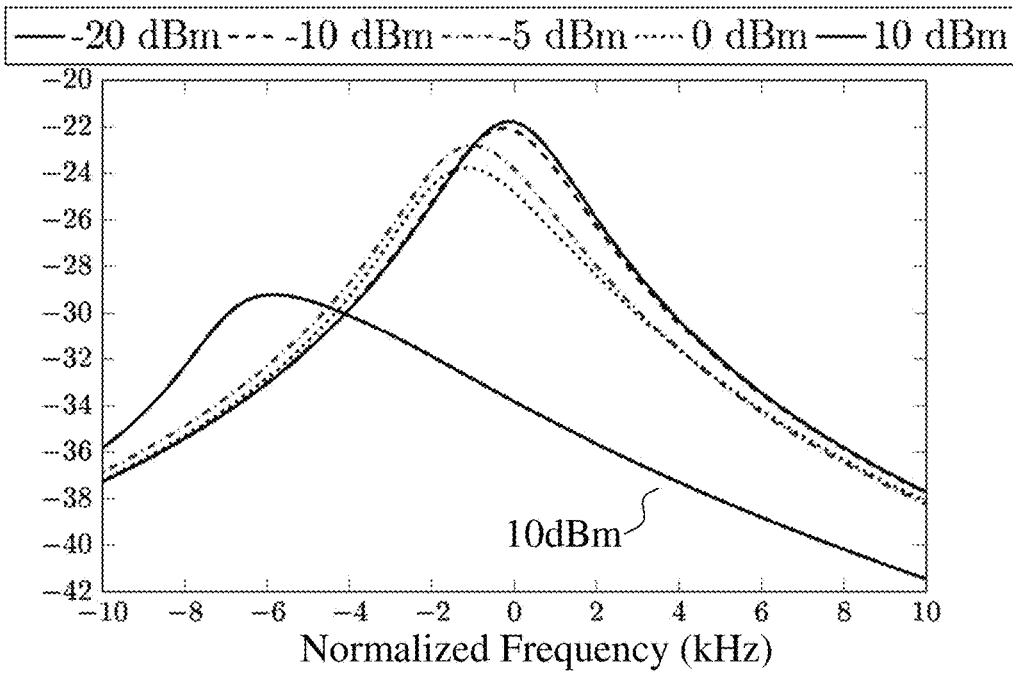
Figure 43:
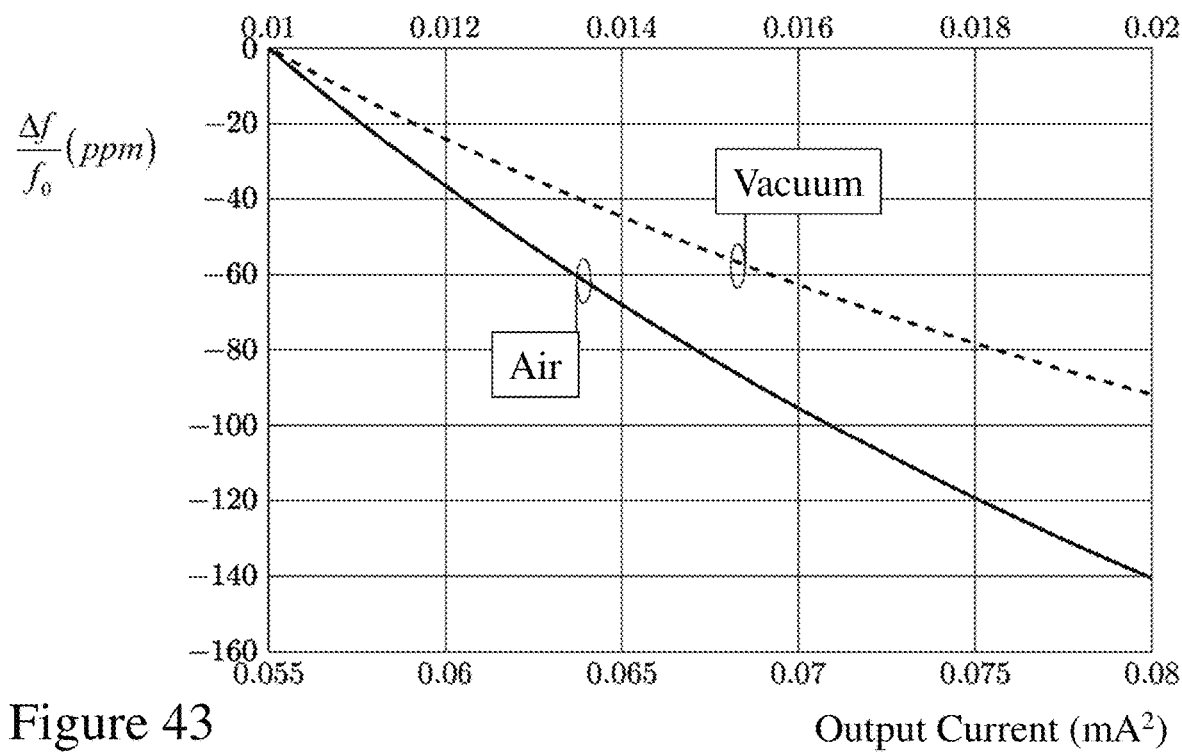
FIG. 43 depicts measured relative resonant frequency shift of the resonator according to an embodiment of the invention as a function the square of the output current under atmospheric pressure and air.

The frequency response of the resonator was measured in differential configuration with the VNA in air as well as under a vacuum level of 100 mTorr. Different input power levels starting from −20 dBm up to +10 dBm were applied to the resonator. FIGS. 42A and 42B depict the transmission characteristic curves normalized to the center frequency of 14.42 MHz with a Q-factor of 4900 under vacuum and 1950 in air. The maximum insertion loss in air and under vacuum is of −29 dB and −22 dB, respectively, which corresponds to a motional resistance of 1.2 kΩ and 0.9 kΩ, respectively. Thus, the results indicate spring-softening non-linear behavior stemming from the negative amplitude-frequency (A-f) coefficient (a) associated with this resonator. The amplitude-frequency coefficient can be defined as given by Equation (E13) where $\Delta f/f_0$ is the relative resonant frequency shift and $I_d$ is the RMS drive current through the resonator. From FIG. 43 the A-f coefficient was calculated in air and under vacuum to be −45 ppm/mA$^2$ and −12 ppm/mA$^2$, respectively.

Figure 44:
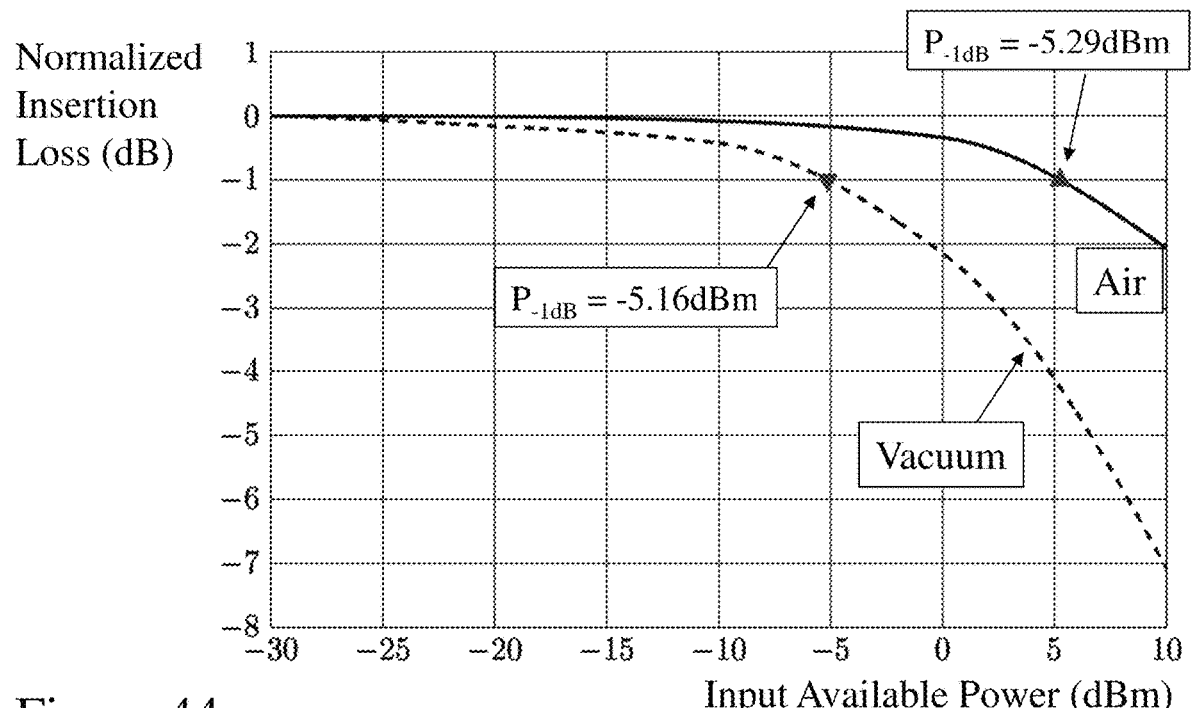
FIG. 44 depicts measured resonator power handling for a resonator according to an embodiment of the invention under atmospheric pressure and vacuum.

As can be seen in FIG. 44, the power-handling capability which corresponds to the critical vibration amplitude of the resonator was also characterized by measuring its 1-dB compression point. The 1-dB compression points in air and under vacuum were measured to occur at available input powers of 5.29 dBm and −5.16 dBm respectively. These are equivalent to a 0.32 mA and 0.14 mA RMS drive current in the resonator, respectively.

E4.B. TIA Characterization

The fully differential TIA is fabricated in a TSMC 65 nm CMOS process and consumes 1.4 mA from a 1-V supply. The circuit active area measures 150×220 μm$^2$, and is shown in FIG. 41. To obtain the frequency response of the TIA, S-parameters were measured using the VNA. The network analyzer input power level was set to −45 dBm and the S-parameters were taken from 100 kHz to 1 GHz. The transimpedance gain ($Z_T$) is calculated from the S-parameter characteristics as Equation (E14) where $Z_0$ represents the 50Ω transmission line impedance.

Figure 45A:
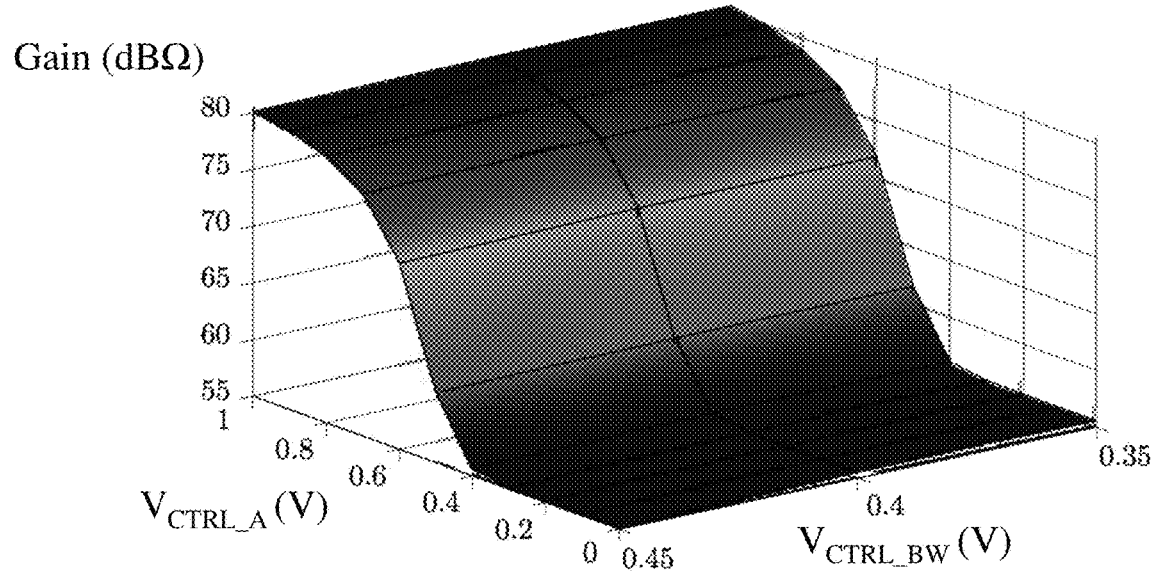
FIGS. 45A and 45B depict measured TIA transimpedance gain and 3-dB bandwidth respectively for an oscillator circuit according to an embodiment of the invention versus varying control voltage levels.
Figure 45B:
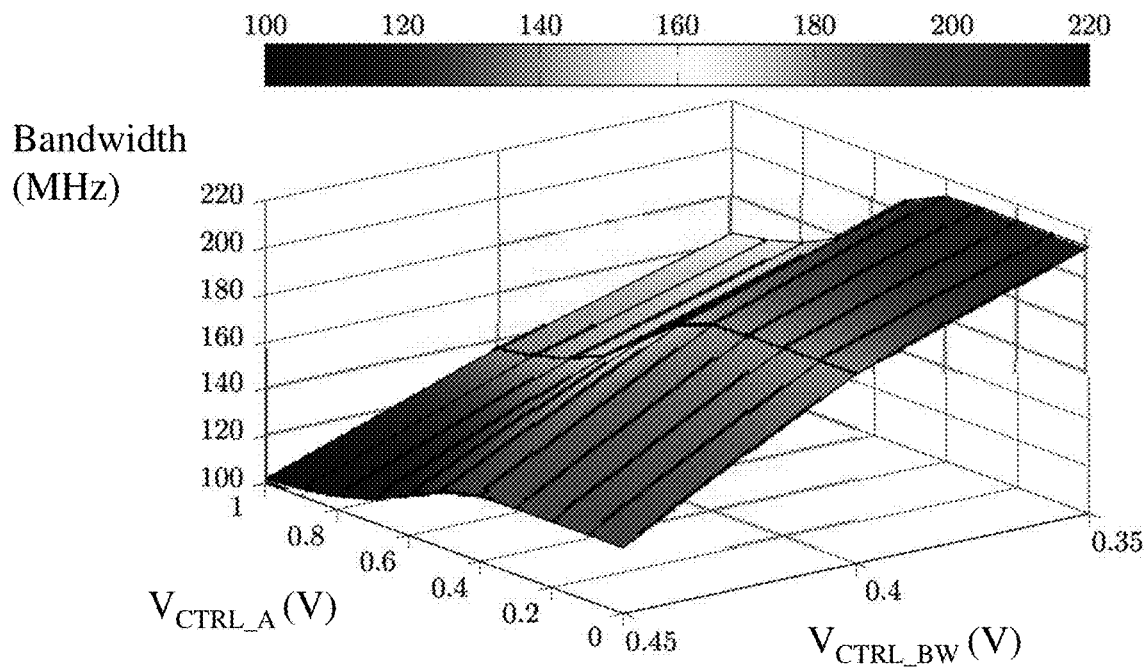

FIGS. 45A and 45B depict the transimpedance gain and the 3-dB bandwidth of the TIA, versus two control signals, $V_{CTRL\_A}$ and $V_{CTRL\_BW}$. The measured gain reaches ~80 dBΩ with a bandwidth of ~102 MHz extending to 214 MHz when the gain is reduced to 55 dBΩ. The control voltages can be varied independently. Over the $V_{CTRL\_BW}$ range, the maximum gain variation for the same $V_{CTRL\_A}$ value is of ~0.2 dB as seen in FIG. 45A. The worst case insertion loss extracted from FIGS. 42A and 42B (i.e., $P_{IN}$=10 dBm in air) corresponds to a motional resistance equal to 1.7 kΩ which corresponds to ~65 dBΩ. For an input power of −5 dBm the extracted motional resistance is equal to 1.35 kΩ which corresponds to 62.7 dBΩ. To overcome the resonator losses, the maximal transimpedance gain of the sustaining amplifier is fixed to 78 dBΩ and 170 MHz bandwidth which is sufficient to meet the oscillation conditions (as discussed in section E4.C). The AGC loop can then reduce the gain once the oscillation has reached the appropriate amplitude. The magnitude of the input and output impedances of the TIA at the resonant frequency of the resonator are 81Ω and 100Ω, respectively.

Figure 46:
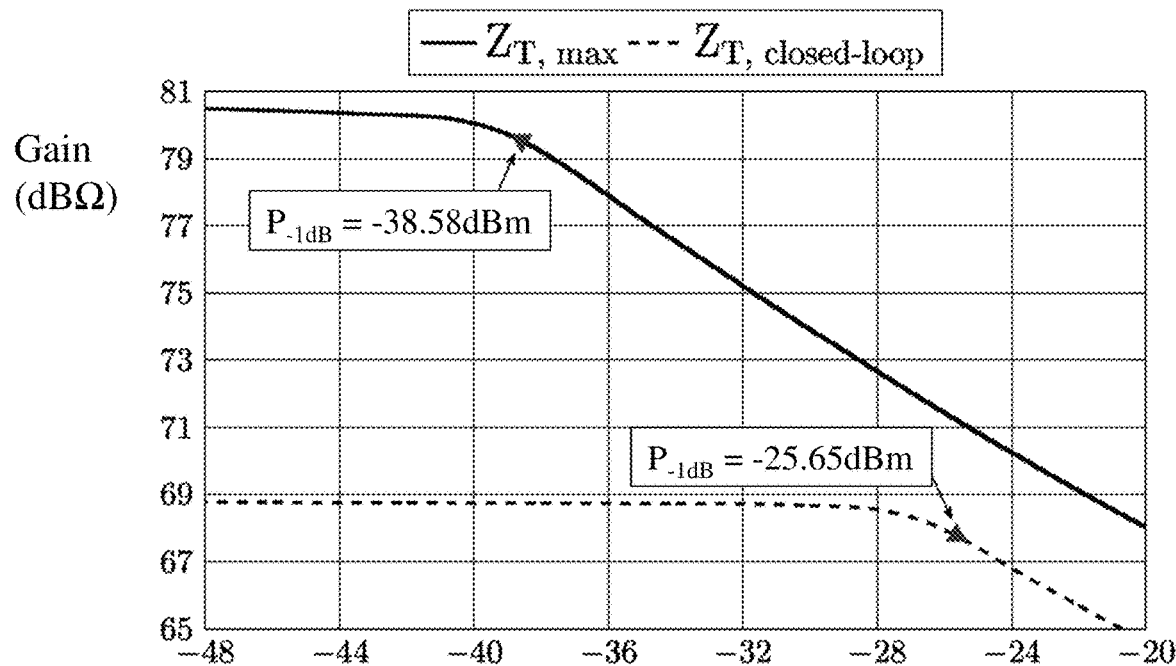
FIG. 46 depicts the measured 1-dB compression point of the TIA according to an embodiment of the invention at the maximum transimpedance gain setting and at the gain set by the AGC loop during steady-state oscillation in closed-loop configuration.
Figure 47:
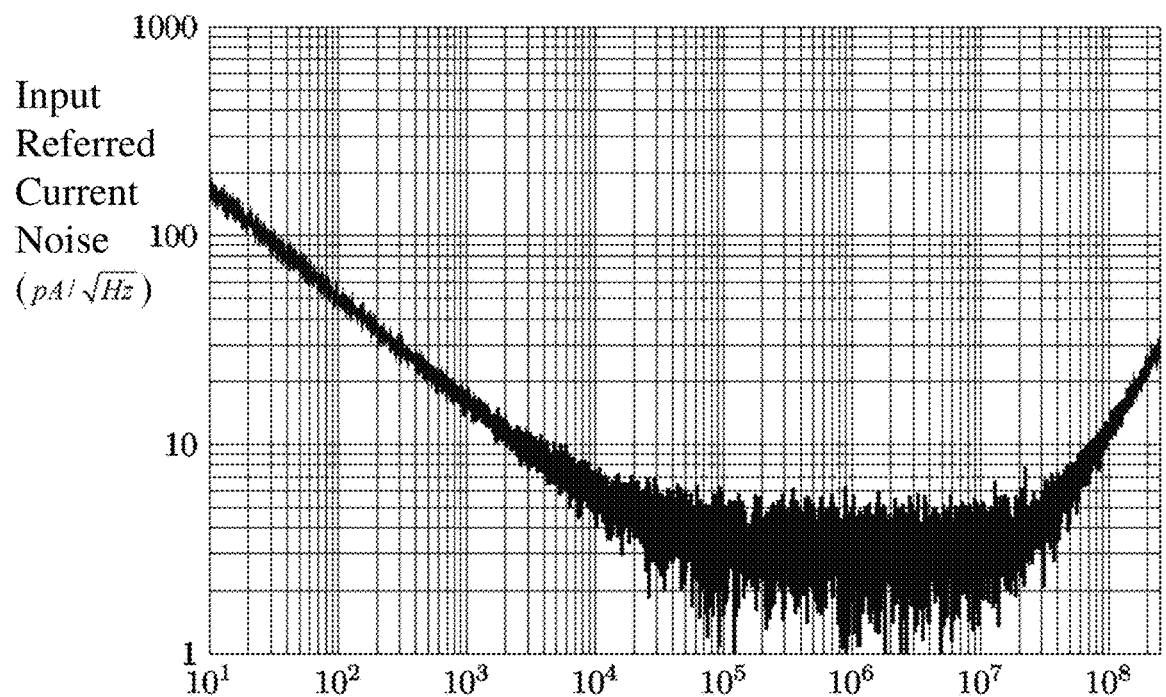
FIG. 47 depicts the measured input-referred current noise of the TIA according to an embodiment of the invention.

FIG. 46 (solid line) shows the measured transimpedance gain at its maximum setting for different input power levels varying from −48 dBm to −20 dBm. At the maximal gain setting, a value of available power of −38.6 dBm was recorded for the 1-dB compression point of the TIA. FIG. 47 shows the input-referred current noise of the TIA measured with the spectrum analyzer across a 214 MHz bandwidth. At low frequencies, the noise is dominated by the flicker noise. The flat thermal noise floor is seen in the ~20 kHz-40 MHz frequency range, where the input-referred noise is below 4 pA/√Hz, then increases at a rate of f$^2$ because of the gain reduction beyond the bandwidth. The performance parameters of the TIA configured at the 78 dBΩ gain-level are summarized in Table E2.

TABLE E2

Performance Parameters of the Proposed TIA

| Parameter | Measured Values | |
|---|---|---|
| | TIA Only | Closed Loop |
| Transimpedance (dBΩ) | 78 | 69 |
| Bandwidth [MHz] | 170 | 158 |
| Input Impedance, $R_{IN}$ @ $f_0$ (Ω) | 81 | 81 |
| Output Impedance, $R_{OUT}$ @ $f_0$ (Ω) | 100 | 100 |
| Power Supply (V) | 1 | 1 |
| Power Consumption, $P_{DISS}$ (mW) | 1.4 | 1.4 |
| 1-dB Compression Point, $P_{1\text{-}dB}$ (dBm) | 3.65 | 10.4 |
| Input Referred Noise @ $f_0$ (pA/√Hz) | −38.6 | −26.4 |
| Active Area (mm$^2$) | 0.033 | |
| Process | 65 nm CMOS | |

E4.C. Oscillator Characterization

1) Open-Loop Measurements:

To confirm that sufficient loop gain was present for the oscillation, the resonator was connected to the TIA in open-loop configuration under vacuum, and the frequency and phase responses were measured using the VNA. As illustrated in FIG. 41 (dashed lines), the input and output ports of the VNA were connected to the differential inputs of the resonator and the differential outputs of TIA, respectively, through an external balun used to convert between differential and single-ended signals. To sustain oscillation in closed-loop, the following conditions defined by Equations (E15A) and (E15B) where $\phi_{TIA}$ and $\phi_{MEMS}$ correspond to the phase shifts of the TIA and resonator, respectively, and $Z_T$, $R_{IN}$, and $R_{OUT}$ are the transimpedance gain, input, and output impedances of the TIA, respectively. In this case, both resonator and TIA must yield a 0° phase shift.

Figure 48:
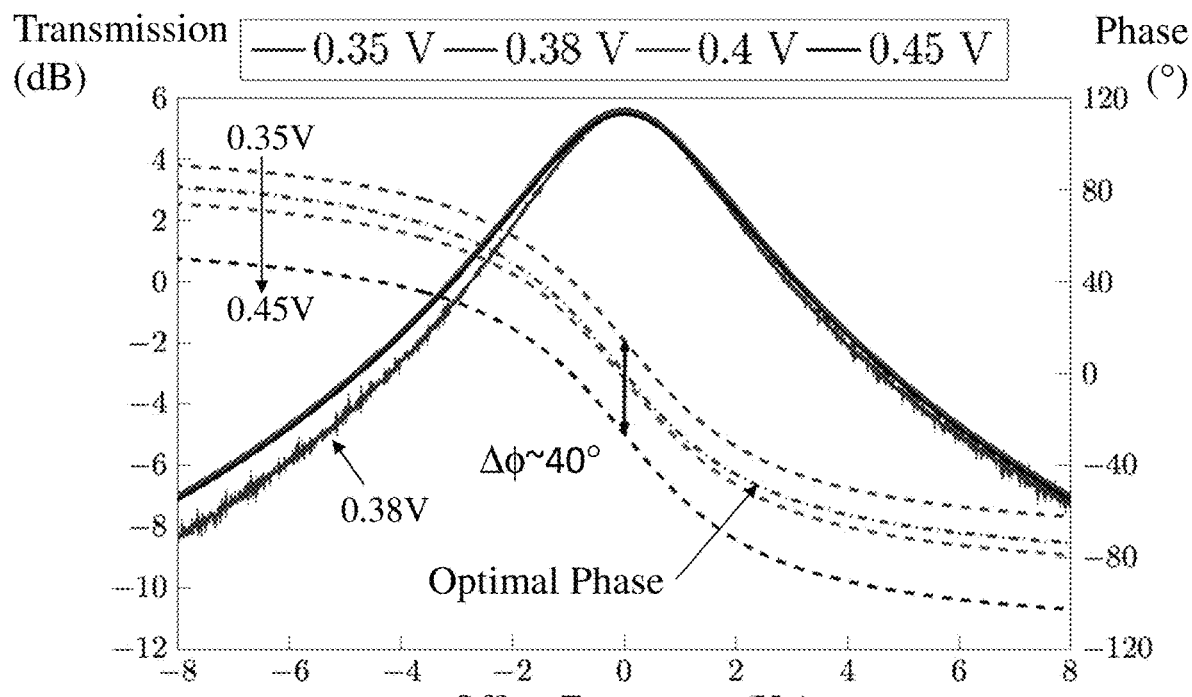
FIG. 48 depicts the measured open-loop gain and phase shift of the oscillator according to an embodiment of the invention under vacuum for different bandwidth control voltages.

It is observed from FIG. 48 that the open-loop gain at the resonant frequency of the resonator is higher than 0 dB, as required by condition Equation (E15A). Furthermore, the phase shift measured for different TIA bandwidth settings (see FIGS. 45A and 45B respectively) is also shown in FIG. 48. This reveals a phase variation $\Delta\phi$ of N40° for $V_{CTRL\_BW}$ values between 0.35 V and 0.45 V. A 0° phase shift at the peak of the gain curve was obtained for $V_{CTRL\_BW}$=0.38 V. This satisfies condition Equation (E15B) at the peak of the resonator's transmission curve.

Accordingly, the main advantage of the adjustable bandwidth feature is to set the oscillator total phase shift in open-loop configuration to 0° by setting the TIA's phase shift $\phi_{TIA}$ such that it complements the resonator's phase shift $\phi_{MEMS}$. This ensures that an oscillation can be sustained in closed-loop, and with a minimal TIA gain, as the 0° phase shift can be set to occur at a frequency near the maximum of the resonator's transmission curve. Note that the loaded Q-factor was measured from the open-loop gain bandwidth to be ~4000.

Figure 49:
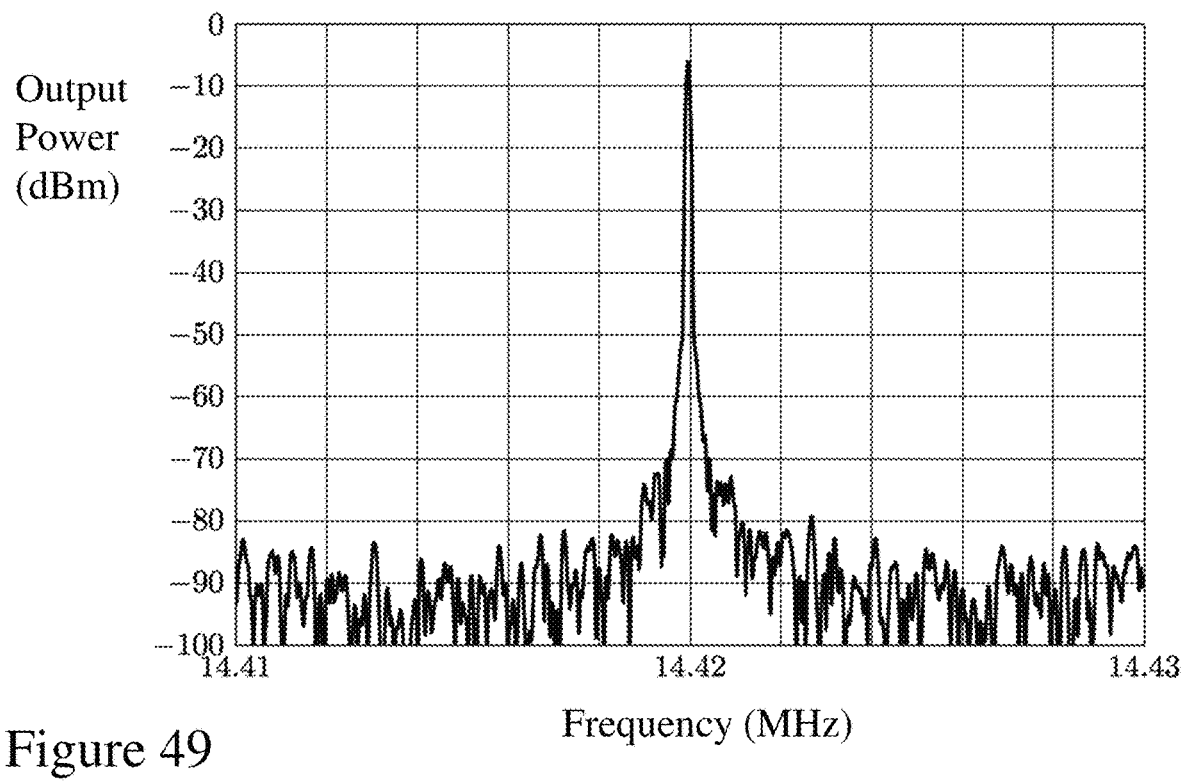
FIG. 49 depicts the measured MEMS oscillator output spectrum for the oscillator according to an embodiment of the invention.

2) Closed-Loop Measurements:

The resonator and TIA were connected in a closed-loop configuration (solid lines in FIG. 41), and tested in air and under vacuum to characterize the performance of the MEMS oscillator. While operating in steady-state under vacuum, the transimpedance gain at the oscillation frequency was set by the AGC loop control, and the resulting TIA gain was measured to be of ~69 dBΩ with a 3-dB bandwidth set to 158 MHz. This operating condition is summarised in Table E2. Note that at this gain level, the input-referred 1-dB compression point of the TIA corresponded to −25.65 dBm, as shown in FIG. 46. Using the spectrum analyzer, the output power of the oscillator, controlled by the AGC loop, was measured by probing the positive SSF output. An output power of −6 dBm at a frequency of 14.42 MHz was measured, as shown in FIG. 49. This output power represents an input on the TIA of −32 dBm. Therefore, the TIA remains in its linear region while sustaining the maximum drive power of the resonator (i.e., ~−6 dBm, as seen in FIG. 46), thus ensuring that performance is not degraded by TIA non-linearities.

The expression for the oscillator phase noise at a $f_m$ offset frequency from the carrier frequency is given by Equation (E16) where $\Im(f_m)$ represents the noise figure of the amplifier, $P_0$ is defined as the oscillation power, $f_0$ represents the carrier frequency, $f_C$ is a constant related to 1/f noise corner of the oscillator and $Q_L$ denotes the loaded Q-factor and is defined as given by Equation (E17) where $Q_{UL}$ is the intrinsic Q-factor of the resonator.

$$\Im(f_m) = \frac{2FkT}{P_0} \times \left[1 + \left(\frac{f_0}{2Q_L f_m}\right)^2 \times \left(1 + \frac{f_C}{f_m}\right)\right] \quad (E16)$$

$$Q_L = Q_{UL} \times \frac{R_m}{R_m + R_{in} + R_{out}} \quad (E17)$$

Figure 50:
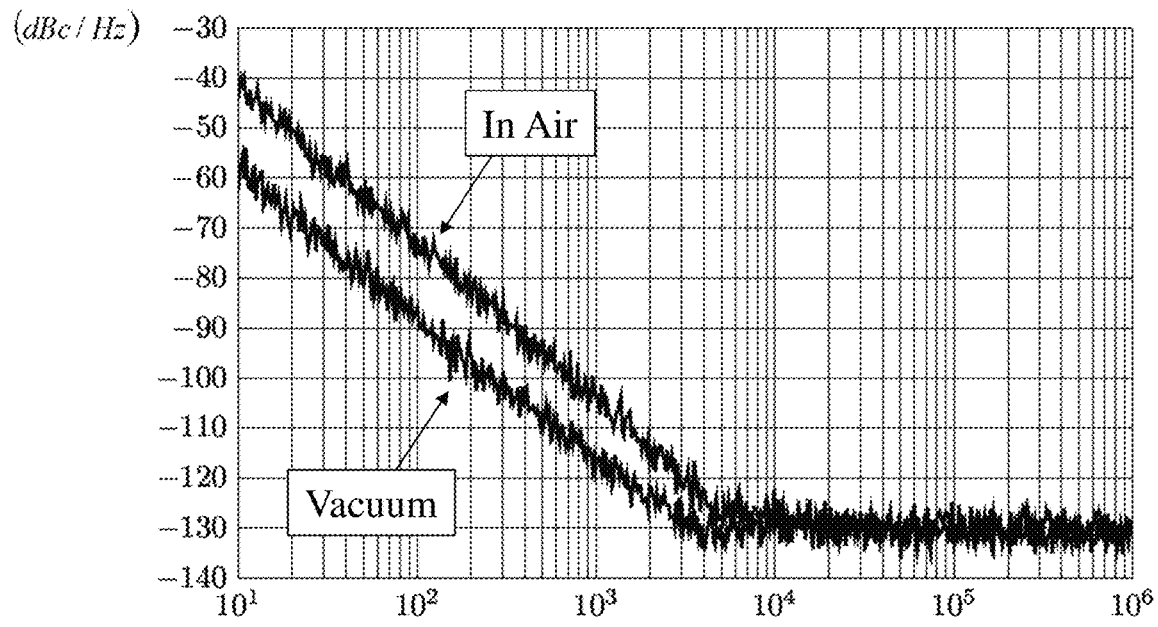
FIG. 50 depicts the measured phase noise of the MEMS oscillator according to an embodiment of the invention in air and under vacuum.

The phase noise measurements of the oscillator in air and under vacuum are plotted in FIG. 50. The close-to-carrier phase noise was measured in atmospheric pressure and under vacuum to be −40 dBc/Hz and −60 dBc/Hz, respectively at a 10 Hz offset, and −104 dBc/Hz and −116 dBc/Hz, respectively at a 1 kHz offset. The phase noise floor reaches −130 dBc/Hz and is dominated by the TIA noise. The phase noise in the close-to-carrier region is improved by ~20 dB under vacuum. This improvement is due to the considerable improvement in the loaded Q-factor, as expected from Equation (E16), which is caused by the higher resonator Q-factor and the lower motional impedance $R_m$ when operating under vacuum. On the other hand, the close-to-carrier phase noise follows the slope of $1/f^3$ which corresponds to the up-conversion of the flicker noise of the TIA. A $1/f^2$ region could not be observed as the flicker noise corner frequency is ~20 kHz (i.e., above the resonator's bandwidth). The fact that the close-to-carrier phase noise slope does not increase beyond $1/f^3$ indicates that the resonator and TIA non-linearities are not excited. Otherwise, noise-folding could occur resulting in a slope larger than $1/f^3$, deteriorating close-in phase noise performance.

Figure 51:
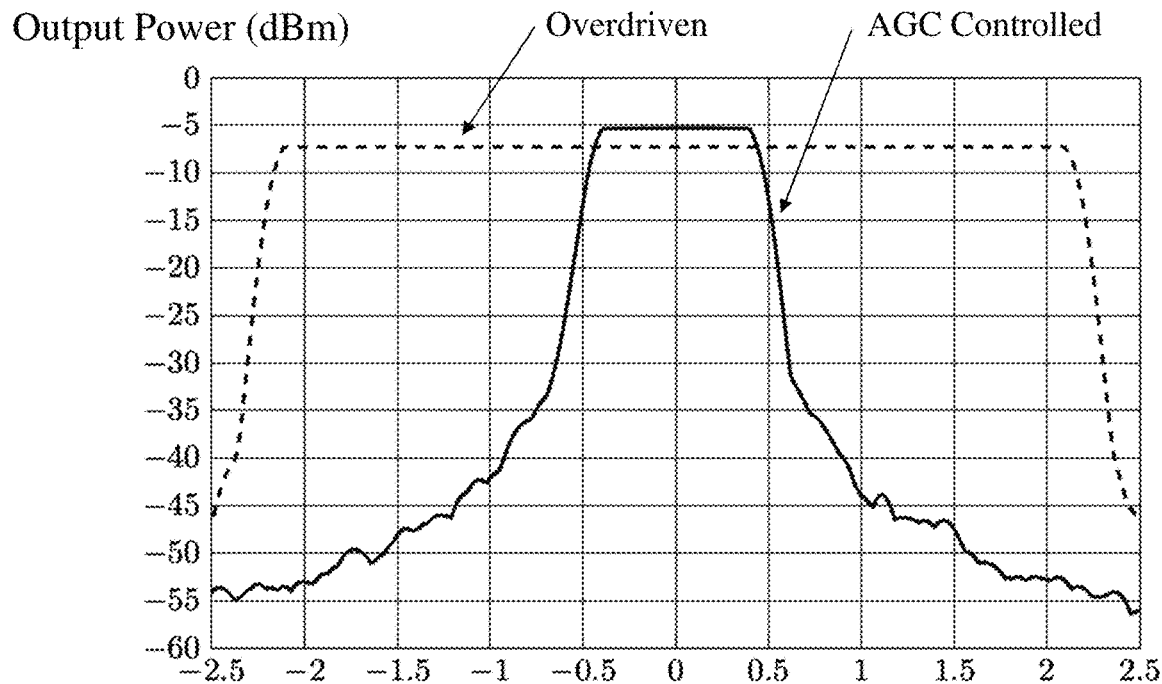
FIG. 51 depicts the measured oscillator short time stability average for an oscillator according to an embodiment of the invention over a collected over a five-minute time span with the AGC loop activated and disabled resulting in an overdriven resonator.

Short-term stability is one of oscillator key performance metrics and is a measure of its frequency stability. The frequency stability of the resonator is illustrated in FIG. 51. The oscillator shows a broadening of the output frequency over a five-minute time span. The frequency stability is improved from ±2.1 ppm to ±0.38 ppm, when the AGC is used, outlining the importance of not overdriving the resonator.

In order to obtain a representative comparison, figure-of-merit $FOM_2$ is used to compare the performance of the different oscillators in terms of phase noise and power consumption. It is given by Equation (E18) where $P_{DISS}$ is the DC power consumption of the oscillator circuit in mW. The calculated $FOM_2$ values and summarized specifications for other published MEMS oscillators based on piezoelectric resonators are listed in Table E3.

$$FOM_1 = \Im(f_m) - 20\log\left(\frac{f_0}{f_m}\right) + 10\log\left(\frac{P_{DISS}}{1 \text{ mW}}\right) \quad (E18)$$

As can be seen, the MEMS oscillator demonstrated in this work has the best figure-of-merit [$FOM_2$] when compared in air and under vacuum to other oscillators based on piezoelectric MEMS resonators. Notably, the close-to-carrier phase noise is lower under vacuum than the other works while dissipating relatively low-power consumption, thus offering a competitive phase noise at a 10 Hz offset. While the phase noise floor is higher than some prior art, the circuit operates at lower power. The phase noise floor could be improved by further reducing the noise of the TIA at the cost of increased power consumption. Moreover, the resonator could be driven at a higher power level at the cost of degraded close-to-carrier phase noise performance due to noise-folding. Finally, it is important to note that the resonator could be integrated in a system-in-package (SiP) in order to relax the design constraints of the TIA with respect to gain-bandwidth, potentially yielding and enhanced FOM.

According, to an embodiment of the invention a prototype 14-MHz MEMS oscillator based on a piezoelectric disk resonator and on a low-power high gain-bandwidth product fully differential transimpedance amplifier with adjustable bandwidth has been demonstrated. The TIA was fabricated in a TSMC 65 nm CMOS process and consumes 1.4 mW. An input stage topology that is based on the RGC and CSFB topologies and characterized by a high gain, wide bandwidth and low input impedance was proposed. The TIA can reach a maximum gain of ~80 dBΩ and offers an adjustable bandwidth with a maximum bandwidth of around 214 MHz. The input-referred current noise floor of the TIA was measured to be below 4 pA/√Hz and achieves a phase noise floor of −130 dBc/Hz whilst offering superior figure-of-merit relative to the state-of-the-art in terms of power consumption and close-to-carrier phase noise.

TABLE E3

Performance Comparison of the Proposed Oscillator with the State of the Art

| | 1 | 2 | 3 | 4 | 5 | | Invention | |
|---|---|---|---|---|---|---|---|---|
| CMOS [μm] | 0.35 | 0.5 | 0.18 | 0.18 | 0.5 | | 0.065 | |
| Center frequency, $f_0$ | 2.17 | 222 | 78.6 | 427 | 35 | 175 | 14.42 | |
| Pressure | air | air | air | air | vacuum | | air | vacuum |
| Quality factor, Q | 450 | 2100 | 11601 | 1400 | 1800 | 3600 | 1952 | 4894 |
| Motional Resistance, $R_m$ [kΩ] | 80 | 0.035 | 0.058 | 0.18 | 1.36 | 0.26 | 1.2 | 0.9 |
| AGC Circuit | Yes | No | No | No | No | | Yes | |
| Power supply, $V_{DD}$ [V] | 3.3 | 5 | 1.8 | 1.8 | 3 | | 1 | |
| Power consumption, $P_{DISS}$ [mW] | 1.28 | 10 | 4.8 | 13 | 3.8 | 13.5 | 1.4 | |
| PN @ 10 kHz [dBc/Hz] | −25 | −22 | −40 | −10 | −57 | −48 | −40 | −60 |
| PN @ 1 kHz [dBc/Hz] | −85 | −88 | −70 | −82 | −112 | −103 | −104 | −116 |
| PN Floor [dBc/Hz] | −105 | −160 | −122 | −147 | −142 | −142 | −130 | −130 |
| $FOM_1$ @ 1 kHz [dB] | −121 | −159 | −171 | −151 | −182 | −182 | −162 | −182 |
| $FOM_2$ [$Hz^2 Ω^2$] | −151 | −185 | −161 | −183 | −197 | −197 | −186 | −198 |

F: Multi-Resonator Oscillator

Within many microwave and RF applications and timing applications a circuit may be required to either operate upon multiple discrete frequencies outside the tuning range of single oscillator or support operation over a bandwidth wider than that of a single oscillator. Accordingly, it would be beneficial to provide a multi-resonator oscillator wherein multiple resonator/oscillators are employed with a combining circuit allowing one or more of the resonators/oscillators to provide an output signal providing either multiple discrete frequencies concurrently or a single frequency over a bandwidth wider than each individual resonator/oscillator.

Figure 52:
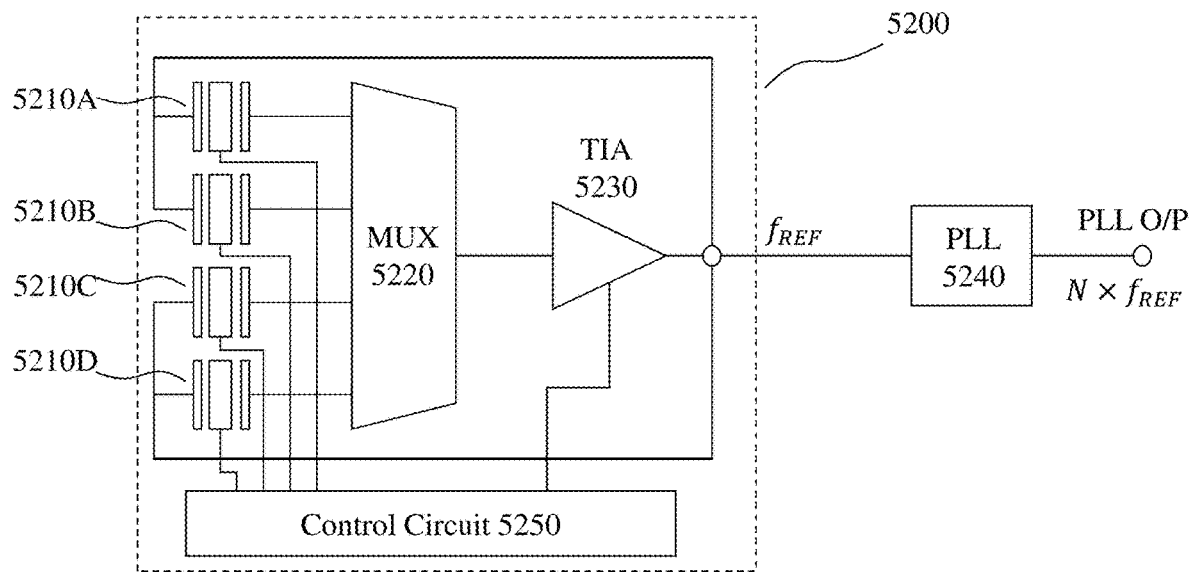
FIG. 52 depicts a multi-resonator oscillator according to an embodiment of the invention exploiting an array of oscillators according to embodiments of the invention.

Accordingly, referring to FIG. 52 there is depicted an exemplary multi-resonator oscillator (MRO) 5200 according to an embodiment comprising a resonator bank formed from first to fourth oscillators 5210A to 5210D respectively coupled to a multiplexer (MUX) 5220. The output of the MUX 5220 is then amplified using transimpedance amplifier (TIA) 5230. Accordingly, the MRO 5200 provides an output signal at frequency, $f_{REF}$, which is then coupled to a phase locked loop (PLL) 5240 which generates a multiplied output at a frequency, $N \cdot (f_{REF})$, where N is the multiplication factor of the PLL 5240. Each of the first to fourth oscillators 5210A to 5210D respectively and the TIA 5230 are coupled to a Control Circuit 5250 which provides power and/or control signals to these elements. Within embodiments of the invention the first to fourth oscillators 5210A to 5210D respectively may exploit MEMS resonators according to embodiments of the invention as described above although other MEMS resonator designs may also be employed without departing from the scope of the invention. It would be evident that the number of resonators/oscillators would be N≥2, where N is an integer.

Within an embodiment of the invention the MUX 5220 may comprise a M:1 switch array to actively select a single resonator or alternatively it may be a M:1 combiner with M on/off switches disposed on each input to the MUX 5220 allowing multiple resonators to be coupled concurrently to the output. Optionally, the TIA 5230 may be replaced with a TIA after each resonator. Optionally, subsets of the resonators may be combined with multiplexers wherein the outputs of these multiplexers are then combined with a further multiplexer. Optionally, TIAs may be distributed within such circuits or a single TIA employed. Accordingly, the MRO 5200 can dynamically select which resonator(s) in the bank is/are used in real-time using the Control Circuit 5250. Whilst not depicted it would be evident that the Control Circuit 5250 would receive control signals from an external controller controlling the overall system within which the MRO 5200 forms part.

Accordingly, an MRO 5200 may:
provide a wide tuning range by selecting a MEMS resonator from a resonator bank that includes a wide range of frequency resonators;
provide multiple oscillation frequencies concurrently by matching loop gains of different resonators and selecting them concurrently with the multiplexer; and
provide system resiliency by having a resonator bank with a set of identical resonators that can be switched into the oscillator loop in the case of a resonator failure or of unacceptable frequency drift or other failure mode is detected.

Optionally, the TIA 5230 or others within the MRO 5200 may adjust their bandwidth dynamically as well in order to optimally match the resonant frequency of the selected resonator(s) in order to achieve the best oscillation and power consumption performance metrics.

Accordingly, an MRO according to an embodiment of the invention may be used in PLLs in order to provide a reference frequency for the PLL that is highly tunable or even completely different. This allows for a PLL to be designed with agile reference frequencies, with minimal cost and size impact as a MEMS resonator bank would require only a small die footprint. This can be used for instance to have a PLL lock to a high reference frequency to provide wide loop bandwidth in conditions where this is required, or lock to a very low reference frequency to provide very narrow loop bandwidth but high output frequency granularity. Essentially, the variable frequency MEMS oscillator achieved using the resonator bank allows for another design degree of freedom for PLLs and can lead to novel system architectures in RF transceivers or timing circuits.

Within embodiments of the invention where electrostatic resonators are employed within the resonator bank then the control bias voltage of those resonators can be used to select them as the bias voltage of electrostatic resonators can be used to modulate their losses and accordingly disable them if required. Accordingly, this could remove the requirement for a multiplexer design, especially if the resonator is designed to mitigate feed-through capacitance, which would otherwise cause spurious oscillation paths in the MEMS oscillator. Alternatively, a multiplexer may be used if piezoelectric resonators are used, the feed-through capacitance of electrostatic resonators is an issue or if independent selection is required.

G: Hybrid Transducer Resonators

With the descriptions of embodiments of the invention above resonators have been described with piezoelectric actuation and electrostatic actuation. However, within other embodiments of the invention the piezoelectric and electrostatic actuation (transducers) may be combined in order to achieve a further reduction in the insertion loss of the MEMS resonator.

This may be achieved as the forces generated by both piezoelectric transduction for actuation and electrostatic transduction for actuation can be combined within a resonator to excite the same mode of oscillation, for example Lamé mode or wine glass.

Alternatively, the piezoelectric actuation and electrostatic actuation can be implemented using two coupled inputs to a single resonator such that there are two oscillator loops with a single resonator. These resonator loops therefore being coupled to one another.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A microelectromechanical systems (MEMS) device comprising:
a MEMS resonator; wherein
the MEMS resonator comprises:
a central resonator element suspended by a plurality of anchor beams disposed at predetermined points on the periphery of the central resonator element in dependence upon the resonance mode the central resonator element is designed to resonate in;
a plurality of electrostatic actuators disposed at first predetermined locations around the periphery of the central resonator element, each electrostatic actuator comprising a first movable portion disposed towards the central resonator element, a first fixed portion disposed distal to the central resonator element, and a first central portion disposed between the movable portion and the fixed portion;
a plurality of sensor structures disposed around the periphery disposed at second predetermined locations around the periphery of the central resonator element, each sensor structure comprising a second movable portion disposed towards the central resonator element, a second fixed portion disposed distal to the central resonator element, and a second central portion disposed between the movable portion and the fixed portion;
a first separation between the central resonator element and each first movable portion of each sensor structure of the plurality of sensor structures is electrically adjustable by application of an appropriate DC bias voltage between the central resonator element and each sensor structure of the plurality of sensor structures; and
a second separation between the central resonator element and each first movable portion of each electrostatic actuator of the plurality of electrostatic actuators is electrically adjustable by application of an appropriate DC bias voltage between the central resonator element and each electrostatic actuator of the plurality of electrostatic actuators.

2. The MEMS device according to claim 1, further comprising
a plurality of first stoppers, each first stopper disposed relative to the central resonator element and an electrostatic actuator of the plurality of electrostatic actuators to limit motion of the moveable portion of the electrostatic actuator of the plurality of electrostatic actuators towards the central resonator element.

3. The MEMS device according to claim 1, further comprising
a plurality of first stoppers, each first stopper disposed relative to the central resonator element and an sensor structure of the plurality of sensor structures to limit motion of the moveable portion of the sensor structure of the plurality of sensor structures towards the central resonator element.

4. The MEMS device according to claim 1, further comprising
a plurality of first stoppers, each first stopper disposed relative to the central resonator element and an electrostatic actuator of the plurality of electrostatic actuators to limit motion of the moveable portion of the electrostatic actuator of the plurality of electrostatic actuators towards the central resonator element; and a plurality of second stoppers, each second stopper disposed relative to the central resonator element and an sensor structure of the plurality of sensor structures to limit motion of the moveable portion of the sensor structure of the plurality of sensor structures towards the central resonator element.

5. The MEMS device according to claim 1, wherein each movable portion of each electrostatic actuator of the plurality of electrostatic actuators is movable from a first position with a first gap between the movable portion and the central resonator element to a second position with a second gap between the movable portion and the central resonator element under application of a DC bias to the central resonator element; and the second gap is smaller than the first gap.

6. The MEMS device according to claim 1, wherein each movable portion of each electrostatic actuator of the plurality of electrostatic actuators is movable from a first position with a first gap between the movable portion and the central resonator element to a second position with a second gap between the movable portion and the central resonator element under application of a DC bias to the central resonator element;

the second gap is smaller than the first gap; and the second gap is smaller than the minimum feature size of the MEMS device defined by the manufacturing process for the MEMS device.

7. The MEMS device according to claim 1, wherein a size of a gap between the moveable portion and the central resonator element is adjustable under application of a DC bias to the central resonator element; and a resonant frequency of the MEMS device varies according to the size of the gap between the moveable portion and the central resonator element.

8. The MEMS device according to claim 1, wherein at least one of the stoppers and the movable portions of the plurality of electrostatic actuators comprise dimples formed upon them such that contact between the stoppers and the movable portions of the plurality of electrostatic actuators is only through these dimples.

9. A microelectromechanical systems (MEMS) device comprising:

a MEMS resonator comprising:

a central resonator element suspended by a plurality of anchor beams disposed at predetermined points on the periphery of the central resonator element in dependence upon the resonance mode the central resonator element is designed to resonate in;

a plurality of electrostatic actuators disposed around the periphery of the central resonator element, each electrostatic actuator comprising a movable portion disposed towards the central resonator element, a fixed portion disposed distal to the central resonator element, and a spring disposed between the movable portion and the fixed portion; and a plurality of stoppers, each stopper disposed relative to the central resonator element and an electrostatic actuator of the plurality of electrostatic actuators to limit motion of the moveable portion of the electrostatic actuator of the plurality of electrostatic actuators towards the central resonator element; wherein the movable portions of the plurality of electrostatic actuators form gaps relative to the central resonator element defined by the minimum gap feature of manufacturing process employed to form the MEMS resonator which is larger than the gaps when the moveable portions of the plurality of electrostatic actuators are driven under electrostatic actuation into contact with the stoppers, which is limited only be manufacturing process employed.

10. The MEMS device according to claim 9, wherein at least one of the stoppers and the movable portions of the plurality of electrostatic actuators comprise dimples formed upon them such that contact between the stoppers and the movable portions of the plurality of electrostatic actuators is only through these dimples.

11. A microelectromechanical systems (MEMS) device comprising:

a MEMS resonator comprising a pair of sensing electrodes and a pair of driving electrodes; and the MEMS device further comprises:

a fully differential transimpedance amplifier (TIA) providing a feedback loop between the sensing electrodes and the driving electrodes, the TIA comprising an input stage having differential inputs and differential outputs, wherein the differential inputs are coupled to the sensing electrodes of the MEMS resonator and the input stage employs a regulated cascade topology;

a variable gain amplifier (VGA) having differential inputs and differential outputs, wherein the differential inputs of the VGA are coupled to the differential outputs of the input stage and the gain of the VGA is controlled by an automatic gain control (AGC) circuit; and an output stage having differential inputs and differential outputs, wherein the differential inputs of the output stage are coupled to the differential outputs of the VGA, the differential outputs of the output stage are coupled to the driving electrodes of the MEMS resonator and the output stage employs a super source follower.

12. The MEMS device according to claim 11, wherein at least one of:

at least of the MEMS resonator is a Lame mode resonator and the AGC comprises a peak detector coupled to the output stage and a comparator; and the differential inputs of the input stage and the differential outputs of the output stage each present low impedance to compensate for the large parasitic capacitance of the MEMS resonator and push the dominant pole of the MEMS oscillator beyond the oscillation frequency of the MEMS oscillator.

13. A microelectromechanical systems (MEMS) device comprising:

a MEMS resonator comprising:

a piezoelectric MEMS resonator having a pair of sensing electrodes disposed on a first side of the piezoelectric MEMS resonator and a pair of driving electrodes disposed on a second side of the piezoelectric MEMS resonator; and a fully differential transimpedance amplifier (TIA) providing a feedback loop between the sensing electrodes and the driving electrodes, the TIA comprising an input stage having differential inputs and differential outputs, wherein the differential inputs are coupled to the sensing electrodes of the MEMS resonator and the input stage employs a regulated cascade topology;

a variable gain amplifier (VGA) having differential inputs and differential outputs, wherein the differential inputs of the VGA are coupled to the differential outputs of the input stage and the gain of the VGA is controlled by an automatic gain control (AGC) circuit; and an output stage having differential inputs and differential outputs, wherein the differential inputs of the output stage are coupled to the differential outputs of the VGA, the differential outputs of the output stage are coupled to the driving electrodes of the MEMS resonator and the output stage employs a super source follower; wherein the piezoelectric MEMS resonator is coupled to the fully differential TIA on its inputs and outputs via capacitors; and the piezoelectric MEMS resonator is driven without any DC signal applied to it.

14. The MEMS device according to claim 13, wherein at least one of:

at least one of the MEMS resonator is a disk resonator and the AGC comprises a peak detector coupled to the output stage and a comparator; and the differential inputs of the input stage and the differential outputs of the output stage each present low impedance to compensate for the large parasitic capacitance of the MEMS resonator and push the dominant pole of the MEMS oscillator beyond the oscillation frequency of the MEMS oscillator.

15. A microelectromechanical systems (MEMS) device comprising:

a MEMS resonator; and either:

a plurality of other MEMS resonators each operating over a predetermined first frequency range of a plurality of first frequency ranges; and a multiplexer coupled to the MEMS resonator and the plurality of other MEMS resonators; wherein the MEMS resonator operates over a predetermined second frequency range; and the MEMS device provides at least one of:

an oscillator providing multiple output frequencies, each output frequency being within at least one of the plurality of first frequency ranges and the second frequency range; and a single output frequency over a bandwidth established by the plurality of first frequency ranges and the second frequency range;

or:

the MEMS resonator is one of a plurality of MEMS resonators each having a different resonant frequency;

the plurality of MEMS resonators are coupled to a plurality of inputs of an electrical multiplexer;

a control circuit provides at least one of power and control signals to the plurality of MEMS resonators;

an output of the electrical multiplexer is coupled to a transimpedance amplifier; and the MEMS device provides a programmable output at one frequency of the plurality of different resonant frequencies of the plurality of MEMS resonators under an action of the control circuit.

* * * * *